(12) United States Patent
Takashima et al.

(10) Patent No.: US 7,723,740 B2
(45) Date of Patent: May 25, 2010

(54) LIGHT EMITTING DEVICE

(75) Inventors: Suguru Takashima, Anan (JP); Masatoshi Kameshima, Anan (JP); Hiroto Tamaki, Anan (JP); Junji Takeichi, Anan (JP); Yoshinori Murazaki, Anan (JP); Shinpei Kinoshita, Anan (JP)

(73) Assignee: Nichia Corporation, Anan-shi (JP)

( * ) Notice: Subject to any disclaimer, the term of this patent is extended or adjusted under 35 U.S.C. 154(b) by 25 days.

(21) Appl. No.: 10/942,135

(22) Filed: Sep. 16, 2004

(65) Prior Publication Data

US 2005/0156496 A1 Jul. 21, 2005

(30) Foreign Application Priority Data

Sep. 18, 2003 (JP) .............................. 2003-326535
Sep. 19, 2003 (JP) .............................. 2003-328367
Apr. 28, 2004 (JP) .............................. 2004-133626

(51) Int. Cl.
*H01L 33/00* (2010.01)

(52) U.S. Cl. ........................... 257/98; 257/100; 257/99; 257/79; 257/89; 257/95; 257/E33.061; 257/E33.059

(58) Field of Classification Search ............ 257/98–100, 257/502, 503, 79, 89, E33.061, E33.059, 257/95

See application file for complete search history.

(56) References Cited

U.S. PATENT DOCUMENTS

| 6,351,069 | B1 * | 2/2002 | Lowery et al. .............. 313/512 |
| 6,417,019 | B1 | 7/2002 | Mueller et al. |
| 6,641,448 | B2 | 11/2003 | Wang et al. |
| 6,649,946 | B2 | 11/2003 | Bogner et al. ................ 257/233 |
| 6,680,569 | B2 | 1/2004 | Mueller-Mach et al. ..... 313/502 |
| 6,717,355 | B2 * | 4/2004 | Takahashi et al. ........... 313/503 |
| 6,747,293 | B2 * | 6/2004 | Nitta et al. .................... 257/99 |
| 6,943,380 | B2 | 9/2005 | Ota et al. ..................... 257/100 |
| 6,956,555 | B2 | 10/2005 | Kyomoto |
| 7,026,755 | B2 * | 4/2006 | Setlur et al. ................. 313/501 |
| 7,091,656 | B2 | 8/2006 | Murazaki et al. |
| 7,247,257 | B2 | 7/2007 | Murazaki et al. |
| 2002/0018053 | A1 | 2/2002 | Kyomoto |
| 2002/0043926 | A1 | 4/2002 | Takahashi et al. |
| 2002/0105269 | A1 | 8/2002 | Ellens et al. |
| 2002/0190262 | A1 | 12/2002 | Nitta et al. |
| 2004/0245532 | A1 | 12/2004 | Maeda et al. |

(Continued)

FOREIGN PATENT DOCUMENTS

EP    1 339 109    8/2003

(Continued)

OTHER PUBLICATIONS

Taiwan Intellectual Property Office Action issued Jun. 24, 2008.

*Primary Examiner*—Lynne A Gurley
*Assistant Examiner*—Junghwa M Im
(74) *Attorney, Agent, or Firm*—Wenderoth, Lind & Ponack, L.L.P.

(57) ABSTRACT

A light emitting device that light of various colors by blending lights emitted by two or more kinds of fluorescent materials which are substantially directly excited by light emitted by an excitation source having principal emission peak in a range from 250 nm to 500 nm. Each of the fluorescent materials is of a direct-transition type.

13 Claims, 27 Drawing Sheets

U.S. PATENT DOCUMENTS

2005/0072981 A1 * 4/2005 Suenaga .................. 257/88

FOREIGN PATENT DOCUMENTS

| | | |
|---|---|---|
| EP | 1 347 517 | 9/2003 |
| JP | 2000-244021 | 9/2000 |
| JP | 2001-111114 | 4/2001 |
| JP | 2001-236034 | 8/2001 |
| JP | 2001214162 A * | 8/2001 |
| JP | 2001-332394 | 11/2001 |
| JP | 2002-359404 | 12/2002 |
| JP | 2003-34791 | 2/2003 |
| JP | 2003-147351 | 5/2003 |
| JP | 2003-515655 | 5/2003 |
| TW | 541722 | 7/2003 |
| WO | 01/40403 | 6/2001 |
| WO | 02/054503 | 7/2002 |
| WO | 02/086978 | 10/2002 |
| WO | 03/032407 | 4/2003 |

* cited by examiner

LIGHT EMITTING DEVICE

BACKGROUND OF THE INVENTION

1. Field of the Invention

The present invention relates to a light emitting device that uses a light emitting element and fluorescent material, and can be used for such applications as a signal light, illumination, display, indicator and other light sources, and particularly to a light emitting device that can emit light of white and other color tones by using fluorescent material that is excited by light emitted by a light emitting element, which emits in an ultraviolet to visible light region, and emits light in the visible light region.

2. Description of the Related Art

Various light emitting diodes (LED) and laser diodes (LD) have been developed as light emitting elements. These light emitting elements are replacing part of electric bulbs and cold cathode ray tubes that are used as light sources for display, back light and indicator, and the like by taking advantage of such features as a capability to run on low voltage, compact construction, light weight, small thickness, long life, high reliability and low power consumption. What deserves attention in this context are LEDs capable of emitting blue or green light with at least 10 candela luminous intensity that have been recently developed and commercialized by using an activation (light emission) layer of a quantum well structure made of a nitride semiconductor (for example, mixed crystal of InGaN). It has also been made possible to emit light of various colors including white light by combining light emitted by such LED chips and light emitted by fluorescent materials that are excited by light of the LED chips, thereby to produce fluorescence (principle of blending light colors).

An example of such devices is a light emitting device that uses a light emitting element which emits blue light and a YAG fluorescent material which is excited by the light emitted by the light emitting element and emits yellow light, so as to generate white light. This device emits white light by blending a transmitted part of the blue light from the light emitting element and yellow light emitted by the YAG fluorescent material that is excited by a part of the blue light from the light emitting element. This light emitting device has advantages of simple structure and ease of increasing output power.

There is also a device that emits white light by using a light emitting element, which emits an ultraviolet ray, and fluorescent materials capable of emitting light of RGB (red, green and blue) colors. There is also such a device that emits white light or other colors, wherein a fluorescent material which emits blue light when excited by a UV light emitting element and another fluorescent material which is excited by the blue light from the former fluorescent material emits yellow light (for example, refer to Patent Document 1). In this case, light color can be adjusted relatively easily since only the light emitted by the fluorescent materials is substantially used. When a light emitting element that emits an ultraviolet ray is used, in particular, mass productivity can be improved since color deviation due to wavelength of light emitted by this semiconductor light emitting element can be accommodated somewhat and chromaticity can be determined only by color of light emitted by the fluorescent materials, unlike a case of using a light emitting element that emits visible light.

[Patent Document 1]

Japanese Unexamined Patent Publication (Kokai) No. 2003-147351

However, there are demands for further improvement in a color rendering property for blended light emitted by a light emitting device that combines a blue light emitting element and YAG fluorescent material. There is a problem, in particular, that light emitted by such a device has an insufficient red component and a low value of a special color rendering index R9 that represents the red component. There is also such a problem that, since the device can emit light of only such colors that lie on a line connecting blue and a color of light emitted by YAG material on a chromaticity diagram, it is difficult to obtain light of a desired color by adjusting amounts of fluorescent materials; namely it is difficult to obtain a multi-color light emitting device.

A light emitting device that employs a light emitting element which emits an ultraviolet ray such as that described in Patent Document 1 has low intensity of emitted light at wavelengths around 500 nm, resulting in a low color rendering property.

It has also been attempted to improve a color rendering property by using at least two kinds of fluorescent material, such as combining a light emitting element which emits an ultraviolet ray and fluorescent materials capable of emitting light of RGB (red, green and blue) colors. But these attempts have been facing such a problem that difference in excitation characteristics among the fluorescent materials results in color deviation and/or variation in a color rendering property. For example, changing drive current density in the light emitting element causes a plurality of fluorescent materials to change light emitting characteristics differently, thus resulting in variations in color of emitted light.

SUMMARY OF THE INVENTION

With the background described above, an object of the present invention is to solve at least one of the problems described above and to provide a light emitting device having excellent light emitting characteristics.

The light emitting device of the present invention contains a light emitting element, that emits light with principal emission wavelength in a region ranging from near ultraviolet to blue light (300-490 nm), and fluorescent material, wherein the fluorescent material comprises at least two kinds of fluorescent material each having a luminescence center of a direct transition type. The light emitting device of the present invention having such a constitution can easily emit light of a desired color with a high color rendering property due to use of at least two kinds of fluorescent material and has, since each of the at least two kinds of fluorescent material has a luminescence center of the direct transition type, a short response time of excitation, so that there is no difference in color of emitted light between DC drive and pulse drive. Also, because a fluorescent material of a direct transition type has high linearity of light emission intensity with respect to intensity of excitation light, proportions of light emission intensity among a plurality of fluorescent materials can be maintained constant so as to prevent color deviation and deterioration of a color rendering property from occurring even when a drive current density of the light emitting element is changed.

Thus, according to the present invention, such a light emitting device can be provided that does not experience color deviation even when intensity of light emitted by a light emitting element is changed or a light emission spectrum is altered slightly by a change in current density supplied to the light emitting element that serves as an excitation light source or the emission spectrum is slightly changed, since fluorescent materials having a luminescence center of the direct transition type are used. That the device does not experience color deviation herein means that there occurs no significant change in color tone which can be visibly recognized.

Specifically, according to the present invention, variation in values of both chromaticity coordinates x and y (JIS 28110) can be restricted within 0.03 when current density in the light emitting element is changed from 2.0 A/cm$^2$ to 50.0 A/cm$^2$. Also according to the light emitting device of the present invention, variations in the values of chromaticity coordinates x and y can also be restricted in a range from 0.01 to 0.02, or even below 0.1 by selection of the florescent materials. Also, because the light emitting device of the present invention uses fluorescent materials of direct transition type that have a short response time from excitation to stable light emission and short 1/10 afterglow period (for example, at most 200 μsec), stable emission of light is ensured even when the light emitting device is driven with pulsed power, and there is no difference in color of emitted light between DC drive and pulse drive. In other words, the light emitting device of the present invention can emit light of the same color regardless of whether operated by DC drive or pulse drive, or even when a driving condition of the light emitting device is changed from low current to high current. Moreover, light of stable color can be emitted with less changes in light color and a color rendering property even when the current density in the light emitting device changes. Since the human eye has high sensitivity to recognize a slight change in color of light in a white region, such features as variations in light color and in the color rendering property are extremely small, that are characteristic of the present invention, are very advantageous when making a device that emits white light.

It goes without saying that a number of different kinds of fluorescent materials used in the light emitting device of the present invention is not limited to two or three, and may be four (BGYR: blue, green, yellow and red) or more than four.

In the light emitting device of the present invention, response time from excitation to stable light emission and 1/10 afterglow period of the fluorescent material is preferably at most 200 μsec. Response time is a period of time required for fluorescent material to release supplied energy as light emission after absorbing the energy, and undergoes transition from a ground state to an excited state. Specifically, the response time is a period from the time immediately after supply of energy to the fluorescent material has begun to a time when the fluorescent material emits light. Afterglow refers to light emission that ensues after excitation of luminescence has stopped. The 1/10 afterglow period is a period of time taken for the luminance to decrease to 1/10 after excitation of luminescence has stopped.

The fluorescent material preferably has a luminescence center of the direct transition type of 4f-4d. The fluorescent material preferably has a luminescence center that contains at least Eu, Ce or Yb.

The light emitting device of the present invention may have such a constitution that uses a light emitting element which emits light with a principal-emission-peak wavelength in a region ranging from near ultraviolet to visible light region of short wavelengths, and at least three kinds of fluorescent material each having a peak emission wavelength in the visible light region. Such a constitution enables color of light emission to be set by blending light emitted by at least three kinds of fluorescent material that are of the direct transition type and exhibit a fast excitation response characteristic. Thus, the light emitting device can emit light with a higher color rendering property while avoiding variation in color of emitted light regardless of whether the device is operated by DC drive or pulse drive, and preventing color deviation and deterioration of a color rendering property from occurring when drive current density in the light emitting device changes.

The light emitting element operating in such a wavelength region preferably has a nitride semiconductor that contains Al and Ga in a light emitting layer, which enables a light emitting element having high luminance. The region ranging from near ultraviolet to visible light region of short wavelengths herein means a wavelength region approximately from 300 nm to 420 nm where light is difficult to recognize by the eye.

According to the present invention, the fluorescent material preferably comprises at least two kinds selected from among the group consisting of alkaline earth metal halogen apatite fluorescent material activated with at least Eu, alkaline earth metal boric acid halide salt fluorescent material, alkaline earth metal aluminate fluorescent material, rare earth aluminate fluorescent material having a garnet structure and activated with at least Ce, alkaline earth silicon oxynitride fluorescent material, alkaline earth silicate fluorescent material and alkaline earth silicon nitride fluorescent material activated with at least Eu.

When at least three kinds of fluorescent material are used, white light of a high color rendering property can be emitted by using a first fluorescent material that emits light having at least one peak emission wavelength in a region from blue-purple to blue region, a second fluorescent material that emits light having at least one peak emission wavelength in a region from blue-green to yellow-green region, and a third fluorescent material that emits light having at least one peak emission wavelength in a region from yellow to red region. Wavelengths of the blue region (=pure blue region) are from 455 nm to 485 nm, wavelengths of the blue-green region are from 485 nm to 495 nm, wavelengths of the green region are from 495 nm to 548 nm, wavelengths of the yellow-green region are from 548 nm to 573 nm, wavelengths of the yellow region are from 573 nm to 584 nm, wavelengths of the yellow-red region are from 584 nm to 610 nm, and wavelengths of the red region are from 610 nm to 780 nm. Correspondence of these color notations and chromatic coordinates is based on JIS 28110.

According to the present invention, the first fluorescent material is preferably at least one selected from among the group consisting of alkaline earth metal halogen apatite fluorescent material activated with at least Eu, alkaline earth metal boric acid halide salt fluorescent material and alkaline earth metal aluminate fluorescent material.

The second fluorescent material is preferably at least one selected from among the group consisting of rare earth aluminate fluorescent material having a garnet structure and activated with at least Ce, alkaline earth metal aluminate fluorescent material activated with at least Eu, alkaline earth silicon oxynitride fluorescent material and alkaline earth silicate fluorescent material.

The third fluorescent material is preferably at least one selected from among a group of alkaline earth silicon nitride fluorescent material activated with at least Eu.

The light emitting device according to the present invention can emit light of desired color with a high color rendering property while preventing color deviation and deterioration of the color rendering property from occurring in case drive current density in the light emitting device changes, also when a light emitting element having a principal-emission-peak wavelength in blue region (420-490 nm) is used and a YAG fluorescent material is included in the fluorescent material. Here, the term YAG fluorescent material is used to collectively represent rare earth aluminate fluorescent materials that have a garnet structure and are activated with a rare earth element. It is preferable that the light emitting element operating in such a wavelength region has a nitride semiconductor that contains In and Ga in a light emission layer thereof.

The light emitting device according to the present invention uses at least two kinds of fluorescent material that are substantially directly excited by light emitted by an excitation source having a principal emission peak in a range from 250 nm to 420 nm, so as to generate light of various colors through blending of light emitted by the at least two kinds of fluorescent material. The at least two kinds of fluorescent material may include at least one kind of oxynitride-based fluorescent material or nitride-based fluorescent material having crystallinity. With this constitution, a light emitting device having fluorescent material of high light emission efficiency can be provided. Combining at least two kinds of fluorescent material enables a light emitting device to be provided having a broad range of color tones. Moreover, since an excitation light source that is difficult to recognize with the eye is used, a light emitting device that is free of color deviation with no recognizable color deviation of the excitation source can be provided.

The light emitting device according to the present invention may also have such a constitution which uses at least two kinds of fluorescent material that are substantially directly excited by light emitted by an excitation source having a principal emission peak in a range from 420 nm to 500 nm, so as to generate light of various colors through blending of light emitted by the at least two kinds of fluorescent material, wherein the at least two kinds of fluorescent material may include at least one kind of oxynitride-based fluorescent material having crystallinity. With this constitution, a light emitting device that has less health hazards relative to humans and high light emission efficiency can be provided. Also, combining at least two kinds of fluorescent material enables to be provided a light emitting device having a broad range of color tones.

The light emitting device according to the present invention may also use at least two kinds of direct-excitation fluorescent material (first fluorescent material) that are substantially directly excited by light emitted from an excitation source having a principal emission peak in a range from 250 nm to 420 nm, and indirect-excitation fluorescent material (a second fluorescent material) that is excited by a part of light emitted by the at least two kinds of the direct-excitation fluorescent material, so as to generate light of various colors through blending of the light emitted by the at least two kinds of the direct-excitation fluorescent material and light emitted by the indirect-excitation fluorescent material, wherein the at least two kinds of the direct-excitation fluorescent material may include at least one kind of oxynitride-based fluorescent material or nitride-based fluorescent material having crystallinity. With this constitution, a light emitting device having a direct-excitation fluorescent material of high light emission efficiency and indirect-excitation fluorescent material of high light emission efficiency can be provided. Combining at least two kinds of the direct-excitation fluorescent material and the indirect-excitation fluorescent material enables to be provided a light emitting device having an even broader range of color tones.

The at least two kinds of direct-excitation fluorescent material that are directly excited by the light emitted by the excitation source preferably have efficiency of converting energy received from the excitation source not lower than 60% of a maximum light emission efficiency over an entire wavelength region. This enables to be provided a light emitting device that uses fluorescent material having high excitation efficiency. In case indirect-excitation fluorescent material is used, intensity of light emitted by the indirect-excitation fluorescent material can be increased with high-efficiency light emission from direct-excitation fluorescent material.

The at least two kinds of fluorescent material that are directly excited by the light emitted by an excitation light source (direct-excitation fluorescent material) may be such that exhibits maximum light emission efficiency in a region from 250 nm to 550 nm when excited by light. This enables to be manufactured a light emitting device that is less harmful to the human body and has high light emission efficiency. By using at least two kinds of fluorescent material that exhibit maximum emission efficiency in a wavelength region of an excitation light source in use, it is made possible to provide a light emitting device having a broad range of color tones and high luminance of emitted light that makes maximum use of characteristics of the fluorescent material to a highest efficiency possible.

The oxynitride-based fluorescent material having crystallinity preferably contains at least one Group II element selected from among the group consisting of Be, Mg, Ca, Sr, Ba and Zn, at least one Group IV element selected from among the group consisting of C, Si, Ge, Sn, Ti, Zr and Hf, and a rare earth element used as an activator R. Use of this novel fluorescent material makes it possible to provide a light emitting device having a broad range of color tones and high luminance of emitted light. When the fluorescent material is excited by an excitation source that emits an ultraviolet ray, in particular, a light emitting device having high luminance of emitted light can be provided by using a fluorescent material of high luminance having a peak emission wavelength in the region from blue-green to yellow.

The nitride-based fluorescent material preferably contains at least one Group II element selected from among the group consisting of Be, Mg, Ca, Sr, Ba and Zn, at least Group IV element selected from among the group consisting of C, Si, Ge, Sn, Ti, Zr and Hf, and a rare earth element used as an activator R. Use of this novel fluorescent material makes it possible to provide a light emitting device having a broader range of color tones and high luminance of emitted light. When the fluorescent material is excited by an excitation source that emits an ultraviolet ray, in particular, a light emitting device having high luminance of emitted light can be provided by using a fluorescent material of high luminance having an emission peak wavelength in the region from yellow-red to red. A light emitting device having a high color rendering property can also be provided. Especially because the nitride-based fluorescent material is excited to emit light in a region from yellow-red to red by absorbing light in a short wavelength region from ultraviolet to visible light region of short wavelengths, a light emitting device having a high color rendering property that has a high red component by supplementing the red component can also be provided.

The indirect-excitation fluorescent material is preferably aluminate-based fluorescent material that contains a rare earth element as the activator R. This enables to be provided a light emitting device having high luminance of emitted light.

The excitation light source is preferably a light emitting element. This enables to be provided a light emitting device that is compact, high in power efficiency and emits light of clear color. A wavelength of light emission from an excitation light source may be within a region from ultraviolet to visible light. If the excitation light source has a principal emission peak in the ultraviolet region that has low visibility to human eyes, a color deviation caused by wavelength deviation of the light emitting device can be reduced. There is a visual sensitivity characteristic in sensitivity of the human eye to wavelengths of light, which dictates a highest sensitivity to light of 555 nm in wavelength, with the sensitivity decreasing toward shorter and longer wavelengths. For example, the human eye has lower visual sensitivity to ultraviolet rays used as an excitation source, and color of light emitted by the light emitting device is substantially determined by a light color emitted by fluorescent material that is employed. Also, because color deviation of light emitted by fluorescent material that emits light in the visible light region is restricted to an extremely small level even when the light emitting element undergoes color deviation due to a change in supplied current or other cause, a light emitting device having less variation in color tone can be provided. Here, "ultraviolet region" means a wavelength range shorter than visible light, specifically a wavelength range shorter than 400 nm. In the ultraviolet region, a wavelength range longer than 250 nm is preferable, and a near ultraviolet region (over 300 nm) is more preferable. A shorter wavelength region in the visible light (under 420 nm) has a similar effect as the above ultraviolet region.

On the other hand, if the excitation light source has a principal emission peak in the visible region, deterioration of phosphors caused by light emitted from light emitting devices can be reduced. Also, as light emitted from light emitting devices could be utilized to form a desired emission spectrum, less kinds of phosphors are required than a case with ultraviolet light emitting elements. In the visible light region, a light having a wavelength longer than 420 nm is preferable because of its high visibility to human eyes. However, as a light having too long a wavelength has lower efficiency for exciting phosphors, a light of a wavelength shorter than 500 nm is preferable. More preferably, "a blue region" in a broad sense (420-490 nm) is used. In this specification, terms like "a blue region" or "a blue series region" means the blue region in a broad sense, i.e. 420-490 nm in absence of any specific limitation.

In the light emitting device of the present invention, emission of white light can be easily achieved when the device has at least two emission peaks in the visible light region and wavelengths of at least two of the at least two emission peaks are in complementary color relation with each other. Here, white color includes (purplish) white, (bluish) white, (greenish) white, (yellowish) white, (light) pink, as well as (light) violet, (light) blue violet, (light) blue, (light) blue green, (light) green, (light) yellow green, (light) yellow, (light) yellow red, (orangish) pink, pink and (purplish) pink.

In the light emitting device of the present invention, general color rendering index (Ra) can be set to at least 80 and can be maintained at least 80 even when drive current density of the light emitting element fluctuates. In the light emitting device of the present invention, general color rendering index (Ra) can be maintained at least 80, for example, when drive current density of the light emitting element changes from 2.0 A/cm$^2$ to 50.0 A/cm$^2$. Special color rendering index (R9), in particular, is preferably at least 50. This enables to be provided a light emitting device having a broad range of color tones, as well as a light emitting device having an excellent color rendering property. General color rendering index (Ra) is a special color rendering index averaged over eight test color chips No. 1 to No. 8, specified in CIE and JIS.

DESCRIPTION OF REFERENCE NUMERALS

Figure 1:
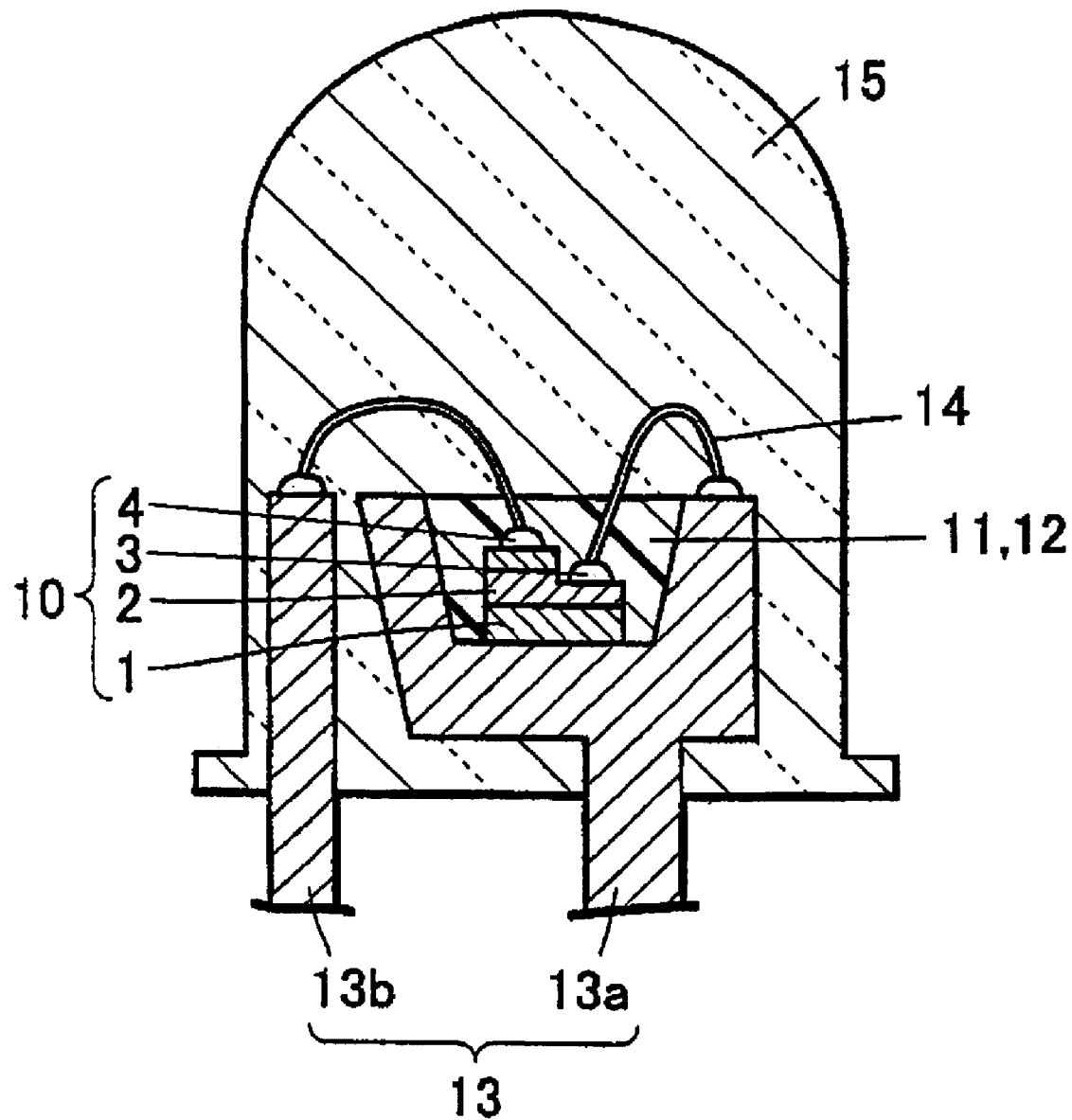
FIG. 1 shows a bullet-shaped light emitting device according to the invention.

1. Substrate
2. Semiconductor layer
3. Electrode
4. Bump
10. Light emitting element
11. Fluorescent material
12. Coating member
13. Lead frame
13a. Mount lead 13b. Inner lead
11. Electrically conductive wire
12. Molding member
101. Light emitting element
102. Lead electrode
103. Insulating seal member
104. Electrically conductive wire
105. Package
106. Lid
107. Window
108. Fluorescent material
109. Coating member
201. Substrate
202. Base layer
203. n-type layer
203a. Exposed surface
204. Active layer
205. p-type carrier confinement layer
206. 1st p-type layer
207. Current diffusion layer
208. p-type contact layer
209. Light emitting section
210. p-type electrode
210a. Electrode branch
210b. p-type pad electrode
211a. n-type electrode
211b. n-type pad electrode

DETAILED DESCRIPTION OF THE PREFERRED EMBODIMENTS

Fluorescent material and a method for manufacturing the same according to the present invention will be described by way of embodiments and examples. It is understood that the present invention is not limited by these embodiments and examples.

First Embodiment

A light emitting device according to a first embodiment of the present invention uses an excitation light source that emits light in an ultraviolet to blue region and at least two kinds, preferably at least three kinds, of fluorescent material that are substantially directly excited by the light emitted by the excitation light source and emit light, so as to generate light of various colors through blending of the light emitted by these fluorescent materials. The light emitting device of this embodiment is particularly characterized in that all the fluorescent materials have a luminescence center of a direct transition type, thereby suppressing both a variation in the color of emitted light (color deviation) due to variation in a drive current of a light emitting element and a variation in the color of emitted light due to a difference in a drive mode (particularly a difference between DC drive and pulse drive) to extremely low levels. A specific example of the light emitting device will now be described with reference to FIG. 1. FIG. 1 shows the light emitting device according to the present invention. In this specification, a relationship between color notations and chromatic coordinates is based on JIS 28110.

Since fluorescent material of a direct transition type used in the present invention has fast response time (response speed) taken for intensity of emitted light to reach a peak after being irradiated with excitation light, proportions of light emission intensity among a plurality of fluorescent materials is not substantially caused to vary by the difference between DC drive and pulse drive, and therefore light color does not vary regardless of a drive mode. In case a plurality of fluorescent materials are used containing both fluorescent material of the direct transition type and fluorescent material of an indirect transition type, in contrast, since a response speed is different between these two types of fluorescent material, proportions of light emission intensity among this plurality of fluorescent materials vary and the light color shows marked difference depending on whether the device is DC-driven or pulse-driven. Also in case a plurality of kinds of fluorescent material are used, even when all fluorescent materials in use are fluorescent materials of the indirect transition type, the light color varies depending on the drive mode since the fluorescent materials have a nonlinear emission intensity characteristic with respect to excitation light intensity, slow response speed and different response speeds. Also in case a plurality of kinds of fluorescent material are used, when fluorescent material of the indirect transition type is included, the light color varies due to difference in pulse width and/or in duty ratio even if driven by the same pulse drive, since these fluorescent materials are different in response speed and have a nonlinear emission intensity characteristic.

There is also such a problem that, in case a plurality of kinds of fluorescent material are used, when fluorescent material of the indirect transition type is included, color deviation becomes conspicuous due to variations in drive voltage and current, since these fluorescent materials are different in response speed and have a nonlinear emission intensity characteristic. However, if all the fluorescent materials are fluorescent materials of the direct transition type as in the present invention, the fluorescent materials emit light with intensities that are proportional to the intensity of excitation light and output power of light emission varies in proportion to a magnitude of supplied current (high linearity), and therefore a balance in emission intensity between different fluorescent materials is not lost when supplied current changes, so that color deviation due to a change in current supply can be prevented, as will be proved later by examples. As will be seen from the foregoing description, the light emitting device according to the present invention achieves light emission with extremely small variation in color by use of fluorescent material of the direct transition type.

Figure 2:
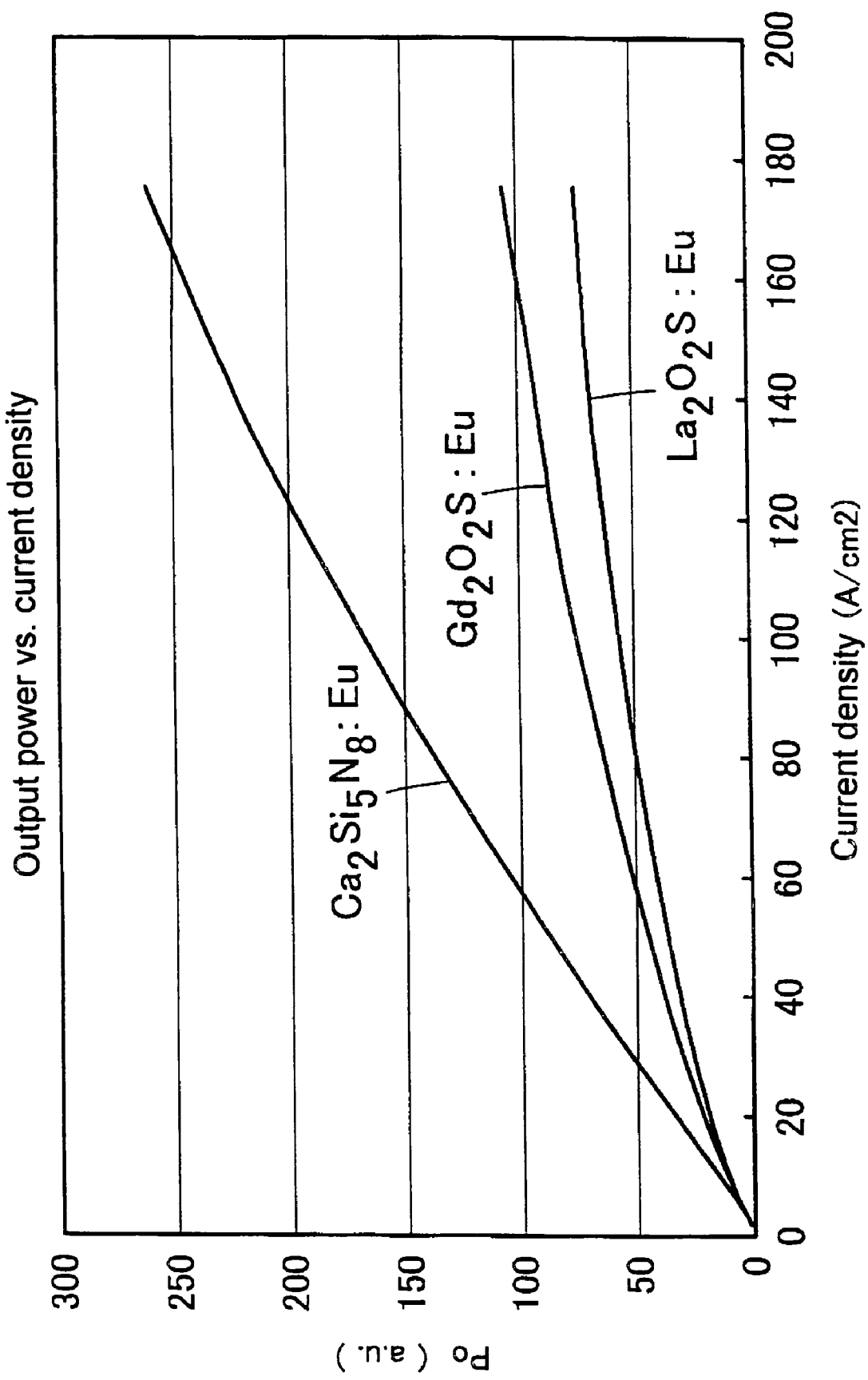
FIG. 2 is a graph showing emission output power vs. current density for fluorescent material of direct transition type and fluorescent material of indirect transition type.

FIG. 2 shows a relationship of emission power output to supplied current density in $Ca_2Si_5N_8$:Eu that is a fluorescent material of the direct transition type, and $Gd_2O_2S$:Eu and $La_2O_2S$:Eu that are fluorescent materials of the indirect transition type. As shown in FIG. 2, while emission power output of $Ca_2Si_5N_8$:Eu that is a fluorescent material of the direct transition type increases approximately twofold when current supply increases twofold, fluorescent materials of the indirect transition type do not. This shows that a fluorescent material of the direct transition type has a much higher linearity than a fluorescent material of the indirect transition type.

According to the present invention, while the fluorescent materials emit visible light of wavelengths different from that emitted by the light emitting element, an excitation source of the fluorescent materials is not limited to light emitted by the light emitting element. For example, all of the fluorescent materials included may be excited by the light emitted only by the light emitting element or, alternatively, some of the fluorescent materials included may be excited by the light emitting element with a remainder of the fluorescent materials excited either only by light emitted by the excited fluorescent material or by the light from the excited fluorescent material and the light from the light emitting element. In case three kinds of fluorescent materials are included, for example, all of the first to third fluorescent materials may be excited by the light from the light emitting element, or the first fluorescent material may be excited by the light emitting element with the second and third fluorescent materials excited either only by the light from the first fluorescent material or by the light from the first fluorescent material and the light from the light emitting element. Constitution of the present invention works particularly effectively and achieves remarkable effects when a plurality of fluorescent materials are excited in two stages.

Constitution of the light emitting device of the first embodiment will now be described in detail.

The light emitting device of the first embodiment comprises, as shown in FIG. 1, light emitting element 10 that emits ultraviolet rays, cathode-side lead frame 13a having a cup for placing the light emitting element 10 therein, anode-side lead frame 13b provided apart from the lead frame 13a, coating member 12 that includes fluorescent material 11 provided in the cup of the lead frame 13a, and transparent molding member 15 that entirely covers other members of the device, while a plurality of fluorescent materials of indirect transition type are used for the fluorescent material 11.

Positive electrode 3 of the light emitting element 10 is connected with electrically conductive wire 14 to the lead frame 13b, and negative electrode 4 of the light emitting element 10 is connected with electrically conductive wire 14 to the lead frame 13a, while the light emitting element 10, the electrically conductive wire 14, the cup of the lead frame 13a, and a tip of the lead frame 13b are covered by the transparent molding member 15.

The light emitting device of the first embodiment constituted as described above is manufactured as follows.

The light emitting element 10 is die-bonded face-up to the cup of the lead frame 13a by a die bonder.

After die bonding, the lead frame 13 is transferred onto a wire bonder and the negative electrode 4 of the light emitting element is wire-bonded with a gold wire (electrically conductive wire) onto an upper edge of the cup of the lead frame 13a, and the positive electrode 3 is wire-bonded to the lead frame 13b.

Then assembly is transferred onto a molding apparatus, and the cup of the lead frame 13a is filled with the fluorescent material 11 and material of the coating member 12 by a dispenser of the molding apparatus. The fluorescent material 11 and the material of the coating member 12 are mixed uniformly in a predetermined proportion in advance. In the light emitting device of the first embodiment, in particular, color of light emitted by the device is determined mainly by the color of light emitted by the plurality of fluorescent materials.

After pouring in the fluorescent material 11 and the material of the coating member 12, the lead frame 13 is immersed in a mold frame that is filled with resin to make the molding member 15 in advance, and the mold frame is removed and the resin is cured to harden, so as to make a bullet-shaped light emitting device as shown in FIG. 1.

Now various elements of the first embodiment will be described in more detail.

(Fluorescent Material)

The fluorescent material 11 comprises at least three kinds of fluorescent material of the direct transition type having a luminescence center of the direct transition type such as 4f-5d, that absorb light from the light emitting element 10 or light from other fluorescent material and emit light having a peak emission wavelength in the visible light region. The fluorescent material 11 has a response time from excitation to stable light emission and a $\frac{1}{10}$ afterglow period preferably of at most 700 μsec, more preferably at most 500 μsec, further more preferably at most 200 μsec, and most preferably at most 50 μsec, but may be within 1 msec in a case of the direct transition type. The fluorescent material 11 preferably contains Eu or Ce or Yb in the luminescence center.

Those which can be used as the fluorescent material 11 will be described below. In the description that follows, for the sake of convenience, a fluorescent material that emits light mainly in a blue to blue-green region will be called a first fluorescent material, a fluorescent material that emits light mainly in a green to orange region will be called a second fluorescent material, and a fluorescent material that emits light mainly in an orange to red region is called a third fluorescent material. However, these regions are not clearly divided since the color of emitted light changes when an activator or other component is added or used as a substitute.

<First Fluorescent Material>

In the present invention, the first fluorescent material may be alkaline earth metal halogen apatite fluorescent material activated with at least Eu, alkaline earth metal boric acid halide salt fluorescent material activated with at least Eu, alkaline earth metal aluminate fluorescent material activated with at least Eu, alkaline earth metal silicon oxynitride fluorescent material activated with at least Eu or Ce, or alkaline earth metal silicon nitride fluorescent material, but is not limited to these materials.

More specifically, alkaline earth metal halogen apatite fluorescent material activated with at least Eu may be selected from among fluorescent materials (1) to (4) specified below.

(1) Fluorescent material represented by $(M1_{1-a-b}Eu_aL1_b)_{10}(PO_4)_6Q_2$ wherein M1 represents at least one element selected from among Mg, Ca, Ba, Sr and Zn, L1 represents at least one element selected from among Mn, Fe, Cr and Sn, and Q represents at least one halogen element selected from among F, Cl, Br and I, and $0.0001 \leq a \leq 0.5$ and $0.0001 \leq b \leq 0.5$.

(2) Fluorescent material represented by $(M1_{1-a}Eu_a)_{10}(PO_4)_6Q_2$ wherein M1 represents at least one element selected from among Mg, Ca, Ba, Sr and Zn, and Q represents at least one halogen element selected from among F, Cl, Br and I, and $0.0001 \leq a \leq 0.5$.

(3) Fluorescent material represented by $(M1_{1-a-b}Eu_aMn_b)_{10}(PO_4)_6Q_2$ wherein M1 represents at least one element selected from among Mg, Ca, Ba, Sr and Zn, and Q represents at least one halogen element selected from among F, Cl, Br and I, and $0.0001 \leq a \leq 0.5$ and $0.0001 \leq b \leq 0.5$.

(4) Fluorescent material represented by $(M2_{1-a-c}Eu_aBa_c)_{10}(PO_4)_6Q_2$ wherein M2 represents at least one element selected from among Mg, Ca, Ba, Sr and Zn, and Q represents at least one halogen element selected from among F, Cl, Br and I, and $0.0001 \leq a \leq 0.5$ and $0.10 \leq c \leq 0.98$.

Alkaline earth metal boric acid halide salt fluorescent material activated with at least Eu may be selected from among fluorescent materials (5) and (6) specified below.

(5) Fluorescent material represented by $(M1_{1-a}Eu_a)_2B_5O_9Q$ wherein M1 represents at least one element selected from among Mg, Ca, Ba, Sr and Zn, and Q represents at least one halogen element selected from among F, Cl, Br and I, and $0.0001 \leq a \leq 0.5$.

(6) Fluorescent material represented by $(M1_{1-a-b}Eu_aMn_b)_2B_5O_9Q$ wherein M1 represents at least one element selected from among Mg, Ca, Ba, Sr and Zn, and Q represents at least one halogen element selected from among F, Cl, Br and I, and $0.0001 \leq a \leq 0.5$ and $0.0001 \leq b \leq 0.5$.

Alkaline earth metal aluminate fluorescent material activated with at least Eu may be selected from among fluorescent materials (7) and (8) specified below.

(7) Fluorescent material represented by $M3_{1-a}Eu_aMgAl_{10}O_{17}$ wherein M3 represents at least one element selected from among Ca, Ba, Sr and Zn, and $0.0001 \leq a \leq 0.5$.

(8) Fluorescent material represented by $M3_{1-a}Eu_aMg_{1-b}Mn_bAl_{10}O_{17}$ wherein M3 represents at least one element selected from among Ca, Ba, Sr and Zn, and $0.0001 \leq a \leq 0.5$ and $0.0001 \leq b \leq 0.5$.

<Second Fluorescent Material>

In the present invention, the second fluorescent material may be rare earth aluminate fluorescent material having a garnet structure and activated with at least cerium, alkaline earth metal aluminate fluorescent material activated with at least Eu, alkaline earth silicate fluorescent material activated with at least Eu, alkaline earth metal silicon oxynitride fluorescent material activated with at least Eu or Ce, alkaline earth metal gallium sulfide fluorescent material activated with at least Eu or Ce, ZnS:Cu, ZnS:Mn, α-sialon fluorescent material, $Ca_3Sc_2Si_3O_{12}$:Ce, but is not limited to these materials.

More specifically, rare earth aluminate fluorescent material having a garnet structure and activated with at least cerium may be selected from among, for example, $Lu_3Al_5O_{12}$:Ce, $(Y,Ga)_3Al_5O_{12}$:Ce, $Y_3Al_5O_{12}$:Ce and $Y(Al, Ga)_5O_{12}$:Ce. Among these materials, aluminum garnet fluorescent material is preferably used, and yttrium aluminum garnet fluorescent material is more preferably used.

Alkaline earth metal aluminate fluorescent material activated with at least Eu may be selected from among fluorescent materials (9) to (12) specified below.

(9) Fluorescent material represented by $M1_{1-a}Eu_aAl_2O_4$ wherein M1 represents at least one element selected from among Mg, Ca, Ba, Sr and Zn, and $0.0001 \leq a \leq 0.5$.

(10) Fluorescent material represented by $M1_{1-a-b}Eu_aMn_bAl_2O_4$ wherein M1 represents at least one element selected from among Mg, Ca, Ba, Sr and Zn, and $0.0001 \leq a \leq 0.5$ and $0.0001 \leq b \leq 0.5$.

(11) Fluorescent material represented by $(M1_{1-a}Eu_a)_4Al_{14}O_{25}$ wherein M1 represents at least one element selected from among Mg, Ca, Ba, Sr and Zn, and $0.0001 \leq a \leq 0.5$

(12) Fluorescent material represented by $(M1_{1-a-b}Eu_aMn_b)Al_{14}O_{25}$ wherein M1 represents at least one element selected from among Mg, Ca, Ba, Sr and Zn, and $0.0001 \leq a \leq 0.5$ and $0.0001 \leq b \leq 0.5$.

Alkaline earth metal silicate fluorescent material activated with at least Eu may be selected from among fluorescent materials (13) and (14) specified below.

(13) Fluorescent material represented by $(M1_{1-a}Eu_a)_2SiO_4$ wherein M1 represents at least one element selected from among Mg, Ca, Ba, Sr and Zn, and $0.0001 \leq a \leq 0.5$.

(14) Fluorescent material represented by $(M1_{1-a-b}Eu_aMn_b)_2SiO_4$ wherein M1 represents at least one element selected from among Mg, Ca, Ba, Sr and Zn, and $0.0001 \leq a \leq 0.5$ and $0.0001 \leq b \leq 0.5$.

For the alkaline earth metal silicon oxynitride fluorescent material activated with at least Eu or Ce, for example, a fluorescent material represented by $(M1_{1-a}Eu_a)Si_2O_4N_2$ may be used, wherein M1 represents at least one element selected from among Mg, Ca, Ba, Sr and Zn, and $0.0001 \leq a \leq 0.5$. More specifically, $BaSi_2O_2N_2$:Eu, $(Sr,Ca)Si_2O_2N_2$:Eu or the like may be used.

For alkaline earth metal gallium sulfide fluorescent material activated with at least Eu or Ce, for example, a fluorescent material represented by $(M1_{1-a}Eu_a)Ga_2S_4$ may be used, wherein M1 represents at least one element selected from among Mg, Ca, Ba, Sr and Zn, and $0.0001 \leq a \leq 0.5$.

<Third Fluorescent Material>

According to the present invention, while alkaline earth metal silicon nitride fluorescent material having a monoclinic or orthorhombic crystal structure activated with at least Eu is preferably used for the third fluorescent material, such as $Ca_2Si_5N_8$:Eu, $Sr_2Si_5N_8$:Eu, $Ba_2Si_5N_8$:Eu, $(Ca, Sr)_2Si_5N_8$:Eu or the like, fluorescent materials specified below in (15) to (18) may also be used.

(15) Alkaline earth metal gallium sulfide fluorescent material represented by $(M1_{1-a}Eu_a)S$ wherein M1 represents at least one element selected from among Mg, Ca, Ba, Sr and Zn, and $0.0001 \leq a \leq 0.5$.

(16) Alkaline earth metal sulfide fluorescent material represented by $(M1_{1-a-b}Eu_aMn_b)S$ wherein M1 represents at least one element selected from among Mg, Ca, Ba, Sr and Zn, and $0.0001 \leq a \leq 0.5$ and $0.0001 \leq b \leq 0.5$.

(17) Alkaline metal tungstate fluorescent material such as $LiEuW_2O_8$

(18) Alkaline metal borate fluorescent material activated with at least Eu

Fluorescent materials having typical compositions described above all have short response time as will be shown later in Table 24. According to the present invention, various fluorescent materials having a luminescence center of the direct transition type such as those described above can be used. Other than those, fluorescent materials having similar properties and effects may also be used.

While light emitting devices that emit light of various colors can be manufactured by combining fluorescent materials described above, light emitting devices that emit white light have wide applications and are preferable. A light emitting device that emits white light may be, for example, made by using a first fluorescent material that emits blue light, a second fluorescent material that emits green light and a third fluorescent material that emits red light, which are mixed in predetermined proportions. The second and/or third fluorescent materials are not limited to those which are strongly excited by light from the light emitting element, but may be such that are strongly excited by light from the first fluorescent material which is excited by the light emitting element and emits blue light, and emits light of a longer wavelength than that of the first fluorescent material. This is because some fluorescent materials have such excitation spectra that are less likely to be excited by light nearly in an ultraviolet region but are easily excited by light in a blue region.

A mixture of first fluorescent material that emits blue light, second fluorescent material that emits green light, second fluorescent material that emits yellow light and third fluorescent material that emits red light in predetermined proportions may also be used. Also, a mixture of first fluorescent material that emits blue light, second fluorescent material that emits yellow light and third fluorescent material that emits red light in predetermined proportions may be used. Furthermore, a mixture of first fluorescent material that emits blue light and second fluorescent material that emits yellow light in predetermined proportions may also be used. A light emitting device that emits white light with a good color rendering property can be made by using the fluorescent material 11 comprising the first fluorescent material represented by $(Sr, Ca)_5(PO_4)_3Cl:Eu$ that emits blue light, second fluorescent material represented by $CaSi_2O_2N_2:Eu$ or $SrSi_2O_2N_2:Eu$ that emits light in a green to yellow region and third fluorescent material represented by $(Ca, Sr)_2Si_5N_8:Eu$ that emits red light. This is because a white light of desired hue can be generated simply by changing proportions of the fluorescent materials due to use of the three primary colors, red, blue and green.

Other specific examples will be described below.

<Combinations with Blue Light Emitting Element>
Light Emitting Element

Light emitting element that emits blue light (420-490 nm, for example, wavelength 450 nm)

First Fluorescent Material

At least one kind of fluorescent material selected from a group of fluorescent materials represented by $(M1_{1-a}Eu_a)_4Al_{14}O_{25}$ (M1 represents at least one element selected from among the group consisting of Mg, Ca, Ba, Sr and Zn, and a is a number satisfying $0.0001 \leq a \leq 0.5$), $(M1_{1-a}Eu_a)Si_2O_2N_2$ (M1 represents at least one element selected from among the group consisting of Mg, Ca, Ba, Sr and Zn, and a is a number satisfying $0.0001 \leq a \leq 0.5$), $M3_{1-a}Eu_aMg_{1-b}Mn_bAl_{10}O_{17}$ (M3 represents at least one element selected from among the group consisting of Ca, Ba, Sr and Zn, and a is a number satisfying $0.0001 \leq a \leq 0.5$ and b is a number satisfying $0.0001 \leq b \leq 0.5$) and $M1_{1-a}Eu_aAl_2O_4$ (M1 represents at least one element selected from among the group consisting of Mg, Ca, Ba, Sr and Zn, and a is a number satisfying $0.0001 \leq a \leq 0.5$).

Second Fluorescent Material

Fluorescent material represented by $(Re_{1-x}Sm_x)_3(Al_{1-y}Ga_y)_5O_{12}:Ce$ (Re represents at least one kind of element selected from among Y, Gd and La, x is a number satisfying $0 \leq x < 1$ and y is a number satisfying $0 \leq y \leq 1$) and/or $(M1_{1-a}Eu_a)Si_2O_2N_2$ (M1 represents at least one element selected from among the group consisting of Mg, Ca, Ba, Sr and Zn, and a is a number satisfying $0.0001 \leq a \leq 0.5$).

Third Fluorescent Material

A fluorescent material represented by $M_2Si_5N_8:Eu$ (M represents at least one element selected from among the group consisting of Sr, Ca, Ba, Mg and Zn)

With such a combination, such a light emitting device can be provided that is free from variation in color of emitted light even when the drive current density of the light emitting device is changed, has excellent temperature characteristics, excellent excitation efficiency and a high color rendering property, where adverse effects that may potentially be caused by the fluorescent material on electrodes (electrodes of a package and of the light emitting element) and wire is eliminated, and gassing caused by the fluorescent material when forming the fluorescent material layer does not occur.

<Example of Combination with Light Emitting Element that Emits Near Ultraviolet to Visible Light of Short Wavelength>
Light Emitting Element Light emitting element that emits near ultraviolet to visible light of a relatively short wavelength (300-420 nm, for example, wavelength 400 nm)

First Fluorescent Material (1)

At least one kind selected from the group of fluorescent materials represented by $(M1_{1-a}Eu_a)_{10}(PO_4)_6Q_2$ (M1 represents at least one element selected from among Mg, Ca, Ba, Sr and Zn, Q represents at least one element selected from among F, Cl, Br and I, and a is a number satisfying $0.0001 \leq a \leq 0.5$), $(M1_{1-a}Eu_a)_2B_5O_9Q$ (M1 represents at least one element selected from among Mg, Ca, Ba, Sr and Zn, Q represents at least one element selected from among F, Cl, Br and I, and a is a number satisfying $0.0001 \leq a \leq 0.5$) and $M3_{1-a}Eu_aMgAl_{10}O_{17}$ (M3 represents at least one element selected from among the group consisting of Ca, Ba, Sr and Zn, and a is a number satisfying $0.0001 \leq a \leq 0.5$).

First Fluorescent Material (2)

At least one kind selected from the group of fluorescent materials represented by $(M1_{1-a}Eu_a)_4Al_{14}O_{25}$ (M1 represents at least one element selected from among Mg, Ca, Ba, Sr and Zn, and a is a number satisfying $0.0001 \leq a \leq 0.5$ and $0.0001 \leq b \leq 0.5$), $(M1_{1-a}Eu_a)Si_2O_2N_2$ (M1 represents at least one element selected from among Mg, Ca, Ba, Sr and Zn, and a is a number satisfying $0.0001 \leq a \leq 0.5$), $M3_{1-a}Eu_aMg_{1-b}Mn_bAl_{10}O_{17}$ (M3 represents at least one element selected from among the group consisting of Ca, Ba, Sr and Zn, and a is a number satisfying $0.0001 \leq a \leq 0.5$), and $M1_{1-a}Eu_aAl_2O_4$ (M1 represents at least one element selected from among Mg, Ca, Ba, Sr and Zn, and a is a number satisfying $0.0001 \leq a \leq 0.5$).

Second Fluorescent Material

Fluorescent material represented by $(Re_{1-x}Sm_x)_3(Al_{1-y}Ga_y)_5O_{12}:Ce$ (Re represents at least one kind of element selected from among Y, Gd and La, x is a number satisfying $0 \leq x < 1$ and y is a number satisfying $0 \leq y \leq 1$) and/or $(M1_{1-a}Eu_a)Si_2O_2N_2$ (M1 represents at least one element selected from among the group consisting of Mg, Ca, Ba, Sr and Zn, and a is a number satisfying $0.0001 \leq a \leq 0.5$).

Third Fluorescent Material

A fluorescent material represented by $M_2Si_5N_8:Eu$ (M represents at least one element selected from among the group consisting of Sr, Ca, Ba, Mg and Zn).

With such a combination, a light emitting device can be provided that is free from variation in color of emitted light even when a drive current density of the light emitting device is changed, and has excellent temperature characteristics, excellent excitation efficiency and a high color rendering property, where adverse effects that may potentially be caused by the fluorescent material on electrodes (electrodes of a package and of the light emitting element) and wire is eliminated, and gassing caused by the fluorescent material when forming the fluorescent material layer does not occur.

Proportion of the first fluorescent material content in the entire fluorescent material is preferably at least 5% by weight and is not higher than 70% by weight, with an upper limit more preferably at most 50% by weight and most preferably at most 30% by weight. Proportion of the second fluorescent material content in the entire fluorescent material is preferably at least 3% by weight and is not higher than 80% by weight, with an upper limit more preferably at most 50% by weight and most preferably at most 15% by weight. Proportion of the third fluorescent material content in the entire fluorescent material is preferably at least 1% by weight and is not higher than 70% by weight, with an upper limit more preferably at most 40% by weight and most preferably at most 10% by weight.

Particle size of the fluorescent material 11 is preferably in a range from 1 µm to 20 µm, more preferably in a range from 2 µm to 8 µm, and most preferably in a range from 5 µm to 8 µm. A fluorescent material having particle size smaller than 2 µm tends to coagulate. A fluorescent material having particle size in a range from 5 µm to 8 µm has high efficiencies of absorbing and converting light. Mass productivity of the light emitting device can be improved by using fluorescent materials of such particle sizes having better optical characteristics.

The term "particle size" used herein refers to a mean particle size determined by an air permeation method. With this method, 1 cm$^3$ is metered out of a sample under ambient condition of 25° C. in temperature and 70% in relative humidity, and is packed in a special tubular container through which dry air is sent to flow under a constant pressure. From pressure drop of air across the sample, specific surface area is calculated and is then converted to mean particle size. The fluorescent materials used in the present invention have mean particle sizes preferably in a range from 2 µm to 8 µm. It is also preferable that the fluorescent materials having mean particle sizes in this range are included with high proportion. It is also preferable that the fluorescent materials have particle size distribution concentrated in a narrow region, and the proportion of fine particles smaller than 2 µm, in particular, is substantially lower. Use of the fluorescent material having less variability in particle sizes with narrow particle size distribution makes it possible to obtain a light emitting device having color deviation suppressed more effectively, and satisfactory color tone.

With the fluorescent materials described above, chromaticity can be freely adjusted over a region of colors ranging from blue to red and an excitation spectrum and excitation efficiency can be adjusted over relatively broad ranges, by selecting a composition and proportions of components.

(Coating Member)

The coating member 12 (light transmitting material) is mixed with the fluorescent material 11 that converts light from the light emitting element 10, with this mixture provided in the cup of the lead frame 13. Material used to make the coating member 12 may be a transparent resin that has good temperature characteristics and high weatherability such as epoxy resin, urea resin and silicone resin, light transmitting inorganic material that is produced from metal alkoxide by sol-gel process, glass, inorganic binder or the like. Along with the fluorescent material 11, a diffusing agent, barium titanate, titanium oxide, aluminum oxide or the like may be included. A photostabilizer and/or colorant may also be included. An inorganic binder may also be used.

The coating member 12 may also include, besides the fluorescent material 11, a light transmitting filler made of silicon oxide, aluminum oxide, aluminum nitride, boron nitride, titanium oxide or the like. In case a print forming process is employed when forming the fluorescent material layer consisting of the fluorescent material 11 and the coating member 12, content of the light-permeable filler is preferably from 0 to 200 parts by weight based on 100 parts by weight of the resin and the fluorescent material combined. In case a dispense forming process is employed, content of the light-permeable filler is preferably from 0 to 50 parts by weight based on 100 parts by weight of the resin and the fluorescent material combined. In case resin molding in the shape of a cap is employed, content of the light-permeable filler is preferably from 0 to 400 parts by weight based on 100 parts by weight of the resin and the fluorescent material combined.

(Excitation Light Source)

It is preferable to use an excitation light source that has a main peak emission wavelength in a region from ultraviolet to visible light of shorter wavelengths. Emission wavelength of the excitation light source is preferably in a range from 250 to 500 nm, more preferably in a range from 290 to 470 nm and most preferably in a range from 340 to 420 nm. As long as the peak emission wavelength lies in the range described above, there is no limitation to the excitation light source, which may be a semiconductor light emitting element or one that uses energy supplied by a lamp, electron beam, plasma, EL or the like, while use of a semiconductor light emitting element is preferred.

The light emitting element of the first embodiment has the substrate 1 made of sapphire, the semiconductor layer 2 formed thereon, and the positive and negative electrodes formed on the same side of the semiconductor layer 2. The semiconductor layer 2 consists of a plurality of layers containing the light emitting layer (not shown), and blue light is emitted from the light emitting layer.

The semiconductor light emitting element capable of emitting light of a wavelength not longer than 500 nm in the ultraviolet to visible region can be made of various semiconductors such as BN, SiC, ZnSe, GaN, InGaN, InAlGaN, AlGaN, BaIGaN and BinAlGaN. An impurity element such as Si or Zn may be added to these semiconductors to form a luminescence center. A material suitable for forming the light emitting layer that can efficiently emit light of a short wavelength in the ultraviolet to visible region, which has high efficiency in exciting fluorescent materials, is a nitride semiconductor (for example, nitride semiconductor containing Al and/or Ga, nitride semiconductor that includes In and/or Ga such as $In_XAl_YGa_{1-X-Y}$:N, 0<X<1, 0<Y<1, X+Y≦1).

Preferable structures of the light emitting element include homojunction structure that has an MIS junction, PIN junction or pn junction, heterojunction structure or double heterojunction structure. Emission wavelength can be controlled by selecting the semiconductor material and adjusting a composition of mixed crystal. Output power can be increased by forming an active layer in a thin film where a quantum effect can be utilized having single quantum well structure or multiple quantum well structure.

When a nitride semiconductor is used, the substrate can be made of sapphire, spinel, SiC, Si, ZnO, GaAs, GaN or the like. In order to form a nitride semiconductor with good crystallinity and characteristics suitable for mass production, it is preferable to use a sapphire substrate. The nitride semiconductor can be formed on the sapphire substrate by an HVPE process, MOCVD process or the like. In this case, it is preferable to form the nitride semiconductor that has a pn junction on a buffer layer that is not a single crystal and is formed on the sapphire substrate by growing GaN, AlN, GaAlN or the like at a low temperature.

[Example of Light Emitting Element that Emits Ultraviolet Light]

An example of a light emitting element that can efficiently emit an ultraviolet ray made of a nitride semiconductor having a pn junction can be formed in such a structure as described below.

First, an SiO$_2$ layer is formed in a striped pattern on a buffer layer at substantially right angles to an orientation flat plane of the sapphire substrate. Then a GaN layer is formed on the striped pattern through ELOG (Epitaxial Lateral Over Growth GaN) by the HVPE method. Then a first contact layer made of n-type gallium nitride, a first cladding layer made of n-type aluminum gallium nitride, an active layer of multiple quantum well structure consisting of a plurality of well layers made of indium aluminum gallium nitride and barrier layers made of aluminum gallium nitride formed one on another, a second cladding layer made of p-type aluminum gallium nitride and a second contact layer made of p-type gallium nitride are formed successively in this order, so as to form a double heterojunction structure. With this constitution, the active layer can be formed in a ridge striped pattern sandwiched by guide layers with a resonator end face being provided, so as to make a semiconductor laser element that can be used in the present invention.

[Example of Light Emitting Element that Emits Blue Light]

The light emitting element 10 may also be a light emitting element that emits blue light, instead of a light emitting element that emits an ultraviolet ray. The light emitting element 10 that emits blue light is preferably made of nitride of a Group III element. The light emitting element 10 comprises an undoped n-type GaN layer, an n-type contact layer made of Si-doped GaN, an undoped GaN layer, a light emitting layer having a multiple quantum well structure (quantum well structure comprising GaN barrier layers/InGaN well layers), a p-type cladding layer made of Mg-doped p-type GaN and a p-type contact layer made of Mg-doped p-type GaN, formed one on another on the sapphire substrate 1 via a GaN buffer layer, thereby forming electrodes as described below. A p ohmic electrode is formed over substantially an entire surface of the p-type contact layer, and a p-pad electrode is formed on the p ohmic electrode. An n electrode is formed on an exposed portion of the n-type contact layer after removing the undoped GaN layer from the p-type contact layer by etching.

This embodiment employs a light emitting layer of a multiple quantum well structure, although the present invention is not limited to this constitution and, for example, a single quantum well structure formed with InGaN may be employed, or GaN doped with Si or Zn may be used. A principal peak emission wavelength of the light emitting layer of the light emitting element 10, 101 can be changed within a range from 420 nm to 490 nm. The peak emission wavelength is not limited to the range described above, and those having a peak emission wavelength in a range from 360 nm to 550 nm may also be used.

While a nitride semiconductor has n-type electrical conductivity when not doped with an impurity, it is preferable to form an n-type nitride semiconductor having a predetermined carrier concentration in order to improve efficiency of light emission, in which case Si, Ge, Se, Te, C or the like is introduced as an n-type dopant. When a p-type nitride semiconductor is formed, on the other hand, Zn, Mg, Be, Ca, Sr, Ba or the like is added as a p-type dopant. Since a nitride semiconductor is difficult to turn to a p-type simply by doping with a p-type dopant, it is preferable to decrease resistance by heating in a furnace or irradiating with plasma after introduction of the p-type dopant. In case the positive and negative electrodes are formed while leaving the sapphire substrate intact, both the p-type and n-type contact layers are exposed on the same side by partially etching on a p-type side to a surface of a first contact layer. Then after forming the electrodes on both contact layers, this wafer is diced into chips thereby by making nitride semiconductor light emitting elements (chips).

In the first embodiment, it is preferable to use a resin when attaching the fluorescent material 11 to the light emitting element 10, in order to ensure high mass productivity. In this case, when the emission wavelength of the fluorescent material 11, deterioration of the light transmitting resin and other factors are taken into consideration, it is preferable to use a light emitting element 10 that has an emission spectrum in the ultraviolet region with peak emission wavelength falling in a region from 360 nm to 420 nm or in a region from 450 nm to 470 nm. While the blue light emitting element is used, it is preferable to set the peak emission wavelength in a region from 450 nm to 470 nm in consideration of by taking into consideration an excitation wavelength of the nitride fluorescent material and deterioration of a light transmitting resin, in case the light transmitting resin is used as the coating member and the molding member.

In the light emitting device according to the present invention, in case a light emitting element other than the blue light emitting element is used as in the seventh embodiment to be described later, it is preferable to set a principal emission peak wavelength of the light emitting element in a region from 360 nm to 420 nm in consideration of the excitation wavelength of the nitride fluorescent material and deterioration of the light transmitting resin.

In the semiconductor light emitting element, it is preferable to control sheet resistance Rn of the n-type contact layer having impurity concentration of $10^{17}$ to $10^{20}$/cm$^3$ and sheet resistance Rp of the light transmitting p electrode to satisfy the relation of Rp≧Rn. The n-type contact layer is preferably formed to a thickness of 3 to 10 μm, more preferably from 4 to 6 μm. Since the sheet resistance Rn of the n-type contact layer is estimated to be in a range from 10 to 15Ω/□, a thin film may be formed to have a sheet resistance equal to or higher than the value described above. Specifically, the light transmitting p electrode is preferably formed as thin as at most 150 μm. The p electrode may also be formed from ITO or ZnO as well as a metal. The p electrode may be replaced with an electrode having a plurality of light extracting apertures such as a mesh electrode.

In case a light transmitting p electrode is formed from a multi-film layer, made of one kind of metal selected from the group consisting of gold and platinum group elements and at least one kind of other metal, or an alloy, then stability and reproductivity can be improved by controlling content of the gold or platinum group element thereby to regulate sheet resistance of the light transmitting p electrode. Since gold or the other metal element has a high absorptivity in a wavelength region of the semiconductor light emitting element that is used in the present invention, transmissivity becomes higher when the light transmitting p electrode contains less gold or platinum group element. The semiconductor light emitting element of the prior art has the relation of Rp≦Rn for sheet resistances. When Rp is not less than Rn, the light transmitting p electrode is formed with a smaller thickness than in the prior art, and the thickness can be decreased easily by reducing the content of gold or the other metal element.

In the semiconductor light emitting element used in the present invention, as described above, sheet resistance Rn Ω/□ of the n-type contact layer and sheet resistance Rp Ω/□ of the light transmitting p electrode are preferably controlled to satisfy the relationship of Rp≧Rn. It is difficult to measure a value of Rn after making the semiconductor light emitting element, and it is virtually impossible to know the relationship between Rp and Rn, although the relationship between Rp and Rn can be estimated from light intensity distribution during emission.

When the light transmitting p electrode and the n-type contact layer have the relationship of Rp≧Rn, external quantum efficiency can be improved further by providing a p-type pedestal electrode having an extension conductor on the light transmitting p electrode. There are no limitations on the shape and direction of the extension conductor. In case the extension conductor has a shape of a straight line, this is preferable since an area of blocking light is reduced, but a mesh configuration may also be employed. For the shape, a curved line, grating, branched tree or hook may be employed as well as a straight line. Since a light blocking effect increases in proportion to a total area of a p-side pedestal electrode, it is desirable to design a wire width and length of the extension conductor so that a light blocking effect does not surpass a light emission enhancing effect.

(Lead Frame)

The lead frame 13 comprises the mount lead 13a and the inner lead 13b.

The mount lead 13a has the cup to house the light emitting element 10 placed therein. The mount lead 13a can be used as a common electrode for a plurality of light emitting elements 10 with the plurality of light emitting elements 10 being placed in the cup of the mount lead 13a. In this case, a sufficient level of electrical conductivity and connectivity with the electrically conductive wire 14 are required. The light emitting elements 10 and the cup of the mount lead 13a can be die-bonded by use of a thermosetting plastic or the like. For the thermosetting plastic, epoxy resin, acrylic resin, imide resin or the like may be used. An inorganic binder may also be used. For die-bonding and electrically connecting the light emitting elements 10 and the mount lead 13a with each other in such a configuration as the electrodes of the light emitting elements 10 and the lead electrodes are disposed to oppose and be connected with each other, Ag paste, carbon paste, metal bumps or the like may be used.

The inner lead 13b is to be electrically connected with the electrically conductive wire 14 to electrode 3 of the light emitting element 10 disposed on the mount lead 13a. In order to avoid short circuiting caused by electrical contact with the mount lead 13a, the inner lead 13b is disposed at a position separated from the mount lead 13a. In case a plurality of light emitting elements 10 are mounted on the mount lead 13a, it is necessary to make such an arrangement that makes it easy to perform wire bonding while preventing electrically conductive wires from touching each other. The inner lead 13b is preferably made of the same material as the mount lead 13a, and iron, copper, iron-containing copper, gold, platinum, silver or an alloy thereof may be used.

(Electrically Conductive Wire)

The electrically conductive wire 14 is used to electrically connect the electrode 3 of the light emitting element 10 and the lead frame 13. The electrically conductive wire 14 is preferably good in terms of ohmic contact with the electrode 3, mechanical connectivity, electrical conductivity and heat conductivity. The electrically conductive wire 14 is preferably made of a metal such as gold, copper, platinum or aluminum, or an alloy thereof.

(Molding Member)

The molding member 15 is provided for protecting the light emitting element 10, the fluorescent material 11, the coating member 12, lead frame 13 and the electrically conductive wire 14 from an environment. The molding member 15 also has, in addition to protection from the environment, such purposes as increasing an angle of view, mitigating directivity of light emitted by the light emitting element 10 and converging or diffusing this emitted light. The molding member 15 may be formed in such a shape that is favorable for these purposes. The molding member 15 may be formed, for example, in such a shape as a convex lens or concave lens, or in stacked structure of a plurality of layers. Specifically, the molding member 15 may be made of a material that has good temperature characteristics and high weatherability such as epoxy resin, urea resin and silicone resin, light-permeable inorganic material that is produced from metal alkoxide by sol-gel process, glass, inorganic binder or the like. The molding member 15 may include a diffusing agent, colorant, ultraviolet ray absorbing material or fluorescent material. For the diffusing agent, barium titanate, titanium oxide, aluminum oxide or the like is preferably used. The molding member 15 is preferably made of the same material as that of the coating member 12 in order to ensure affinity therewith and a favorable index of refraction.

Second Embodiment

The light emitting device according to a second embodiment of the present invention is a variation of the light emitting device according to the first embodiment where a blue light emitting element is used as a light emitting element and yttrium aluminum garnet fluorescent material (YAG fluorescent material) is used as a second fluorescent material. This embodiment is similar to the first embodiment in other respects.

The light emitting device of the second embodiment uses a blue light emitting element that emits blue light (for example, wavelength 460 nm) and at least two kinds of fluorescent material which are excited by the blue light and emit light of longer wavelengths, so as to generate light of desired color through blending of the blue light from the light emitting element and the light from the fluorescent materials.

The light emitting device according to the second embodiment of the present invention constituted as described above suppresses both variation in color of emitted light (color deviation) due to variation in a drive current of the light emitting element, and variation in the color of emitted light due to difference in a drive mode (particularly a difference between DC drive and pulse drive) to extremely low levels, since two or more kinds of fluorescent material are of the direct transition type similarly to the first embodiment.

Yttrium aluminum garnet fluorescent material (YAG fluorescent material) and other components will now be described in detail below.

The yttrium aluminum garnet fluorescent material (YAG fluorescent material) used in this embodiment collectively refers to all fluorescent materials having garnet structure that include a rare earth element such as Y and a Group III element such as Al, and are activated by at least one element selected from rare earth elements, so as to be excited by the blue light from the light emitting element 10 and emit light.

For the YAG fluorescent material, for example, $(Re_{1-x}Sm_x)_3(Al_{1-y}Ga_y)_5O_{12}$:Ce ($0 \leq x < 1$, $0 \leq y \leq 1$, wherein Re represents at least one kind of element selected from among Y, Gd and La) may be used.

The $(Re_{1-x}Sm_x)_3(Al_{1-y}Ga_y)_5O_{12}$:Ce fluorescent material is durable against heat, light and moisture and is particularly preferably used for an extended period of operation with high luminance, because of the garnet structure. It also allows to be set a peak wavelength of excitation spectrum at around 470 nm. A broad emission spectrum that has an emission peak around 530 nm and tails off to 720 nm can be obtained.

RGB components can be increased by mixing at least two kinds of $(Re_{1-x}Sm_x)_3(Al_{1-y}Ga_y)_5O_{12}$:Ce fluorescent material having different contents of Al, Ga, In, Y, La, Gd and Sm for the YAG fluorescent material. While some semiconductor light emitting elements are subject to variations in an emission wavelength, blended light of desired white-based color can be obtained by mixing at least two kinds of fluorescent material. Specifically, by combining fluorescent materials having different values of chromaticity to match an emission wavelength of the light emitting element, light of desired chromaticity can be emitted at any point on a chromaticity diagram in a region defined by points corresponding to the fluorescent materials and the light emitting element.

Aluminum garnet fluorescent material contains Al, at least one element selected from among Y, Lu, Sc, La, Gd, Tb, Eu and Sm, and at least one element selected from among Ga and In, and is activated with at least one element selected from among rare earth elements, so as to be excited by visible light or an ultraviolet ray and emit light.

An emission spectrum of this type of fluorescent material having a garnet structure shifts toward shorter wavelengths when part of Al is substituted by Ga, and shifts toward longer wavelengths when part of Y is substituted by Gd and/or La. In this way color of emitted light can be changed continuously by changing a composition. As a result, the fluorescent material has an ideal feature for converting light in the blue region emitted by a nitride semiconductor into white light, including continuously changing intensity of light of a longer wavelength by changing a proportion of Gd. When less than 20% of Y is substituted, a green component increases and a red component decreases, while the red component increases but luminance shows marked decrease when at least 80% of Y is substituted.

An excitation spectrum, too, of this type of fluorescent material having a garnet structure shifts toward shorter wavelengths when part of Al is substituted by Ga, and shifts toward longer wavelengths when part of Y is substituted by Gd and/or La. A peak emission wavelength of the excitation spectrum of the fluorescent material is preferably shorter than the peak wavelength of the emission spectrum of the light emitting element. With this constitution, since the peak wavelength of the excitation spectrum substantially agrees with the peak wavelength of the emission spectrum of the light emitting element, color deviation can be prevented from occurring without decreasing excitation efficiency of the fluorescent material, when a current supply to the light emitting element is increased.

Suitable fluorescent materials include, in addition to the YAG fluorescent material described above, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$, and those listed in Table 3. Among these, yttrium aluminum oxide fluorescent material that contains Y and is activated with Ce or Pr is particularly preferable. It is especially preferable to combine at least two kinds of fluorescent material having different compositions.

For example, yttrium aluminum oxide fluorescent material activated with cerium can emit light in a green or red region. The fluorescent material capable of emitting light in the green region is durable against heat, light and moisture and has a peak wavelength of excitation spectrum in a range from 420 nm to 470 nm, peak emission wavelength $\lambda p$ around 510 nm and has a broad emission spectrum that tails off to around 700 nm, due to the garnet structure. The fluorescent material capable of emitting light in the red region, which has a garnet structure, is durable against heat, light and moisture and has a peak wavelength of excitation spectrum in a range from 420 nm to 470 nm, emission peak wavelength $\lambda p$ around 600 nm and has a broad emission spectrum that tails off to around 750 nm.

Third Embodiment

In this embodiment, an excitation light source having a principal emission peak wavelength in a range from 250 nm to 500 nm is used, and at least two kinds of fluorescent material that are directly excited by the excitation light source containing oxynitride-based fluorescent material or nitride-based fluorescent material are used. This embodiment is similar to the first embodiment, except for a difference described below.

Both oxynitride-based fluorescent material and nitride-based fluorescent material can be of the direct excitation type. As a result, in this embodiment, too, variation in color of emitted light (color deviation) due to variation in a drive current of the light emitting element and variation in color of emitted light due to difference in a drive mode (particularly a difference between DC drive and pulse drive) can be suppressed to extremely low levels, by using at least two kinds of fluorescent material of the direct transition type similarly to the first embodiment.

Figure 3:
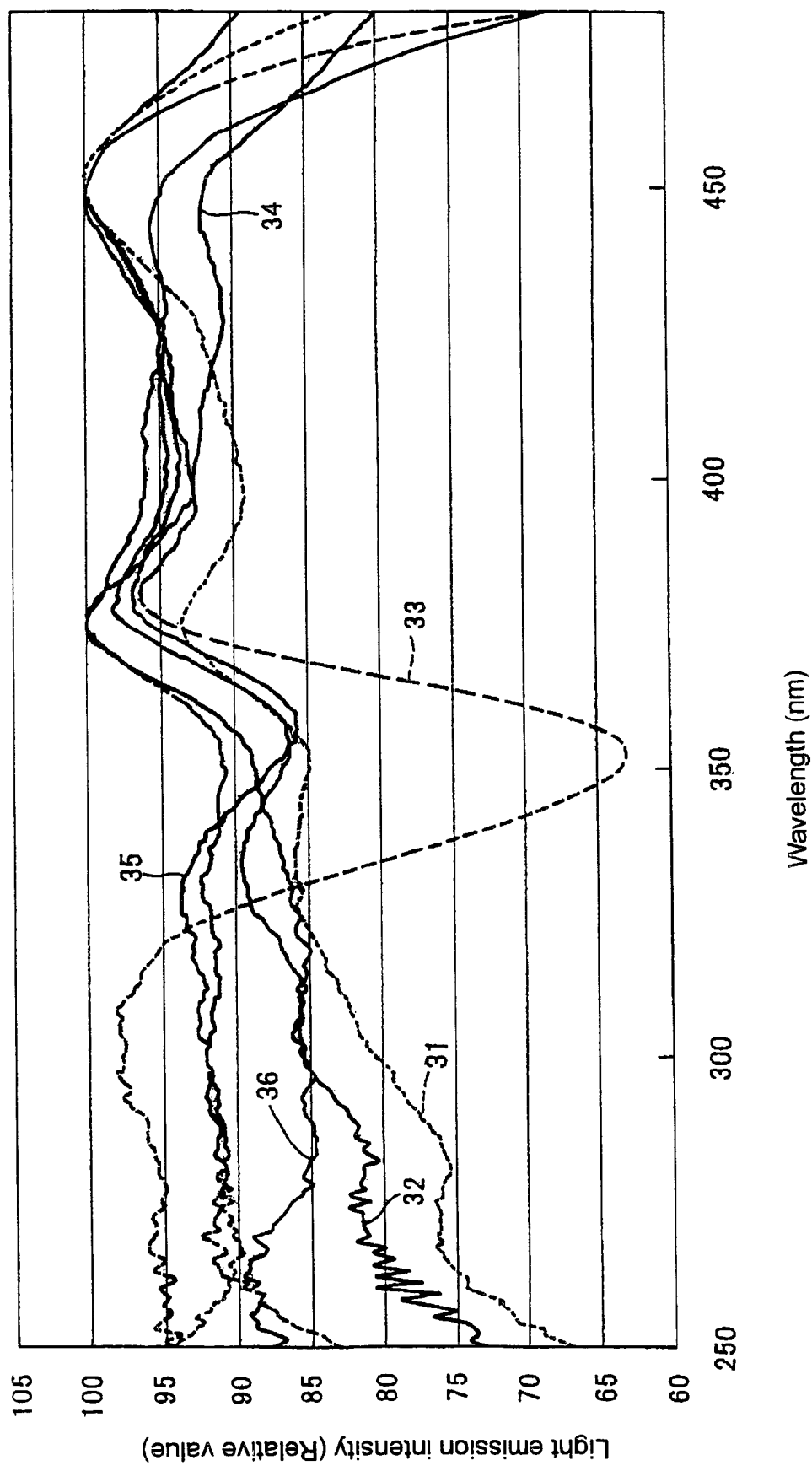
FIG. 3 shows normalized excitation spectra of oxynitride-based fluorescent material and nitride-based fluorescent material.

Excitation spectra of oxynitride-based fluorescent material and nitride-based fluorescent material are shown in FIG. 3. FIG. 3 shows normalized excitation spectra of oxynitride-based fluorescent material and nitride-based fluorescent material. In FIGS. 3, 31 to 33 denote spectra of oxynitride-based fluorescents and 34 to 36 denote spectra of nitride-based fluorescents. Specifically, 31 denotes $CaSi_2O_2N_2:Eu$, 32 denotes $SrSi_2O_2N_2:Eu$, 33 denotes $BaSi_2O_2N_2:Eu$, 34 denotes $Ca_2Si_5N_8:Eu$, 35 denotes $Sr_2Si_5N_8:Eu$, and 36 denotes $(Ca,Sr)_2Si_5N_8:Eu$. As can be seen from FIG. 3, both the oxynitride-based fluorescent material and the nitride-based fluorescent material can more efficiently convert a wavelength of light of a relatively long wavelength emitted by the excitation light source. Specifically, the oxynitride-based fluorescent material and the nitride-based fluorescent material can be directly excited in a wide wavelength from 250 nm to 500 nm. The expression that a fluorescent material can be directly excited by an excitation light source herein means that emission efficiency of the fluorescent material at a wavelength corresponding to a principal emission peak of the excitation light source is at least 60%. Specifically, if the intensity of the excitation spectrum at the principal emission peak wavelength of the excitation light source is not less than 60% of a maximum value of the excitation spectrum, fluorescent material can be directly excited by the excitation light source. The oxynitride-based fluorescent material and the nitride-based fluorescent material can be excited by using various light sources including an excitation light source that emits ultraviolet ray, a light emitting element that emits visible light of short wavelength and a light emitting element that emits blue light (420-490 nm).

Various light emitting elements having high performance can be made by making use of characteristics described above.

For example, when oxynitride-based fluorescent material or nitride-based fluorescent material is combined with a fluorescent material that emits light in the blue region (420-490 nm), excitation with blue light (420-490 nm) from other fluorescent material can be achieved in addition to direct excitation of the oxynitride-based fluorescent material or the nitride-based fluorescent material by use of the excitation light source. Thus, such a light emitting device can be provided that emits light over a wide range of color tones, by using a fluorescent material that emits light in the blue region (for example, alkaline earth metal halogen apatite fluorescent material, alkaline earth metal aluminate fluorescent material or the like) as an excitation light source so as to excite the oxynitride-based fluorescent material or nitride-based fluorescent material with the blue light. As the fluorescent material that emits light in the blue region, those used as the first fluorescent material in the first embodiment may be used.

It is preferable to excite phosphors with blue light emitting elements (main peak emission at 420-490 nm) as an excitation light source, the phosphors including:

(a) oxynitride-based fluorescent material or nitride-based fluorescent material and (b) at least one phosphor selected from the group consisting of $(M1_{1-a}Eu_a)_4Al_{14}O_{25}$ (M1 represents at least one element selected from among the group consisting of Mg, Ca, Ba, Sr and Zn, and a is a number satisfying $0.0001 \leq a \leq 0.5$), $M3_{1-a}Eu_aMg_{1-b}Mn_bAl_{10}O_{17}$ (M3 represents at least one element selected from among the group consisting of Ca, Ba, Sr and Zn, and a is a number satisfying $0.0001 \leq a \leq 0.5$ and b is a number satisfying $0.0001 \leq b \leq 0.5$), $M1_{1-a}Eu_aAl_2O_4$ (M1 represents at least one element selected from among the group consisting of Mg, Ca, Ba, Sr and Zn, and a is a number satisfying $0.0001 \leq a \leq 0.5$), $(Re_{1-x}Sm_x)_3(Al_{1-y}Ga_y)_5O_{12}$:Ce (Re represents at least one kind of element selected from among Y, Gd and La, x is a number satisfying $0 \leq x < 1$ and y is a number satisfying $0 \leq y \leq 1$) and $MGa_2S_4$:Eu (M is at least one kind selected from among Sr, Ca, Ba, Mg and Zn; X is at least one kind selected from among F, Cl, Br and I).

By constructing a light emitting device with these fluorescent materials and a light source, a light emitting device with superior temperature characteristics and excitation efficiency is provided. Also, this device shows a reduced color deviation even if a driving current density of a light emitting element varies. Further, a life property is also improved.

It is more preferable to excite phosphors with blue light emitting elements (main peak emission at 420-490 nm) as an excitation light source, the phosphors including:

(a) oxynitride-based fluorescent material, and (b) $(Re_{1-x}Sm_x)_3(Al_{1-y}Ga_y)_5O_{12}$:Ce (Re represents at least one kind of element selected from among Y, Gd and La, x is a number satisfying $0 \leq x < 1$ and y is a number satisfying $0 \leq y \leq 1$). This provides a white light emitting device with high luminous intensity and high color rendering.

It is also preferable to excite phosphors with a light source emitting light from near ultraviolet to visible light of short wavelength (300-420 nm), the phosphors including:

(a) oxynitride-based fluorescent material or nitride-based fluorescent material, and (b) at least one phosphor selected from the group consisting of $(M1_{1-a}Eu_a)_{10}(PO_4)_6Q_2$ (M1 represents at least one element selected from among Mg, Ca, Ba, Sr and Zn, Q represents at least one element selected from among F, Cl, Br and I, and a is a number satisfying $0.0001 \leq a \leq 0.5$), $(M1_{1-a}Eu_a)_2B_5O_9Q$ (M1 represents at least one element selected from among Mg, Ca, Ba, Sr and Zn, Q represents at least one element selected from among F, Cl, Br and I, and a is a number satisfying $0.0001 \leq a \leq 0.5$), $M3_{1-a}Eu_aMgAl_{10}O_{17}$ (M3 represents at least one element selected from among the group consisting of Ca, Ba, Sr and Zn, and a is a number satisfying $0.0001 \leq a \leq 0.5$), $(M1_{1-a}Eu_a)_4Al_{14}O_{25}$ (M1 represents at least one element selected from among Mg, Ca, Ba, Sr and Zn, and a is a number satisfying $0.0001 \leq a \leq 0.5$, $M3_{1-a}Eu_aMg_{1-b}Mn_bAl_{10}O_{17}$ (M3 represents at least one element selected from among the group consisting of Ca, Ba, Sr and Zn, and a is a number satisfying $0.0001 \leq a \leq 0.5$, $M1_{1-a}Eu_aAl_2O_4$ (M1 represents at least one element selected from among Mg, Ca, Ba, Sr and Zn, and a is a number satisfying $0.0001 \leq a \leq 0.5$), $(Re_{1-x}Sm_x)_3(Al_{1-y}Ga_y)_5O_{12}$:Ce (Re represents at least one kind of element selected from among Y, Gd and La, x is a number satisfying $0 \leq x < 1$ and y is a number satisfying $0 \leq y \leq 1$), and $MGa_2S_4$:Eu (M is at least one kind selected from among Sr, Ca, Ba, Mg and Zn; X is at least one kind selected from among F, Cl, Br and I).

By constructing a light emitting device with these fluorescent materials and a light source, a light emitting device with superior temperature characteristics and excitation efficiency is provided. Also, this device shows a reduced color deviation even if a driving current density of the light emitting element varies. Further, as color deviation caused by wavelength deviation of the light emitting element can be reduced, the light emitting device can be manufactured with a high yield.

It is more preferable to excite phosphors with a light source emitting light from near ultraviolet to visible light of short wavelength (300-420 nm), the phosphors including:

(a) oxynitride-based fluorescent material, and (b) at least one phosphor selected from the group consisting of $(M1_{1-a}Eu_a)_{10}(PO_4)_6Q_2$ (M1 represents at least one element selected from among Mg, Ca, Ba, Sr and Zn, Q represents at least one element selected from among F, Cl, Br and I, and a is a number satisfying $0.0001 \leq a \leq 0.5$), $(M1_{1-a}Eu_a)_2B_5O_9Q$ (M1 represents at least one element selected from among Mg, Ca, Ba, Sr and Zn, Q represents at least one element selected from among F, Cl, Br and I, and a is a number satisfying $0.0001 \leq a \leq 0.5$), $M3_{1-a}Eu_aMgAl_{10}O_{17}$ (M3 represents at least one element selected from among the group consisting of Ca, Ba, Sr and Zn, and a is a number satisfying $0.0001 \leq a \leq 0.5$), $(M1_{1-a}Eu_a)_4Al_{14}O_{25}$ (M1 represents at least one element selected from among Mg, Ca, Ba, Sr and Zn, and a is a number satisfying $0.0001 \leq a \leq 0.5$, $M3_{1-a}Eu_aMg_{1-b}Mn_bAl_{10}O_{17}$ (M3 represents at least one element selected from among the group consisting of Ca, Ba, Sr and Zn, and a is a number satisfying $0.0001 \leq a \leq 0.5$) and $M1_{1-a}Eu_aAl_2O_4$ (M1 represents at least one element selected from among Mg, Ca, Ba, Sr and Zn, and a is a number satisfying $0.0001 \leq a \leq 0.5$). This provides a white light emitting device with high luminous intensity and high color rendering.

With such a constitution as described above, a light emitting diode capable of emitting a wide range of color with high luminance can be made, so that a light emitting device that allows to be controlled a color tone very easily and is excellent in terms of mass productivity and reliability can be provided.

A light emitting device of high efficiency multi-color emission can be made by combining oxynitride-based fluorescent material or nitride-based fluorescent material that is directly excited by an excitation light source and by another fluorescent material that is directly excited by the excitation light source. For example, a light emitting device that emits light over a wide range of color tones can be provided by using oxynitride-based fluorescent material, nitride-based fluorescent material, alkaline earth metal halogen apatite fluorescent material activated mainly with a lanthanoid element such as Eu or a transition metal element such as Mn, alkaline earth metal boric acid halide salt fluorescent material, alkaline earth silicate, rare earth oxysulfide, alkaline earth sulfide, alkaline earth thiogallate, alkaline earth silicon nitride, germanate, rare earth aluminate or rare earth silicate activated mainly with a lanthanoid element such as Ce or organic material and an organic complex activated mainly with a lanthanoid element such as Eu.

Figure 4:
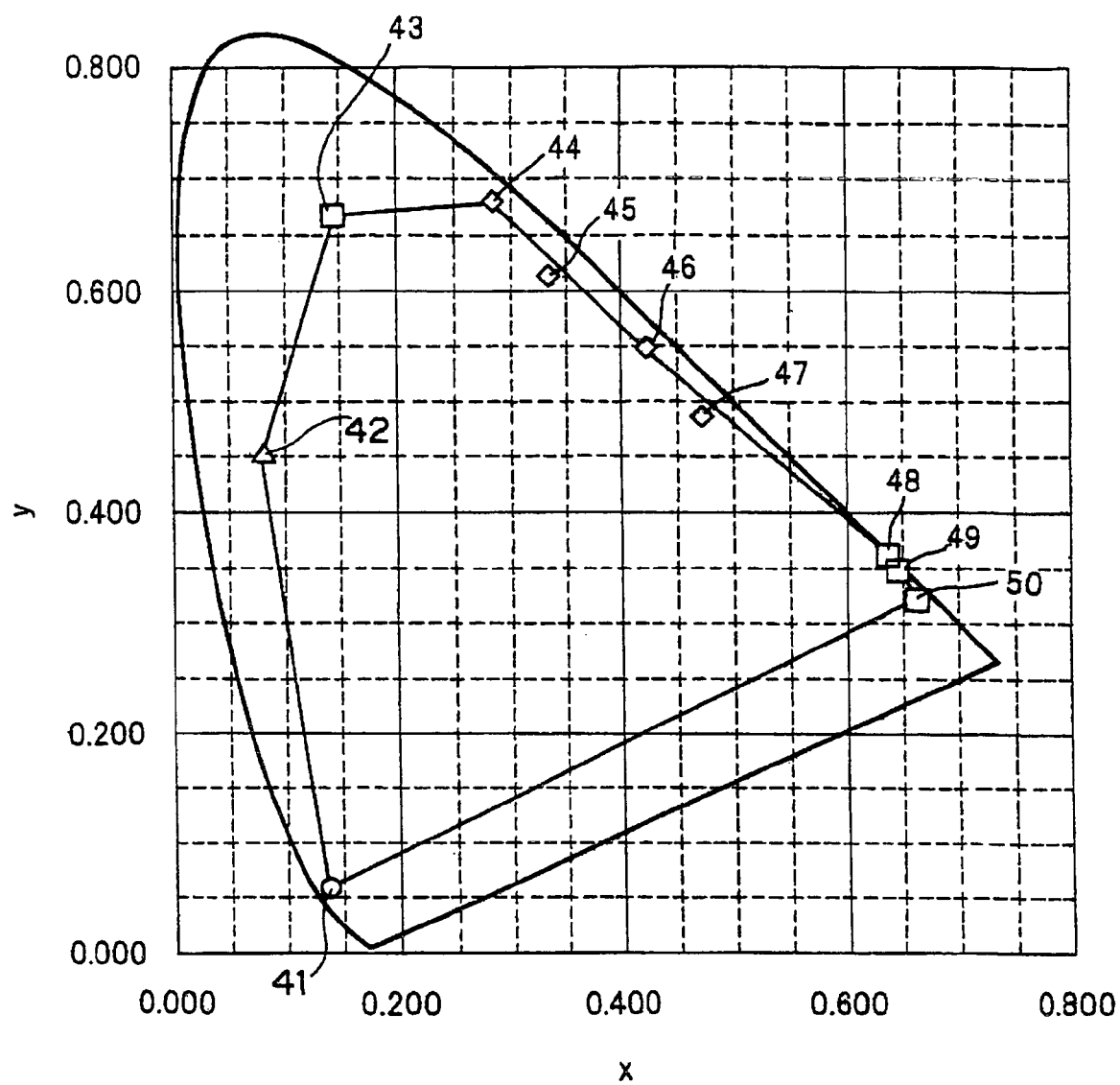
FIG. 4 is a CIE chromaticity diagram showing a range of color tones that can be achieved by using an excitation source which emits an ultraviolet ray.
Figure 5:
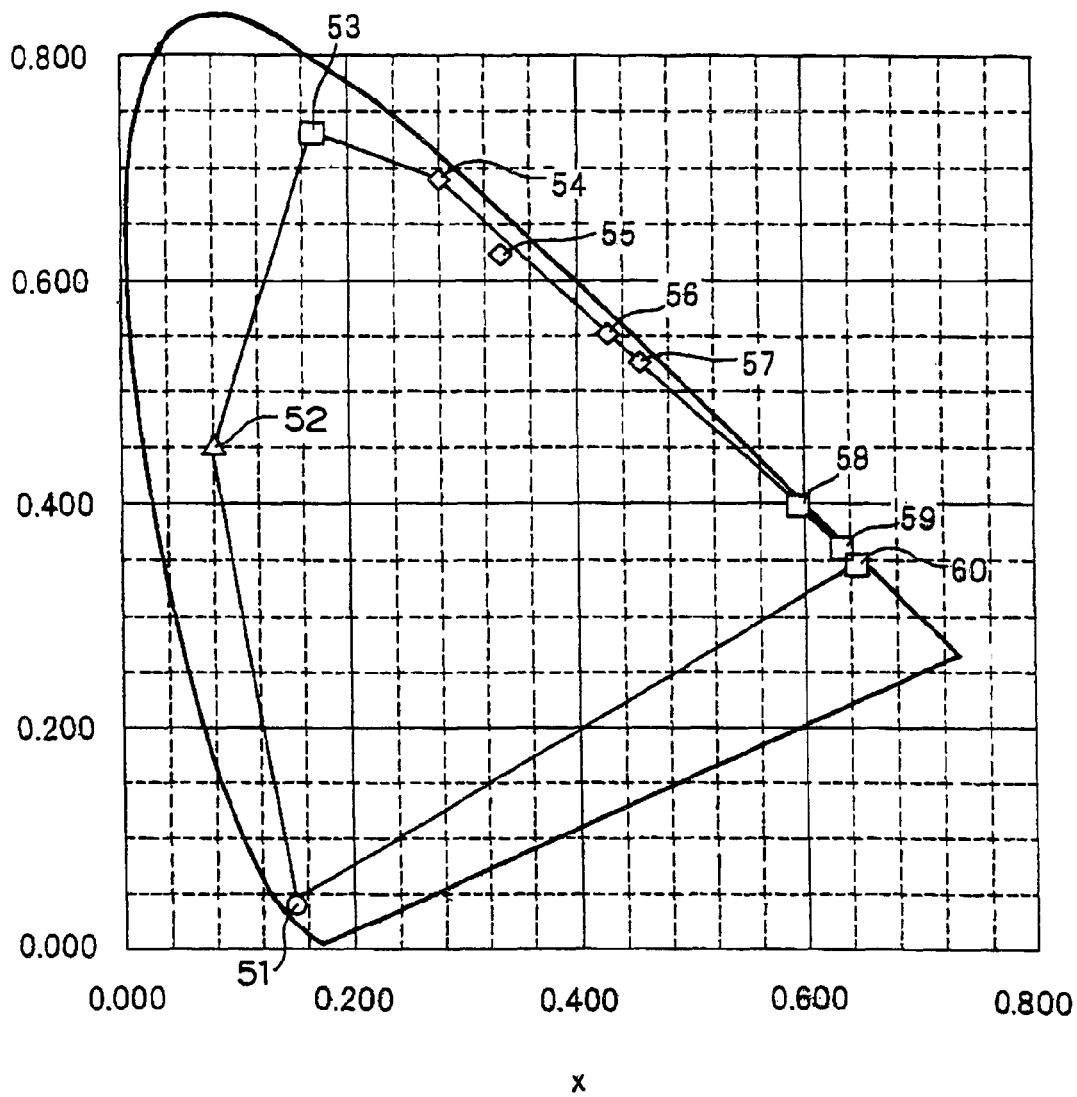
FIG. 5 is a CIE chromaticity diagram showing a range of color tones that can be achieved by using an excitation light source which emits blue light.

FIG. 4 is a CIE chromaticity diagram showing a region of color tones that can be achieved by using an excitation source which emits an ultraviolet ray. In FIG. 4, 41 denotes $Ca_{10}(PO_4)_6Cl_2$:Eu, 42 denotes $BaSi_2O_2N_2$:Eu, 43 denotes $BaMgAl_{10}O_{17}$:Eu,Mn, 44 denotes $SrGa_2S_4$:Eu, 45 denotes $SrSi_2O_2N_2$:Eu, 46 denotes $CaSi_2O_2N_2$:Eu, 47 denotes $(Y,Gd)_3Al_5O_{12}$:Ce, 48 denotes $Sr_2Si_5N_8$:Eu, 49 denotes $Ca_2Si_5N_8$:Eu, 50 denotes $(Sr,Ca)_2Si_5N_8$:Eu. FIG. 5 is a CIE chromaticity diagram showing a region of color tones that can be achieved by using an excitation source which emits blue light (420-490 nm). In FIG. 5, 51 denotes a light of λ=460 nm, 52 denotes $BaSi_2O_2N_2$:Eu, 53 denotes $BaMgAl_{10}O_{17}$:Eu, Mn, 54 denotes $SrGa_2S_4$:Eu, 55 denotes $SrSi_2O_2N_2$:Eu, 56 denotes $CaSi_2O_2N_2$:Eu, 57 denotes $(Y,Gd)_3Al_5O_{12}$:Ce, 58 denotes $Ca_2Si_5N_8$:Eu, 59 denotes $Sr_2Si_5N_8$:Eu, and 60 denotes $(Sr,Ca)_2Si_5N_8$:Eu.

As shown in FIG. 4, in case an excitation light source having a principal emission peak at around 400 nm in the ultraviolet region is used, a possible range of color reproduction is expanded by using at least two kinds of fluorescent material having peak emission wavelengths in the visible light region. Fluorescent material 11 is directly excited by light from the excitation light source. In case an excitation light source that emits an ultraviolet ray is used, since the excitation light source is difficult or impossible to visually recognize, color of emitted light can be determined only by color of the fluorescent material 11. Thus, it is preferable to adjust mix proportions of the fluorescent materials in order to obtain light emission of a desired color tone. Table 1 shows chromaticity values of fluorescent materials when an excitation light source having a principal emission peak at about 400 nm is used.

TABLE 1

|  | x | y |
|---|---|---|
| CaSi2O2N2:Eu | 0.422 | 0.549 |
| SrSi2O2N2:Eu | 0.333 | 0.614 |
| BaSi2O2N2:Eu | 0.081 | 0.453 |
| Ca2Si5N8:Eu | 0.646 | 0.346 |
| Sr2Si5N8:Eu | 0.638 | 0.361 |
| (Sr, Ca) 2Si5N8:Eu | 0.663 | 0.321 |
| Ca10 (PO4) 6Cl2:Eu | 0.138 | 0.059 |
| BaMgAl10O17:Eu, Mn | 0.145 | 0.666 |
| SrGa2S4:Eu | 0.283 | 0.680 |
| BaGa2S4:Eu | 0.143 | 0.517 |
| (Y, Gd) 3Al5O12:Ce | 0.472 | 0.486 |

As shown in FIG. 5, when an excitation light source that emits light in the blue region with a principal emission peak at about 460 nm is used, fluorescent material that emits light in blue region becomes unnecessary and a tedious process of mixing fluorescent materials in predetermined proportions can be omitted. Table 2 shows chromaticity values of fluorescent materials when an excitation light source having a principal emission peak at about 460 nm is used.

TABLE 2

|  | x | y |
|---|---|---|
| CaSi2O2N2:Eu | 0.427 | 0.551 |
| SrSi2O2N2:Eu | 0.334 | 0.623 |

TABLE 2-continued

|  | x | y |
|---|---|---|
| BaSi2O2N2:Eu | 0.081 | 0.453 |
| Ca2Si5N8:Eu | 0.595 | 0.399 |
| Sr2Si5NB:Eu | 0.632 | 0.361 |
| (Sr, Ca) 2Si5N8:Eu | 0.646 | 0.346 |
| BaMgAl10O17:Eu, Mn | 0.169 | 0.731 |
| SrGa2S4:Eu | 0.279 | 0.690 |
| (Y, Gd) 3Al5O12:Ce | 0.456 | 0.527 |

Figure 6:
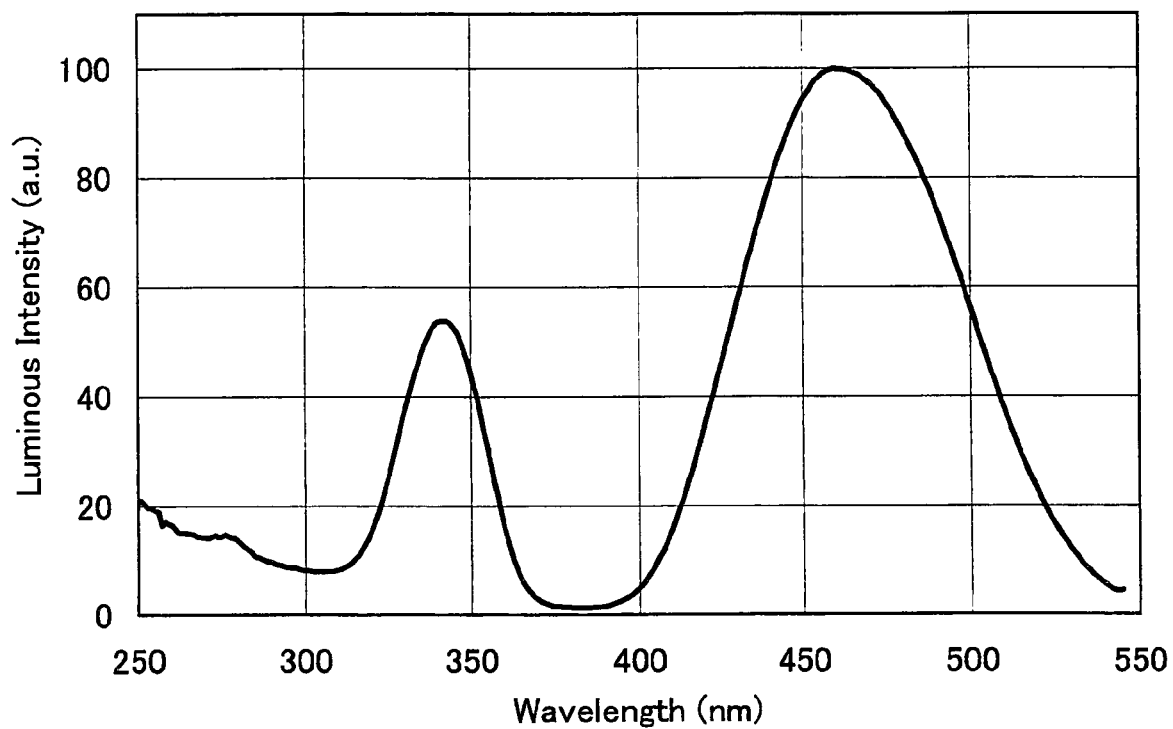
FIG. 6 shows a normalized excitation spectrum of YAG fluorescent material.

FIG. 6 shows an excitation spectrum of YAG fluorescent material that has been used in the conventional light emitting devices, for comparison with oxynitride-based fluorescent material or nitride-based fluorescent material. As shown in FIG. 6, the YAG fluorescent material has maximum emission efficiency at around 460 nm, and can convert blue light from the excitation light source to light in a yellow-green to yellow region with high efficiency. In the ultraviolet region from 370 nm to 400 nm, in contrast, emission efficiency is as low as less than 10% that of around 460 nm and most of an incident ultraviolet ray is reflected. As a result, light emission can hardly be achieved with the excitation light source that emits an ultraviolet ray and the YAG fluorescent material only.

Figure 7:
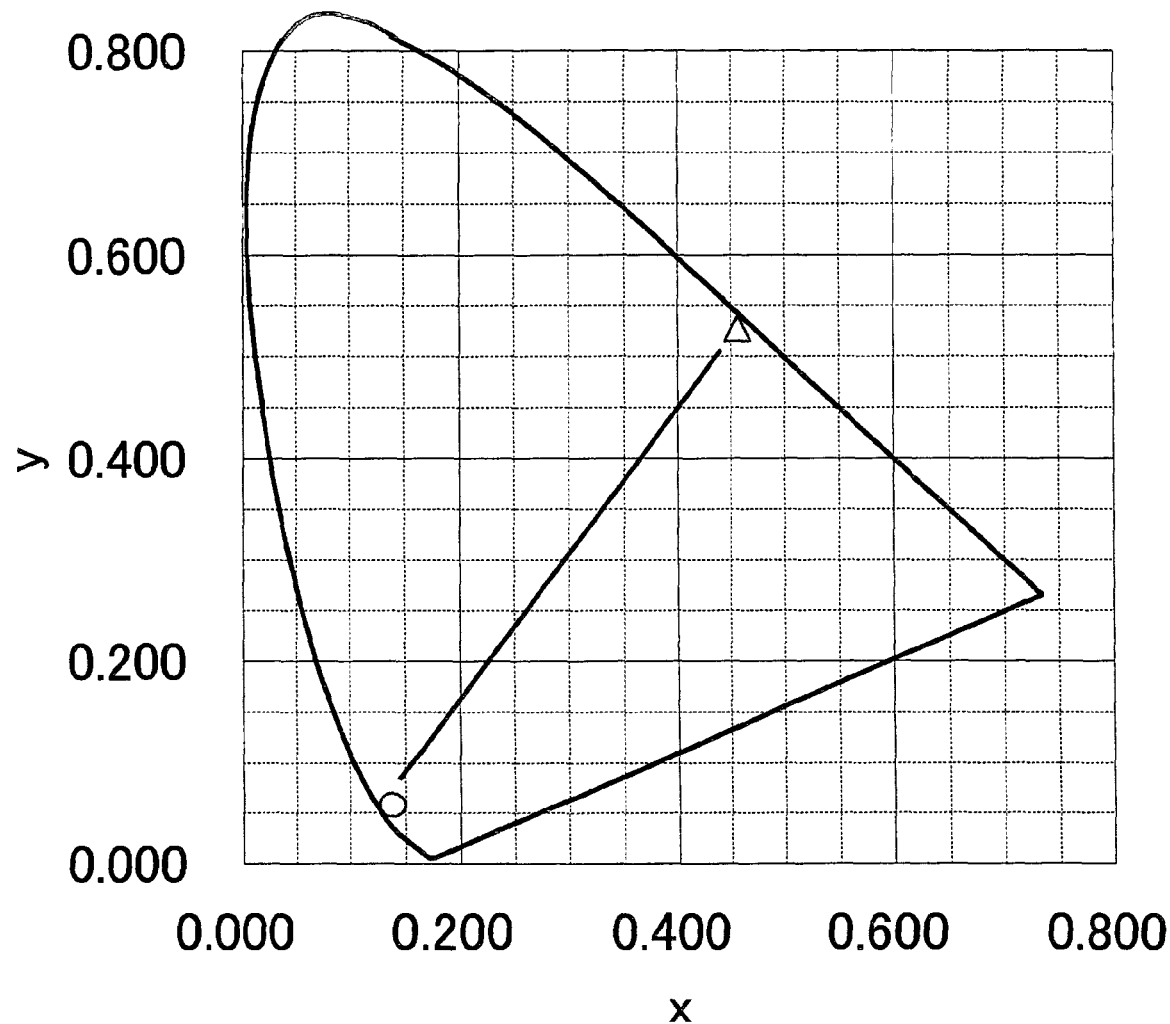
FIG. 7 is a CIE chromaticity diagram showing a range of color tones that can be achieved with a light emitting device having a blue light emitting element and one kind of YAG fluorescent material.

FIG. 7 is a CIE chromaticity diagram showing a region of color tones that can be achieved with a light emitting device which combines only a blue light emitting element and one kind of YAG fluorescent material. This is a light emitting device of the prior art that emits white light. Since this light emitting device generates white light by use of a fluorescent material that is excited by an ultraviolet ray and emits blue light, and YAG fluorescent material that is excited by the blue light and emits yellow light, color tones can be generated that lie on a straight line connecting blue and yellow on the chromaticity diagram. Therefore, it has been impossible to provide a light emitting device that emits light with multiple colors.

Now, fluorescent materials used in this embodiment will be described in detail below.

(Fluorescent Material)

At least two kinds of directly excited fluorescent material containing oxynitride-based fluorescent material or nitride-based fluorescent material are used as the fluorescent material 11. The expression that a fluorescent material is directly excited means that it is excited mainly by light from an excitation light source and, in case an excitation light source that has a principal emission peak in the ultraviolet region is used, efficiency of light emission is at least 60% of a maximum value in the visible region. That a fluorescent material is not directly excited, on the other hand, means that it is hardly excited by light from the excitation light source but is excited by primary light from other fluorescent material that is excited by light from the excitation light source.

<Oxynitride-Based Fluorescent Material>

For the oxynitride-based fluorescent material, it is preferable to use alkaline earth metal oxynitride fluorescent material and it is more preferable to use alkaline earth metal silicon oxynitride fluorescent material. The alkaline earth metal oxynitride fluorescent material contains at least one Group II element selected from the group consisting of Be, Mg, Ca, Sr, Ba and Zn, at least one Group IV element selected from the group consisting of C, Si, Ge, Sn, Ti, Zr and Hf, and a rare earth element as activator R, and has a crystal structure. Although these elements may be included in any combination, it is preferable that the oxynitride-based fluorescent material has such a composition as represented by a general formula $L_XM_YO_ZN_{(2/3)X+(4/3)Y-(2/3)Z}$:R or $L_XM_YQ_TO_Z N_{(2/3)X+(4/3)Y+T-(2/3)Z}$:R. L is at least one Group II element selected from the group consisting of Be, Mg, Ca, Sr, Ba and Zn. M is at least one Group IV element selected from the group consisting of C, Si, Ge, Sn, Ti, Zr and Hf. Q is at least one Group III element selected from the group consisting of B, Al, Ga and In. O is oxygen, N is nitrogen, and R is a rare earth element. Ranges of parameters are $0.5<X<1.5$, $1.5<Y<2.5$, $0<T<0.5$ and $1.5<Z<2.5$. High luminance is achieved when X, Y and Z are in the ranges above. Oxynitride-based fluorescent material of the general formula described above, wherein X=1, Y=2 and Z=2, shows high luminance and is particularly preferable.

Composition is not limited to that described above, and any composition may be used.

Specifically, there can be used oxynitride-based fluorescent materials represented by $CaSi_2O_2N_2$:Eu, $SrSi_2O_2N_2$:Eu, $BaSi_2O_2N_2$:Eu, $ZnSi_2O_2N_2$:Eu, $CaGe_2O_2N_2$:Eu, $SrGe_2O_2N_2$:Eu, $BaGe_2O_2N_2$:Eu, $ZnGe_2O_2N_2$:Eu, $Ca_{0.5}Sr_{0.5}Si_2O_2N_2$:Eu, $Ca_{0.5}Ba_{0.5}Si_2O_2N_2$:Eu, $Ca_{0.5}Zn_{0.5}Si_2O_2N_2$:Eu, $Ca_{0.5}Be_{0.5}Si_2O_2N_2$:Eu, $Sr_{0.5}Ba_{0.5}Si_2O_2N_2$:Eu, $Ca_{0.8}Mg_{0.2}Si_2O_2N_2$:Eu, $Sr_{0.8}Mg_{0.2}Si_2O_2N_2$:Eu, $Ca_{0.5}Mg_{0.5}Si_2O_2N_2$:Eu, $Sr_{0.5}Mg_{0.5}Si_2O_2N_2$:Eu, $CaSi_2B_{0.1}O_2N_2$:Eu, $SrSi_2B_{0.1}O_2N_2$:Eu, $BaSi_2B_{0.1}O_2N_2$:Eu, $ZnSi_2B_{0.1}O_2N_2$:Eu, $CaGe_2B_{0.01}O_2N_2$:Eu, $SrGe_2Ga_{0.01}O_2N_2$:Eu, $BaGe_2In_{0.01}O_2N_2$:Eu, $ZnGe_2Al_{0.05}O_2N_2$:Eu, $Ca_{0.5}Sr_{0.5}Si_2B_{0.3}O_2N_2$:Eu, $CaSi_{2.5}O_{1.5}N_3$:Eu, $SrSi_{2.5}O_{1.5}N_3$:Eu, $BaSi_{2.5}O_{1.5}N_3$:Eu, $Ca_{0.5}Ba_{0.5}Si_{2.5}O_{1.5}N_3$:Eu, $Ca_{0.5}Sr_{0.5}Si_{2.5}O_{1.5}N_3$:Eu, $Ca_{1.5}Si_{2.5}O_{2.5}N_{2.7}$:Eu, $Sr_{1.5}Si_{2.5}O_{2.5}N_{2.7}$:Eu, $Ba_{1.5}Si_{2.5}O_{2.5}N_{2.7}$:Eu, $Ca_{1.0}Ba_{0.5}Si_{2.5}O_{1.5}N_3$:Eu, $Ca_{1.0}Sr_{0.5}Si_{2.5}O_{1.5}N_3$:Eu, $Ca_{0.5}Si_{1.5}O_{1.5}N_{1.7}$:Eu, $Sr_{0.5}Si_{1.5}O_{1.5}N_{1.7}$:Eu, $Ba_{0.5}Si_{1.5}O_{1.5}N_{1.7}$:Eu, $Ca_{0.3}Ba_{0.2}Si_{2.5}O_{1.5}N_3$:Eu and $Ca_{0.2}Sr_{0.3}Si_{2.5}O_{1.5}N_3$:Eu.

Color tone and luminance of oxynitride-based fluorescent material can be controlled by changing proportions of O and N. An emission spectrum and intensity can also be controlled by changing a molar ratio of anion and cation (L+M)/(O+N). This can be achieved, for example, through desorption of N or O in vacuum, but is not limited to this method. The oxynitride-based fluorescent material may also include at least one element selected from Li, Na, K, Rb, Cs, Mn, Re, Cu, Ag and Au. Emission efficiency such as quantum efficiency can be controlled by adding these elements. Other elements may also be included to such an extent that does not affect this property.

Part of the Group II elements included in the oxynitride-based fluorescent material is substituted with the activator R. A molar ratio of the group II element plus activator R, and the activator R, is preferably such that (sum of Group II element and activator R):(the activator R)=1:0.001-1:0.8. Denoting a molar number of the Group II element included in one mole of oxynitride-based fluorescent material as A and a molar number of the activator R as B, the molar ratio of the Group II element plus activator R and the activator R is given as (A+B): B.

L is at least one Group II element selected from the group consisting of Mg, Ca, Sr, Ba and Zn or another element may be used individually, or the elements may be used in various combinations such as Ca and Sr, Ca and Ba, Sr and Ba, or Ca and Mg. Proportions of mixture of Sr and Ca can be changed as required. It is particularly preferable that L is at least one Group II element selected from the group consisting of Mg, Ca, Sr, Ba and Zn, and contains one of Ca, Sr and Ba as essential component.

M is at least one Group IV element selected from the group consisting of C, Si, Ge, Sn, Ti, Zr and Hf. Si, Ge or another element may be used individually, or the elements may be used in various combinations such as Si and Ge, Si and C. In this way, low cost fluorescent material having high crystallinity can be obtained. It is preferable that M is at least one Group IV element selected from the group consisting of C, Si, Ge, Sn, Ti, Zr and Hf, and contains Si as essential component.

The activator R is preferably a rare earth element. Specifically, R is Sc, Y, La, Ce, Pr, Nd, Sm, Eu, Gd, Tb, Dy, Ho, Er, Tm, Yb or Lu. Among these, R is preferably La, Ce, Pr, Nd, Sm, Eu, Gd, Tb, Dy, Ho, Er, Tm, Yb or Lr. Among these rare earth elements, Eu is particularly preferable. A mixture that contains Eu and at least one element selected from rare earth elements may also be used. The activator R is preferably at least two kinds selected from rare earth elements Sc, Y, La, Ce, Pr, Nd, Sm, Eu, Gd, Tb, Dy, Ho, Er, Tm, Yb and Lu, and contains Eu as an essential component. Elements other than Eu act as a co-activator. R preferably contains at least 70% by weight, more preferably at least 50% by weight of Eu.

It is preferable that a luminescence center contains europium Eu which is a rare earth element. Though description in this specification deals mainly with cases of using Eu, the present invention is not limited to this constitution, and co-activation with Eu may also be used. Europium has main energy levels, divalent and trivalent. $Eu^{2+}$ is used as an activator for the fluorescent material based on alkali earth metal silicon nitrate. $Eu^{2+}$ is easily oxidized and is commercialized in the trivalent form of $Eu_2O_3$.

Particularly the activator R preferably comprises Eu as a first activator and at least one element selected from the group consisting of Y, Ce, Nd, Sm, Gd, Tb, Dy, Er, Tm, Yb and Lu as a second activator. It is more preferable that the activator R comprises Eu as the first activator and at least one element selected from the group consisting of Dy, Tm and Yb as the second activator. The second activator has an effect of accelerating growth of particles as well as an activating effect, and therefore improves luminance of light emission.

Part of the Group II elements included in the oxynitride-based fluorescent material is substituted with the first activator and the second activator. Proportion of the second activator is preferably in a range from 0.0005 to 0.1 in molar ratio to a sum of the Group II elements, the first activator and the second activator. That is, (sum of Group II elements, first activator $R_1$ and second activator $R_2$):(second activator $R_2$)=1:0.0005-1:0.1. In case the second activator is Yb, in particular, a molar ratio of the second activator to the sum of the Group II elements, the first activator and Yb is preferably in a range from 0.001 to 0.05. In case the second activator is Tm, a molar ratio of the second activator to the sum of the Group II elements, the first activator and Tm is preferably in a range from 0.001 to 0.05. In case the second activator is Dy, a molar ratio of the second activator to the sum of the Group II elements, the first activator and Dy is preferably in a range from 0.001 to 0.06.

Major components L and M of a base material may be provided in the form of a compound thereof. Metals, oxides, imides, amides, nitrides or various salts may be used as L and M. Alternatively, elements of the major components L and M may be mixed in advance and used.

Q is at least one Group III element selected from the group consisting of B, Al, Ga and In. Q may also be provided in the form of metal, oxide, imide, amide, nitride or various salts, such as $B_2O_6$, $H_3BO_3$, $Al_2O_3$, $Al(NO_3)_3 \cdot 9H_2O$, AlN, $GaCl_3$, and $InCl_3$.

Concentration of C is preferably higher than 0 ppm, more preferably at least 5 ppm and most preferably at least 10 ppm, while being preferably at most 500 ppm, more preferably at most 300 ppm and most preferably at most 200 ppm. Too high a content of C decreases luminance of light emission and insufficient content of C leads to longer afterglow.

Oxynitride-based fluorescent material will now be described below by way of specific examples.

[$SrSi_2O_2N_2$:Eu]

Examples of oxynitride-based fluorescent material using $SrSi_2O_2N_2$:Eu will be described. Table 3 and Table 4 show light emission characteristics of $SrSi_2O_2N_2$:Eu of various proportions of Eu.

Nitride of L, nitride of M and oxide of M are mixed as the base material. Oxide of Eu is mixed as an activator with the base material. Predetermined quantities of these components are metered and mixed to make a uniform mixture. Nitride of L, nitride of M and oxide of M to make the base material are preferably mixed in molar ratios of 0.25<nitride of L<1.75 (more preferably 0.5<nitride of L<1.5), 0.25<nitride of M<1.75 and 2.25<oxide of M<3.75. Predetermined quantities of these components are metered and mixed so that the composition of $L_XM_YO_ZN_{((2/3)X+(4/3)Y-(2/3)Z-\alpha)}$:R or $L_XM_YQ_TO_ZN_{((2/3)X+(4/3)Y+T-(2/3)Z-\alpha)}$:R is obtained.

The oxynitride-based fluorescent material preferably contains a trace of B and/or C. This enables duration of afterglow of the oxynitride-based fluorescent material to be reduced. Concentration of B is preferably higher than 0 ppm, more preferably at least 5 ppm and most preferably at least 10 ppm, while being preferably at most 1000 ppm, more preferably at most 500 ppm and most preferably at most 400 ppm. Too high a content of B decreases luminance of light emission and insufficient content of B leads to longer afterglow.

TABLE 3

| | | Ex = 400 nm | | | | |
|---|---|---|---|---|---|---|
| | Proportion of Eu x | Color tone x | Color tone y | Emission luminance Y (%) | Energy efficiency E (%) | Quantum efficiency Q (%) |
| Example 1 | 0.01 | 0.333 | 0.614 | 81.0 | 81.7 | 81.0 |
| Example 2 | 0.015 | 0.340 | 0.612 | 87.2 | 87.8 | 87.3 |
| Example 3 | 0.02 | 0.341 | 0.612 | 95.1 | 95.5 | 94.9 |
| Example 4 | 0.025 | 0.345 | 0.609 | 97.3 | 97.5 | 96.9 |
| Example 5 | 0.03 | 0.349 | 0.608 | 97.7 | 98.1 | 97.9 |
| Example 6 | 0.035 | 0.356 | 0.604 | 100.0 | 100.0 | 100.0 |
| Example 7 | 0.04 | 0.356 | 0.604 | 97.9 | 98.4 | 98.5 |
| Example 8 | 0.045 | 0.363 | 0.600 | 97.4 | 97.7 | 97.9 |
| Example 9 | 0.05 | 0.367 | 0.598 | 95.4 | 95.8 | 96.2 |
| Example 10 | 0.07 | 0.378 | 0.590 | 89.0 | 90.1 | 91.2 |
| Example 11 | 0.08 | 0.387 | 0.584 | 89.6 | 91.1 | 92.4 |
| Example 12 | 0.1 | 0.394 | 0.579 | 87.3 | 89.5 | 91.4 |
| Example 13 | 0.12 | 0.405 | 0.571 | 85.5 | 88.1 | 90.4 |
| Example 14 | 0.14 | 0.416 | 0.562 | 84.8 | 88.8 | 91.5 |
| Example 15 | 0.16 | 0.422 | 0.558 | 84.8 | 89.5 | 92.4 |
| Example 16 | 0.18 | 0.425 | 0.556 | 79.9 | 84.3 | 87.0 |
| Example 17 | 0.2 | 0.430 | 0.552 | 72.5 | 76.5 | 79.5 |
| Example 18 | 0.22 | 0.438 | 0.546 | 71.7 | 76.3 | 79.5 |
| Example 19 | 0.24 | 0.442 | 0.543 | 68.8 | 73.7 | 77.0 |
| Example 20 | 0.26 | 0.446 | 0.539 | 61.1 | 66.2 | 69.2 |
| Example 21 | 0.28 | 0.450 | 0.536 | 57.7 | 62.9 | 66.1 |
| Example 22 | 0.3 | 0.449 | 0.537 | 48.3 | 52.9 | 55.4 |
| Example 23 | 0.4 | 0.462 | 0.526 | 38.6 | 43.4 | 45.9 |
| Example 24 | 0.5 | 0.471 | 0.519 | 31.0 | 35.7 | 38.0 |
| Example 25 | 0.6 | 0.476 | 0.514 | 23.0 | 26.9 | 28.7 |
| Example 26 | 0.7 | 0.482 | 0.508 | 16.6 | 20.2 | 21.8 |

TABLE 4

|  | Ex = 460 nm | | | | |
| --- | --- | --- | --- | --- | --- |
|  | Proportion of Eu x | Color tone x | Color tone y | Emission luminance Y (%) | Energy efficiency E (%) | Quantum efficiency Q (%) |
| Example 1 | 0.01 | 0.334 | 0.623 | 59.6 | 57.4 | 55.0 |
| Example 2 | 0.015 | 0.339 | 0.620 | 67.0 | 64.6 | 62.2 |
| Example 3 | 0.02 | 0.340 | 0.621 | 81.5 | 78.0 | 75.0 |
| Example 4 | 0.025 | 0.343 | 0.618 | 83.2 | 79.8 | 77.0 |
| Example 5 | 0.03 | 0.347 | 0.616 | 84.3 | 81.0 | 78.1 |
| Example 6 | 0.035 | 0.352 | 0.614 | 94.1 | 89.8 | 86.7 |
| Example 7 | 0.04 | 0.354 | 0.612 | 91.2 | 87.4 | 84.5 |
| Example 8 | 0.045 | 0.358 | 0.610 | 96.3 | 92.2 | 89.2 |
| Example 9 | 0.05 | 0.363 | 0.607 | 96.6 | 92.7 | 89.9 |
| Example 10 | 0.07 | 0.375 | 0.597 | 97.1 | 94.0 | 92.0 |
| Example 11 | 0.08 | 0.380 | 0.593 | 97.7 | 95.0 | 93.0 |
| Example 12 | 0.1 | 0.390 | 0.586 | 97.4 | 95.4 | 94.2 |
| Example 13 | 0.12 | 0.400 | 0.578 | 100.0 | 98.5 | 97.9 |
| Example 14 | 0.14 | 0.408 | 0.571 | 99.6 | 99.1 | 98.7 |
| Example 15 | 0.16 | 0.414 | 0.566 | 99.4 | 100.0 | 100.0 |
| Example 16 | 0.18 | 0.417 | 0.564 | 95.2 | 95.9 | 96.0 |
| Example 17 | 0.2 | 0.424 | 0.559 | 89.3 | 90.2 | 90.8 |
| Example 18 | 0.22 | 0.430 | 0.555 | 91.5 | 93.4 | 94.2 |
| Example 19 | 0.24 | 0.434 | 0.551 | 87.0 | 89.1 | 90.1 |
| Example 20 | 0.26 | 0.438 | 0.547 | 78.2 | 81.0 | 82.1 |
| Example 21 | 0.28 | 0.441 | 0.545 | 73.9 | 77.0 | 78.3 |
| Example 22 | 0.3 | 0.441 | 0.545 | 61.4 | 63.6 | 64.6 |
| Example 23 | 0.4 | 0.453 | 0.535 | 53.3 | 56.3 | 57.7 |
| Example 24 | 0.5 | 0.460 | 0.529 | 43.7 | 46.9 | 48.4 |
| Example 25 | 0.6 | 0.466 | 0.524 | 33.6 | 36.6 | 37.8 |
| Example 26 | 0.7 | 0.471 | 0.518 | 23.4 | 26.5 | 27.6 |

Luminance of light emission, energy efficiency and quantum efficiency of the fluorescent materials of the examples are shown in relative values with respect to those of the fluorescent material of Example 6 that has the highest values of luminance of light emission, energy efficiency and quantum efficiency, measured by irradiating fluorescent materials 1 to 26 by use of an excitation light source that emits light of a wavelength around 400 nm. Luminance of light emission of the examples are shown in relative values with respect to those of fluorescent material 13 that has the highest value of luminance of light emission, measured by irradiating the fluorescent materials 1 to 26 by use of an excitation light source that emits light of wavelength around 460 nm. Energy efficiency and quantum efficiency of the examples are shown in relative values with respect to those of fluorescent material 15 that has the highest values of energy efficiency and quantum efficiency, measured by irradiating of the fluorescent materials 1 to 26.

$SrSi_2O_2N_2$:Eu was produced as follows.

$Sr_3N_2$, $Si_3N_4$, $SiO_2$, and $Eu_2O_3$ were used as stock materials which were crushed to a particle size from 0.1 to 3.0 μm. Crushed materials of quantities shown in the tables were weighed. Since a part of Sr is substituted by Eu, the composition becomes $Sr_{(1-X)}Eu_XSi_2O_2N_2$ (0<X<1). Predetermined quantities of $Sr_3N_2$, $Si_3N_4$, $SiO_2$, and $Eu_2O_3$ were mixed in a nitrogen atmosphere in a globe box to make a uniform mixture.

Molar ratios of the elements included in fluorescent material 5 are Sr:Si:O:Eu=0.97:2:2:0.03. $Sr_3N_2$, $Si_3N_4$, $SiO_2$, and $Eu_2O_3$ were weighed and mixed in these proportions. Sr concentration and a mix proportion of Eu in the composition $Sr_{(1-X)}Eu_XSi_2O_2N_2$ of the fluorescent materials 1 to 26 were controlled so that a predetermined molar ratio could be obtained. A mix proportion of Eu shown in the tables indicates a molar ratio of Eu.

A mixture of the compounds described above was put into a crucible made of boron nitride in an ammonia atmosphere, and fired for about 5 hours at about 1500° C., thereby making a desired oxynitride-based fluorescent material. A theoretical composition of the oxynitride-based fluorescent material thus obtained is $Sr_{(1-X)}Eu_XSi_2O_2N_2$ (0<X<1) from the mix proportions of the stock materials.

Measurement of O and N contents in the oxynitride-based fluorescent material of the fluorescent material 5 showed that 15.3% by weight of O and 10.1% by weight of N were included. A weight ratio of O and N was O:N=1:0.66. The oxynitride-based fluorescent material shown in the tables was fired in an ammonia atmosphere in a crucible made of boron nitride. Use of a crucible made of a metal is not desirable. When a crucible made of Mo is used, the crucible will be eroded resulting in a deterioration in light emission characteristics. Fluorescent materials 1 to 26 that have been fired are all crystalline powder or granular material having particle sizes roughly in a range from 1 to 10 μm.

Figure 8:
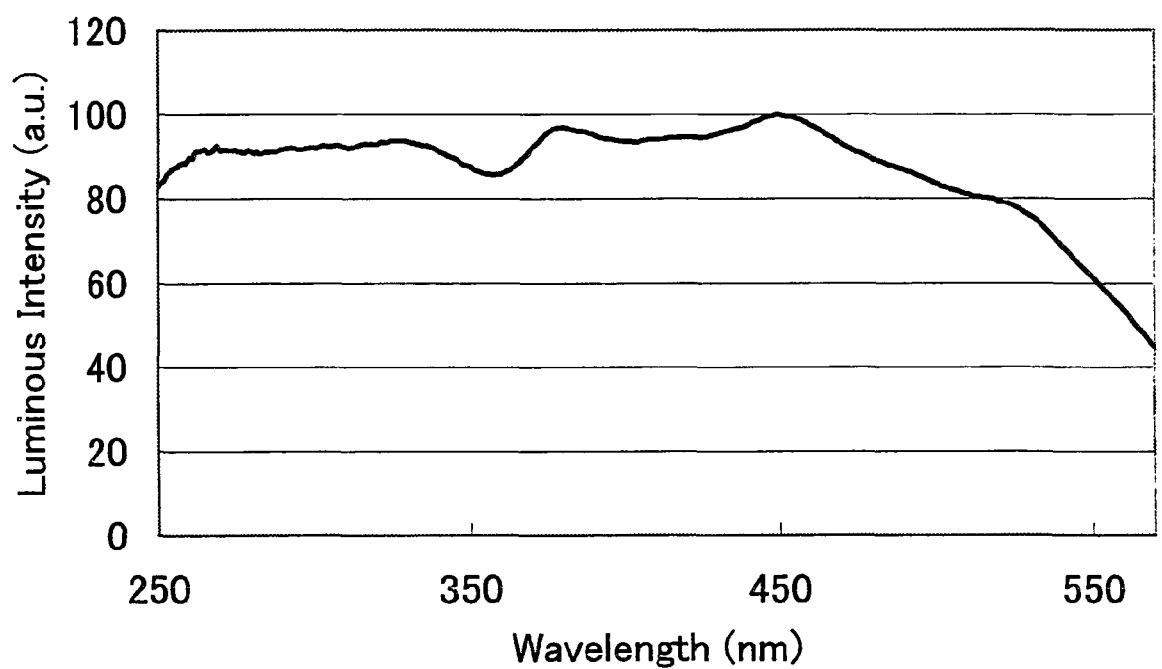
FIG. 8 shows a normalized excitation spectrum of oxynitride-based fluorescent material ($SrSi_2O_2N_2$:Eu).

Excitation spectra of the fluorescent materials 1 to 26 were measured. FIG. 8 shows a normalized excitation spectrum of $SrSi_2O_2N_2$:Eu. As can be seen from FIG. 8, the fluorescent materials are excited strongly in a wavelength region from 250 nm to 490 nm.

Results of exciting the fluorescent materials 1 to 26 with Ex=400 nm are shown in Table 3. The oxynitride-based fluorescent material of fluorescent material 1 emits light in the yellow-green region with chromaticity coordinates of x=0.333 and y=0.614. The oxynitride-based fluorescent material of fluorescent material 6 emits light in the yellow-green region with chromaticity coordinates of x=0.356 and y=0.604. As a proportion of Eu is increased, chromaticity coordinate x shifts toward the right and y shifts downward. Luminance of light emission gradually increased as the proportion of Eu was increased, showing the highest value with the composition of fluorescent material 6. As the proportion of Eu was increased further, luminance of light emission decreased. Quantum efficiency, on the other hand, gradually increased as the proportion of Eu was increased, showing a highest value with the composition of fluorescent material 6. As the proportion of Eu was increased further, quantum efficiency decreased. In fluorescent materials 1 to 17, the oxynitride-based fluorescent material can emit light of a desired color tone while maintaining high luminance of light emission and high quantum efficiency.

Results of exciting the oxynitride-based fluorescent material of the fluorescent materials 1 to 26 with Ex=460 nm are shown in Table 4. This excitation wavelength was employed since Ex=460 nm is commonly used in blue light emitting devices. The oxynitride-based fluorescent material of fluorescent material 1 emits light in the yellow-green region with chromaticity coordinates of x=0.334 and y=0.623. As the proportion of Eu is increased, chromaticity coordinate x shifts toward the right and y shifts downward. The oxynitride-based fluorescent material of fluorescent material 13 emits light in yellow-green region with chromaticity coordinates of x=0.400 and y=0.578. Luminance of light emission gradually increased as the proportion of Eu was increased, showing the highest value with the composition of fluorescent material 13.

As the proportion of Eu was increased further, luminance of light emission decreased. Quantum efficiency, on the other hand, gradually increased as the proportion of Eu was increased, showing the highest value with the composition of fluorescent material 15. As the proportion of Eu was increased further, quantum efficiency decreased. In fluorescent materials 2 to 21, the oxynitride-based fluorescent material can emit light of a desired color tone while maintaining high luminance of light emission and high quantum efficiency.

The oxynitride-based fluorescent material of the fluorescent materials 1 to 26 showed a very good temperature characteristic, which is given as relative luminance in percentage of luminance of light emission at 25° C. Particle size was measured by an air permeation method called F.S.S.S.No. (Fischer Sub Sieve Sizer's No.). The fluorescent materials 1 to 26 showed a temperature characteristic of at least 85% at 100° C. and at least 55% at 200° C.

X-ray diffraction images of the oxynitride-based fluorescent material described above all showed sharp diffraction patterns, proving that the fluorescent materials were crystalline compounds having ordered structure. These materials had orthorhombic crystal structure.

[$CaSi_2O_2N_2$:Eu]

Examples of oxynitride-based fluorescent material using $CaSi_2O_2N_2$:Eu will now be described. Table 5 and Table 6 show light emission characteristics of $CaSi_2O_2N_2$:Eu of various proportions of Eu.

TABLE 5

|  | Ex = 400 nm | | | | | |
| --- | --- | --- | --- | --- | --- | --- |
|  | Proportion of Eu x | Color tone x | Color tone y | Emission luminance Y (%) | Energy efficiency E (%) | Quantum efficiency Q (%) |
| Example 27 | 0.01 | 0.422 | 0.549 | 99.4 | 98.7 | 98.5 |
| Example 28 | 0.02 | 0.428 | 0.546 | 100.0 | 100.0 | 100.0 |
| Example 29 | 0.03 | 0.433 | 0.543 | 94.1 | 94.6 | 95.0 |
| Example 30 | 0.06 | 0.444 | 0.536 | 76.5 | 78.7 | 79.6 |
| Example 31 | 0.09 | 0.451 | 0.530 | 69.5 | 72.7 | 74.1 |
| Example 32 | 0.12 | 0.456 | 0.526 | 72.7 | 77.2 | 78.8 |
| Example 33 | 0.15 | 0.460 | 0.524 | 72.9 | 77.2 | 79.0 |
| Example 34 | 0.2 | 0.464 | 0.522 | 77.1 | 81.7 | 83.7 |
| Example 35 | 0.3 | 0.473 | 0.516 | 76.6 | 82.0 | 84.3 |
| Example 36 | 0.4 | 0.485 | 0.506 | 67.8 | 76.0 | 79.0 |
| Example 37 | 0.5 | 0.499 | 0.494 | 65.4 | 76.2 | 79.9 |
| Example 38 | 0.6 | 0.502 | 0.492 | 45.1 | 51.7 | 53.9 |
| Example 39 | 0.7 | 0.500 | 0.494 | 45.8 | 51.9 | 54.1 |
| Example 40 | 0.8 | 0.497 | 0.496 | 26.9 | 30.2 | 31.4 |

TABLE 6

|  | Ex = 460 nm | | | | | |
| --- | --- | --- | --- | --- | --- | --- |
|  | Proportion of Eu x | Color tone x | Color tone y | Emission luminance Y (%) | Energy efficiency E (%) | Quantum efficiency Q (%) |
| Example 27 | 0.01 | 0.427 | 0.551 | 72.1 | 68.2 | 66.5 |
| Example 28 | 0.02 | 0.431 | 0.549 | 82.1 | 78.0 | 76.4 |
| Example 29 | 0.03 | 0.435 | 0.546 | 81.1 | 77.4 | 76.0 |
| Example 30 | 0.06 | 0.442 | 0.541 | 72.1 | 70.0 | 69.2 |
| Example 31 | 0.09 | 0.447 | 0.537 | 68.5 | 67.5 | 66.9 |
| Example 32 | 0.12 | 0.450 | 0.533 | 74.6 | 74.2 | 73.9 |
| Example 33 | 0.15 | 0.454 | 0.531 | 83.5 | 83.0 | 82.5 |
| Example 34 | 0.2 | 0.457 | 0.529 | 95.0 | 94.4 | 94.0 |

TABLE 6-continued

| | | Ex = 460 nm | | | | |
|---|---|---|---|---|---|---|
| | Proportion of Eu x | Color tone x | Color tone y | Emission luminance Y (%) | Energy efficiency E (%) | Quantum efficiency Q (%) |
| Example 35 | 0.3 | 0.464 | 0.524 | 100.0 | 100.0 | 100.0 |
| Example 36 | 0.4 | 0.475 | 0.514 | 86.0 | 89.6 | 90.6 |
| Example 37 | 0.5 | 0.488 | 0.502 | 88.2 | 94.7 | 96.5 |
| Example 38 | 0.6 | 0.492 | 0.500 | 58.3 | 61.9 | 63.1 |
| Example 39 | 0.7 | 0.490 | 0.501 | 56.8 | 60.1 | 60.9 |
| Example 40 | 0.8 | 0.486 | 0.505 | 33.9 | 35.5 | 35.9 |

Luminance of light emission, energy efficiency and quantum efficiency of the fluorescent materials of the examples are shown in relative values with respect to those of the fluorescent material of Example 28 that has the highest values of luminance of light emission, energy efficiency and quantum efficiency, measured by irradiating fluorescent materials 27 to 40 by use of an excitation light source emitting light of a wavelength around 400 nm. Luminance of light emission, energy efficiency and quantum efficiency of the fluorescent materials of the examples are shown in relative values with respect to those of the fluorescent material of Example 35 that has the highest values of luminance of light emission, energy efficiency and quantum efficiency, measured by irradiating fluorescent materials 27 to 40 by use of an excitation light source emitting light of a wavelength around 460 nm.

$CaSi_2O_2N_2$:Eu was produced as follows.

$Ca_3N_2$, $Si_3N_4$, $SiO_2$, and $Eu_2O_3$ were used as stock materials which were processed in predetermined molar ratios to produce the oxynitride-based fluorescent material of fluorescent materials 27 to 40 in a process similar to that for fluorescent material 1. Theoretical composition of the oxynitride-based fluorescent material thus obtained is $Ca_{(1-X)}Eu_XSi_2O_2N_2$ (0<X<1). A part of Ca is substituted by Eu. A mix proportion of Eu shown in the tables indicates the molar ratio of Eu.

Measurement of O and N contents in the oxynitride-based fluorescent material of fluorescent material 28 showed that 19.5% by weight of O and 17.5% by weight of N were included. A weight ratio of O and N was O:N=1:0.90. Fluorescent materials 27 to 40 that have been fired are all crystalline powder or granular material having particle sizes roughly in a range from 1 to 10 μm.

Figure 9:
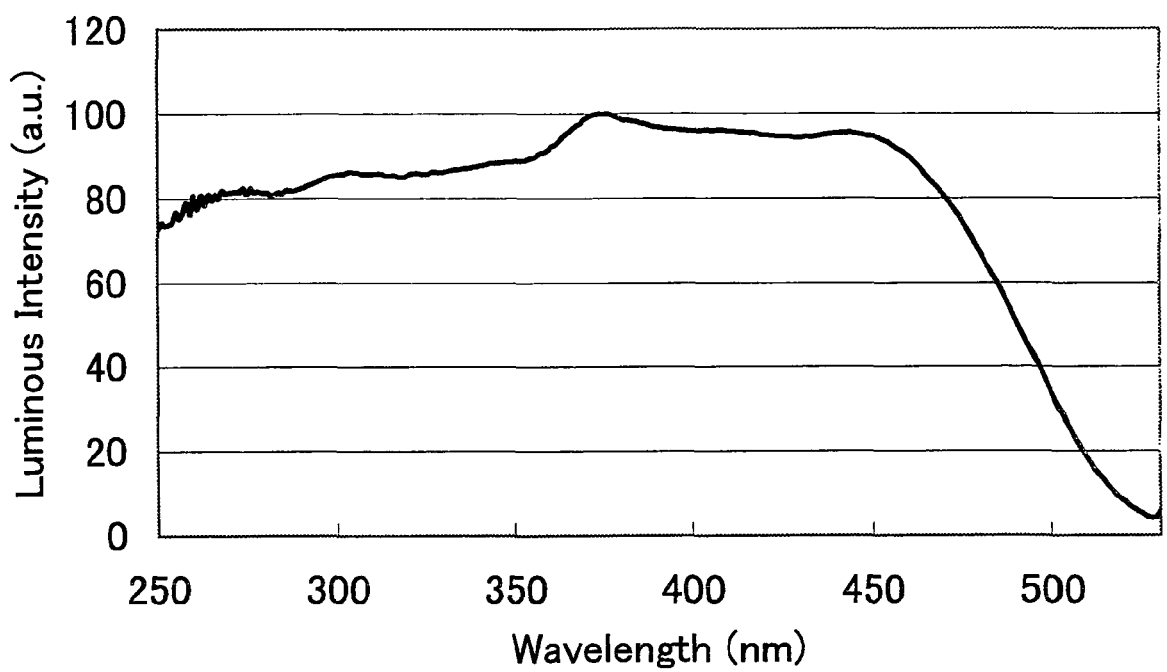
FIG. 9 shows a normalized excitation spectrum of oxynitride-based fluorescent material ($CaSi_2O_2N_2$:Eu).

Excitation spectra of oxynitride-based fluorescent materials 27 to 40 were measured. FIG. 9 shows a normalized excitation spectrum of oxynitride-based fluorescent material ($CaSi_2O_2N_2$:Eu). As can be seen from FIG. 9, the fluorescent materials are excited strongly in a wavelength region from 250 nm to 520 nm.

Results of exciting the oxynitride-based fluorescent material of fluorescent materials 27 to 40 with Ex=400 nm are shown in Table 5. The oxynitride-based fluorescent material of fluorescent material 28 emits light in the yellow-green region with chromaticity coordinates of x=0.428 and y=0.546. The oxynitride-based fluorescent material of fluorescent material 27 emits light in the yellow-green region with chromaticity coordinates of x=0.422 and y=0.549. As a proportion of Eu is increased, chromaticity coordinate x shifts toward the right and y shifts downward. Fluorescent material 28 shows the highest values of luminance of light emission, energy efficiency and high quantum efficiency. In fluorescent materials 27 to 37, the oxynitride-based fluorescent material can emit light of a desired color tone while maintaining high luminance of light emission and high quantum efficiency.

Results of exciting the oxynitride-based fluorescent material of fluorescent materials 27 to 40 with Ex=460 nm are shown in Table 6. This excitation wavelength was employed since Ex=460 nm is commonly used in blue light emitting devices. The oxynitride-based fluorescent material of fluorescent material 35 emits light in the yellow region with chromaticity coordinates of x=0.464 and y=0.524. As the proportion of Eu is increased, chromaticity coordinate x shifts toward the right and y shifts downward in the chromaticity diagram. As the proportion of Eu was increased, luminance of light emission, energy efficiency and quantum efficiency gradually increased, and the luminance of light emission showed the highest value with the composition of fluorescent material 35. As the proportion of Eu was increased further, quantum efficiency decreased. In fluorescent materials 27 to 39, the oxynitride-based fluorescent material can emit light of a desired color tone while maintaining high luminance of light emission and high quantum efficiency.

X-ray diffraction images of the oxynitride-based fluorescent material described above all showed sharp diffraction patterns, proving that the fluorescent materials were crystalline compounds having ordered structure. These materials had orthorhombic crystal structure.

[$BaSi_2O_2N_2$:Eu]

Examples of oxynitride-based fluorescent material using $BaSi_2O_2N_2$:Eu will now be described. Table 7 and Table 8 show the light emission characteristics of $BaSi_2O_2N_2$:Eu of various proportions of Eu.

TABLE 7

| | | | | | Ex = 400 nm | | | |
|---|---|---|---|---|---|---|---|---|
| | Proportion of Eu x | Emission peak (nm) | Color tone x | Color tone y | Peak intensity (nm) | Emission luminance Y (%) | Energy efficiency E (%) | Quantum efficiency Q (%) |
| Example 41 | 0.01 | 495 | 0.090 | 0.458 | 100.3 | 90.8 | 96.6 | 96.0 |
| Example 42 | 0.02 | 496 | 0.101 | 0.485 | 100.0 | 100.0 | 100.0 | 100.0 |

TABLE 7-continued

| | Ex = 400 nm | | | | | | |
|---|---|---|---|---|---|---|---|
| | Proportion of Eu x | Emission peak (nm) | Color tone x | Color tone y | Peak intensity (nm) | Emission luminance Y (%) | Energy efficiency E (%) | Quantum efficiency Q (%) |
| Example 43 | 0.03 | 497 | 0.116 | 0.507 | 90.1 | 102.3 | 96.0 | 96.5 |
| Example 44 | 0.04 | 498 | 0.113 | 0.504 | 89.2 | 95.7 | 92.1 | 92.6 |
| Example 45 | 0.05 | 499 | 0.132 | 0.521 | 83.6 | 102.9 | 92.9 | 94.1 |
| Example 46 | 0.1 | 498 | 0.247 | 0.477 | 22.5 | 54.4 | 42.3 | 45.0 |
| Example 47 | 0.15 | 518 | 0.289 | 0.556 | 8.4 | 40.3 | 23.7 | 25.5 |
| Example 48 | 0.2 | 531 | 0.317 | 0.599 | 5.7 | 27.7 | 14.2 | 15.3 |

TABLE 8

| | Ex = 460 nm | | |
|---|---|---|---|
| | Proportion of Eu x | Emission peak (nm) | Peak intensity (nm) |
| Example 41 | 0.01 | 495 | 95.2 |
| Example 42 | 0.02 | 496 | 100.0 |
| Example 43 | 0.03 | 498 | 94.2 |
| Example 44 | 0.04 | 498 | 96.7 |
| Example 45 | 0.05 | 499 | 93.3 |
| Example 46 | 0.1 | 500 | 28.2 |
| Example 47 | 0.15 | 504 | 9.1 |
| Example 48 | 0.2 | 536 | 4.0 |

Peak emission intensity, luminance of light emission, energy efficiency and quantum efficiency of the fluorescent materials of the examples are shown in relative values with respect to those of the fluorescent material of Example 42, measured by irradiating fluorescent materials 41 to 48 by use of an excitation light source that emits light of a wavelength around 400 nm. Peak emission intensities of the fluorescent materials are shown in relative values with respect to that of fluorescent material 42, measured by irradiating fluorescent materials 41 to 48 by use of an excitation light source that emits light of a wavelength around 460 nm.

$BaSi_2O_2N_2$:Eu was produced as follows.

$Ba_3N_2$, $Si_3N_4$, $SiO_2$, and $Eu_2O_3$ were used as stock materials which were processed in predetermined molar ratios to produce the oxynitride-based fluorescent material of fluorescent materials 41 to 48 in a process similar to that for fluorescent material 1. Theoretical composition of the oxynitride-based fluorescent material thus obtained is $Ba_{(1-x)}Eu_xSi_2O_2N_2$ (0<X<1). A part of Ba is substituted by Eu. A mix proportion of Eu shown in the table indicates a molar ratio of Eu.

Measurement of O and N contents in the oxynitride-based fluorescent material of fluorescent material 42 showed that 11.3% by weight of O and 10.6% by weight of N were included. A weight ratio of O and N was O:N=1:0.94. Fluorescent materials 41 to 48 that have been fired are all crystalline powder or granular material having particle sizes roughly in a range from 1 to 10 μm.

Figure 10:
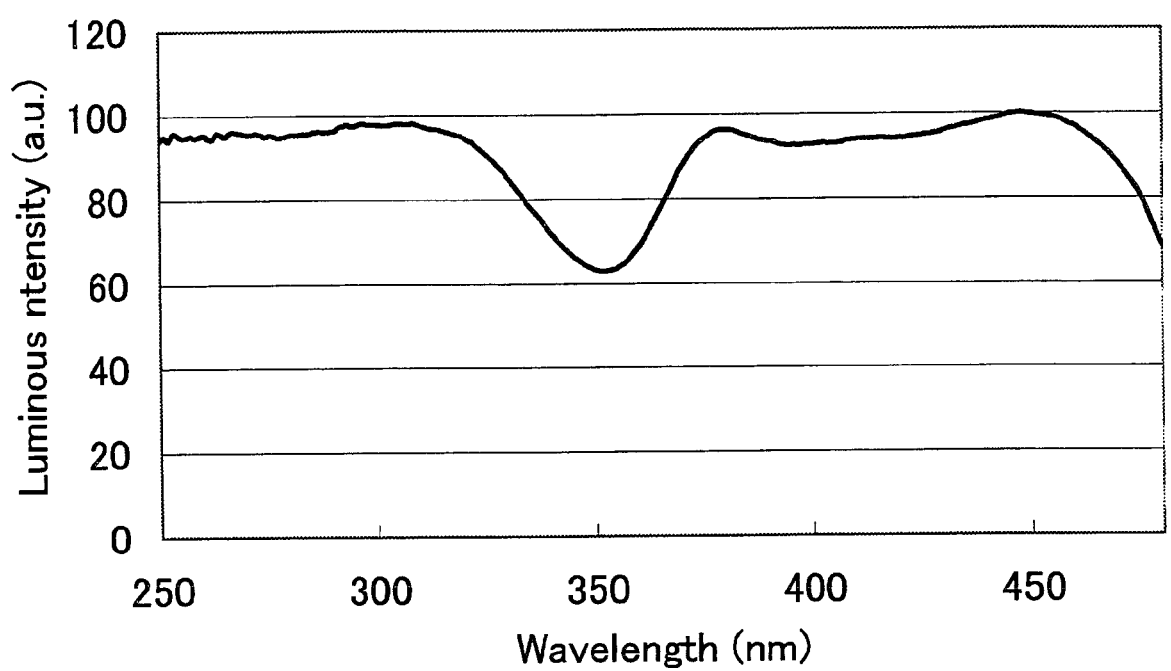
FIG. 10 shows a normalized excitation spectrum of oxynitride-based fluorescent material ($BaSi_2O_2N_2$:Eu).

Excitation spectra of the oxynitride-based fluorescent material of fluorescent materials 42 to 48 were measured. FIG. 10 shows a normalized excitation spectrum of oxynitride-based fluorescent material ($BaSi_2O_2N_2$:Eu). As can be seen from this figure, the fluorescent materials are excited strongly in a wavelength region from 250 nm to 480 nm and beyond.

Results of exciting the oxynitride-based fluorescent material of fluorescent materials 41 to 48 with Ex=400 nm are shown in Table 7. The oxynitride-based fluorescent material of fluorescent material 42 emits light in the green region with chromaticity coordinates of x=0.101 and y=0.485. The oxynitride-based fluorescent material of fluorescent material 45 emits light in the green region with chromaticity coordinates of x=0.132 and y=0.521. As a proportion of Eu is increased, chromaticity coordinate x shifts toward the right and y shifts upward. Fluorescent material 45 shows the highest value of luminance of light emission, while fluorescent material 42 shows the highest values of energy efficiency and high quantum efficiency. In fluorescent materials 41 and 45, the oxynitride-based fluorescent material can emit light of a desired color tone while maintaining high luminance of light emission and high quantum efficiency.

Results of exciting the oxynitride-based fluorescent material of fluorescent materials 41 to 48 with Ex=460 nm are shown in Table 8. This excitation wavelength was employed since Ex=460 nm is commonly used in blue light emitting elements. The oxynitride-based fluorescent material of fluorescent material 42 has the highest peak intensity.

The oxynitride-based fluorescent material of fluorescent materials 41 to 48 showed a very good temperature characteristic. Fluorescent materials 41 to 48 showed temperature characteristic of at least 90% at 100° C. and at least 65% at 200° C. X-ray diffraction images of the oxynitride-based fluorescent material described above all showed sharp diffraction patterns, proving that the fluorescent materials were crystalline compounds having ordered structure. These materials had orthorhombic crystal structure.

[$BaSi_2O_2N_2$:Eu Supplemented with B]

Table 9 shows performance of examples wherein B was added to $BaSi_2O_2N_2$:Eu (Nos. 1 to 10 of fluorescent material 42). Luminance of light emission, energy efficiency and quantum efficiency of the fluorescent materials of the examples are shown in relative values with respect to those of fluorescent material of Example 42 No. 1, measured by irradiating the fluorescent materials by use of excitation light sources that emit light of wavelengths around 400 nm and 460 nm.

TABLE 9

|  | EX = 400 nm | | | | | | EX = 460 nm | | Median |
| --- | --- | --- | --- | --- | --- | --- | --- | --- | --- |
|  | Concentration of B (ppm) | Emission peak (nm) | Color tone x | Color tone y | Emission luminance Y (%) | Energy efficiency E (%) | Quantum efficiency Q (%) | Emission peak (nm) | Peak intensity (nm) | particle size Dm |
| Example 42-1 | <10 | 494 | 0.087 | 0.450 | 100.0 | 100.0 | 100.0 | 494 | 100.0 | 10.74 |
| Example 42-2 | 25 | 494 | 0.082 | 0.445 | 96.6 | 96.1 | 96.0 | 494 | 96.6 | 11.49 |
| Example 42-3 | 52 | 494 | 0.080 | 0.440 | 100.3 | 99.4 | 99.5 | 494 | 98.5 | 11.12 |
| Example 42-4 | 94 | 494 | 0.085 | 0.444 | 103.5 | 101.3 | 101.4 | 494 | 92.6 | 9.69 |
| Example 42-5 | 180 | 494 | 0.078 | 0.437 | 96.9 | 95.8 | 95.8 | 494 | 97.2 | 11.07 |
| Example 42-6 | 290 | 495 | 0.091 | 0.455 | 108.1 | 100.9 | 101.3 | 494 | 87.8 | 9.61 |
| Example 42-7 | 340 | 494 | 0.078 | 0.436 | 92.0 | 91.5 | 91.4 | 494 | 96.9 | 10.07 |
| Example 42-8 | 1700 | 495 | 0.117 | 0.488 | 103.8 | 90.4 | 91.3 | 494 | 70.8 | 9.16 |
| Example 42-9 | 3300 | 497 | 0.147 | 0.521 | 54.7 | 39.5 | 40.5 | 493 | 20.5 | 7.46 |
| Example 42-10 | 6400 | 507 | 0.173 | 0.541 | 15.1 | 10.5 | 10.9 | 495 | 1.8 | 7.25 |

$BaSi_2O_2N_2$:Eu was produced as follows.

$Ba_3N_2$, $Si_3N_4$, $SiO_2$, $Eu_2O_3$ and $H_3BO_3$ were used as stock materials which were processed in a predetermined molar ratio to produce the oxynitride-based fluorescent material of Nos. 1 to 10 of fluorescent material 42 in a process similar to that for fluorescent material 1. A theoretical composition of the oxynitride-based fluorescent material thus obtained is $Ba_{0.98}Eu_{0.02}Si_{2-x}B_xO_{2+x}N_{2-x}$. Results of Nos. 1 to 10 of fluorescent material 42 show that luminance of light emission when excited with Ex=400 nm and peak emission intensity when excited with Ex=460 nm decrease if the content of B is too high.

[$BaSi_2O_2N_2$:Eu, Ln]

Examples of fluorescent materials co-activated with Eu and another rare earth element will now be described by way of $BaSi_2O_2N_2$:Eu, Ln. Tables 10 to 20 show light emission characteristics of $BaSi_2O_2N_2$ with various rare earth elements and Eu added as activators. Fluorescent materials Ln1 to Ln6 are examples of $BaSi_2O_2N_2$:Eu, Ln. Ln represents one kind of element selected from the group consisting of Yb, Tm, DY, Nd, Tb, Y, Sm, Er, Ce and Lu. Luminance of light emission, energy efficiency and quantum efficiency of the fluorescent materials are shown in relative values with respect to those of fluorescent material Ln1, measured by irradiating fluorescent materials Ln1 to Ln6 by use of an excitation light source that emits light of a wavelength around 400 nm. Peak emission intensities of the fluorescent materials are shown in relative values with respect to that of fluorescent material Ln1, measured by irradiating fluorescent materials Ln1 to Ln6 by use of an excitation light source that emits light of a wavelength around 460 nm.

TABLE 10

|  | | EX = 400 nm | | | | | | EX = 460 nm | | Median |
| --- | --- | --- | --- | --- | --- | --- | --- | --- | --- | --- |
|  | Proportion of Ln y | Emission peak (nm) | Color tone x | Color tone y | Emission luminance Y (%) | Energy efficiency E (%) | Quantum efficiency Q (%) | Emission peak (nm) | Peak intensity (nm) | particle size Dm |
| Yb1 | 0 | 494 | 0.090 | 0.456 | 100.0 | 100.0 | 100.0 | 495 | 100.0 | 8.0 |
| Yb2 | 0.005 | 495 | 0.085 | 0.451 | 106.0 | 108.1 | 108.0 | 495 | 106.2 | 10.4 |
| Yb3 | 0.01 | 494 | 0.079 | 0.446 | 102.8 | 105.3 | 105.1 | 495 | 107.5 | 11.5 |
| Yb4 | 0.02 | 494 | 0.078 | 0.443 | 102.4 | 104.3 | 104.2 | 495 | 105.4 | 16.8 |
| Yb5 | 0.04 | 494 | 0.077 | 0.445 | 91.6 | 91.6 | 91.7 | 495 | 99.7 | 18.1 |
| Yb6 | 0.08 | 494 | 0.078 | 0.431 | 77.3 | 79.3 | 79.2 | 494 | 82.8 | 19.4 |

TABLE 11

|  | | EX = 400 nm | | | | | | EX = 460 nm | | Median |
| --- | --- | --- | --- | --- | --- | --- | --- | --- | --- | --- |
|  | Proportion of Ln y | Emission peak (nm) | Color tone x | Color tone y | Emission luminance Y (%) | Energy efficiency E (%) | Quantum efficiency Q (%) | Emission peak (nm) | Peak intensity (nm) | particle size Dm |
| Tm1 | 0 | 494 | 0.090 | 0.456 | 100.0 | 100.0 | 100.0 | 495 | 100.0 | 8.0 |
| Tm2 | 0.005 | 495 | 0.088 | 0.458 | 105.3 | 105.3 | 105.4 | 495 | 110.0 | 9.7 |
| Tm3 | 0.01 | 495 | 0.079 | 0.449 | 102.5 | 102.5 | 104.4 | 495 | 112.1 | 11.1 |
| Tm4 | 0.02 | 495 | 0.077 | 0.444 | 97.4 | 97.4 | 99.1 | 495 | 110.1 | 13.3 |
| Tm5 | 0.04 | 494 | 0.079 | 0.437 | 85.4 | 85.4 | 86.7 | 494 | 96.1 | 13.6 |
| Tm6 | 0.08 | 494 | 0.088 | 0.423 | 60.1 | 60.1 | 62.1 | 494 | 68.5 | 8.1 |

TABLE 12

| | | EX = 400 nm | | | | | EX = 460 nm | | Median |
|---|---|---|---|---|---|---|---|---|---|
| | Proportion of Ln y | Emission peak (nm) | Color tone x | Color tone y | Emission luminance Y (%) | Energy efficiency E (%) | Quantum efficiency Q (%) | Emission peak (nm) | Peak intensity (nm) | particle size Dm |
| Dy1 | 0 | 494 | 0.090 | 0.456 | 100.0 | 100.0 | 100.0 | 495 | 100.0 | 8.0 |
| Dy2 | 0.005 | 494 | 0.087 | 0.451 | 104.9 | 106.5 | 106.4 | 495 | 105.6 | 10.4 |
| Dy3 | 0.01 | 494 | 0.082 | 0.444 | 105.5 | 108.2 | 108.0 | 495 | 107.5 | 11.5 |
| Dy4 | 0.02 | 494 | 0.078 | 0.440 | 95.3 | 97.9 | 97.7 | 495 | 102.7 | 16.8 |
| Dy5 | 0.04 | 494 | 0.078 | 0.440 | 96.5 | 98.2 | 98.2 | 495 | 104.6 | 18.1 |
| Dy6 | 0.08 | 494 | 0.081 | 0.430 | 85.0 | 88.5 | 88.4 | 494 | 91.8 | 19.4 |

TABLE 13

| | | EX = 400 nm | | | | | | EX = 460 nm | | Median |
|---|---|---|---|---|---|---|---|---|---|---|
| | Proportion of Ln y | Emission peak (nm) | Color tone x | Color tone y | Emission luminance Y (%) | Energy efficiency E (%) | Quantum efficiency Q (%) | Emission peak (nm) | Peak intensity (nm) | particle size Dm |
| Nd1 | 0 | 494 | 0.090 | 0.456 | 100.0 | 100.0 | 100.0 | 495 | 100.0 | 8.0 |
| Nd2 | 0.005 | 494 | 0.084 | 0.446 | 101.3 | 103.6 | 103.6 | 495 | 103.9 | 9.1 |
| Nd3 | 0.01 | 494 | 0.078 | 0.440 | 97.5 | 99.9 | 99.6 | 495 | 100.8 | 10.3 |
| Nd4 | 0.02 | 494 | 0.074 | 0.442 | 102.8 | 104.7 | 104.6 | 495 | 112.1 | 11.2 |
| Nd5 | 0.04 | 495 | 0.074 | 0.445 | 102.5 | 102.6 | 102.7 | 495 | 112.4 | 14.8 |
| Nd6 | 0.08 | 494 | 0.076 | 0.435 | 86.0 | 87.7 | 87.6 | 494 | 98.1 | 18.6 |

TABLE 14

| | | EX = 400 nm | | | | | | EX = 460 nm | | Median |
|---|---|---|---|---|---|---|---|---|---|---|
| | Proportion of Ln y | Emission peak (nm) | Color tone x | Color tone y | Emission luminance Y (%) | Energy efficiency E (%) | Quantum efficiency Q (%) | Emission peak (nm) | Peak intensity (nm) | particle size Dm |
| Gd1 | 0 | 494 | 0.090 | 0.456 | 100.0 | 100.0 | 100.0 | 495 | 100.0 | 8.0 |
| Gd2 | 0.005 | 494 | 0.085 | 0.454 | 106.6 | 108.4 | 108.3 | 495 | 106.8 | 7.0 |
| Gd3 | 0.01 | 494 | 0.077 | 0.444 | 105.1 | 108.6 | 108.2 | 495 | 107.5 | 9.2 |
| Gd4 | 0.02 | 494 | 0.078 | 0.440 | 101.4 | 103.5 | 103.4 | 495 | 106.5 | 9.7 |
| Gd5 | 0.04 | 494 | 0.081 | 0.441 | 92.3 | 92.6 | 92.7 | 495 | 100.6 | 11.8 |
| Gd6 | 0.08 | 493 | 0.096 | 0.413 | 64.3 | 66.9 | 67.1 | 494 | 64.9 | 7.9 |

TABLE 15

| | | EX = 400 nm | | | | | | EX = 460 nm | | Median |
|---|---|---|---|---|---|---|---|---|---|---|
| | Proportion of Ln y | Emission peak (nm) | Color tone x | Color tone y | Emission luminance Y (%) | Energy efficiency E (%) | Quantum efficiency Q (%) | Emission peak (nm) | Peak intensity (nm) | particle size Dm |
| Tb1 | 0 | 494 | 0.090 | 0.456 | 100.0 | 100.0 | 100.0 | 495 | 100.0 | 8.0 |
| Tb2 | 0.005 | 494 | 0.075 | 0.434 | 98.5 | 100.0 | 100.0 | 494 | 103.5 | 11.8 |
| Tb3 | 0.01 | 494 | 0.076 | 0.435 | 95.8 | 100.1 | 99.9 | 494 | 103.6 | 11.9 |
| Tb4 | 0.02 | 494 | 0.076 | 0.436 | 96.4 | 98.9 | 98.9 | 494 | 105.5 | 12.4 |
| Tb5 | 0.04 | 494 | 0.079 | 0.438 | 97.5 | 98.2 | 98.2 | 495 | 107.8 | 16.5 |
| Tb6 | 0.08 | 495 | 0.088 | 0.455 | 100.9 | 103.5 | 103.9 | 496 | 118.1 | 13.1 |

TABLE 16

| | | EX = 400 nm | | | | | | EX = 460 nm | | Median |
|---|---|---|---|---|---|---|---|---|---|---|
| | Proportion of Ln y | Emission peak (nm) | Color tone x | Color tone y | Emission luminance Y (%) | Energy efficiency E (%) | Quantum efficiency Q (%) | Emission peak (nm) | Peak intensity (nm) | particle size Dm |
| Y1 | 0 | 494 | 0.090 | 0.456 | 100.0 | 100.0 | 100.0 | 495 | 100.0 | 8.0 |
| Y2 | 0.005 | 495 | 0.077 | 0.453 | 94.7 | 103.4 | 102.8 | 496 | 123.9 | 11.8 |
| Y3 | 0.01 | 495 | 0.078 | 0.452 | 99.8 | 105.5 | 105.2 | 495 | 120.0 | 10.5 |
| Y4 | 0.02 | 494 | 0.080 | 0.444 | 87.2 | 95.0 | 94.7 | 495 | 112.0 | 10.5 |

TABLE 16-continued

|  | Proportion of Ln y | EX = 400 nm ||||| EX = 460 nm || Median particle size Dm |
|---|---|---|---|---|---|---|---|---|---|
|  |  | Emission peak (nm) | Color tone x | Color tone y | Emission luminance Y (%) | Energy efficiency E (%) | Quantum efficiency Q (%) | Emission peak (nm) | Peak intensity (nm) |  |
| Y5 | 0.04 | 494 | 0.083 | 0.434 | 70.0 | 78.4 | 78.3 | 495 | 93.2 | 8.8 |
| Y6 | 0.08 | 494 | 0.083 | 0.440 | 100.2 | 104.8 | 104.7 | 494 | 106.6 | 11.2 |

TABLE 17

|  | Proportion of Ln y | EX = 400 nm ||||| EX = 460 nm || Median particle size Dm |
|---|---|---|---|---|---|---|---|---|---|
|  |  | Emission peak (nm) | Color tone x | Color tone y | Emission luminance Y (%) | Energy efficiency E (%) | Quantum efficiency Q (%) | Emission peak (nm) | Peak intensity (nm) |  |
| Sm1 | 0 | 494 | 0.090 | 0.456 | 100.0 | 100.0 | 100.0 | 495 | 100.0 | 8.0 |
| Sm2 | 0.005 | 494 | 0.077 | 0.437 | 91.6 | 99.1 | 98.6 | 495 | 100.8 | 9.2 |
| Sm3 | 0.01 | 494 | 0.075 | 0.438 | 96.5 | 102.5 | 102.0 | 495 | 105.4 | 9.4 |
| Sm4 | 0.02 | 494 | 0.075 | 0.442 | 102.6 | 106.0 | 105.7 | 495 | 111.6 | 12.6 |
| Sm5 | 0.04 | 495 | 0.075 | 0.449 | 96.8 | 97.0 | 97.0 | 495 | 105.5 | 18.1 |
| Sm6 | 0.08 | 494 | 0.077 | 0.440 | 78.1 | 79.1 | 79.0 | 494 | 91.9 | 22.8 |

TABLE 18

|  | Proportion of Ln y | EX = 400 nm ||||| EX = 460 nm || Median particle size Dm |
|---|---|---|---|---|---|---|---|---|---|
|  |  | Emission peak (nm) | Color tone x | Color tone y | Emission luminance Y (%) | Energy efficiency E (%) | Quantum efficiency Q (%) | Emission peak (nm) | Peak intensity (nm) |  |
| Er1 | 0 | 494 | 0.090 | 0.456 | 100.0 | 100.0 | 100.0 | 495 | 100.0 | 8.0 |
| Er2 | 0.005 | 494 | 0.074 | 0.440 | 115.9 | 116.9 | 116.9 | 495 | 118.9 | 11.6 |
| Er3 | 0.01 | 495 | 0.078 | 0.447 | 111.5 | 114.2 | 113.9 | 495 | 118.1 | 12.8 |
| Er4 | 0.02 | 494 | 0.077 | 0.434 | 96.0 | 99.6 | 99.4 | 495 | 107.2 | 14.9 |
| Er5 | 0.04 | 494 | 0.081 | 0.425 | 90.3 | 93.8 | 93.8 | 494 | 98.1 | 14.3 |
| Er6 | 0.08 | 494 | 0.081 | 0.419 | 87.9 | 97.2 | 96.7 | 495 | 98.1 | 12.8 |

TABLE 19

|  | Proportion of Ln y | EX = 400 nm ||||| EX = 460 nm || Median particle size Dm |
|---|---|---|---|---|---|---|---|---|---|
|  |  | Emission peak (nm) | Color tone x | Color tone y | Emission luminance Y (%) | Energy efficiency E (%) | Quantum efficiency Q (%) | Emission peak (nm) | Peak intensity (nm) |  |
| Ce1 | 0 | 494 | 0.090 | 0.456 | 100.0 | 100.0 | 100.0 | 495 | 100.0 | 8.0 |
| Ce2 | 0.005 | 494 | 0.076 | 0.443 | 113.6 | 113.8 | 113.6 | 495 | 113.7 | 9.7 |
| Ce3 | 0.01 | 494 | 0.077 | 0.440 | 97.2 | 101.3 | 101.0 | 495 | 111.6 | 10.6 |
| Ce4 | 0.02 | 494 | 0.076 | 0.442 | 106.9 | 109.3 | 109.2 | 495 | 111.5 | 10.3 |
| Ce5 | 0.04 | 494 | 0.078 | 0.442 | 99.0 | 99.9 | 99.9 | 495 | 110.5 | 15.0 |
| Ce6 | 0.08 | 494 | 0.084 | 0.438 | 75.5 | 80.9 | 80.7 | 494 | 93.8 | 13.7 |

TABLE 20

|  | Proportion of Ln y | EX = 400 nm ||||| EX = 460 nm || Median particle size Dm |
|---|---|---|---|---|---|---|---|---|---|
|  |  | Emission peak (nm) | Color tone x | Color tone y | Emission luminance Y (%) | Energy efficiency E (%) | Quantum efficiency Q (%) | Emission peak (nm) | Peak intensity (nm) |  |
| Lu1 | 0 | 494 | 0.090 | 0.456 | 100.0 | 100.0 | 100.0 | 495 | 100.0 | 8.0 |
| Lu2 | 0.005 | 494 | 0.074 | 0.436 | 102.5 | 104.1 | 104.0 | 494 | 108.0 | 13.4 |
| Lu3 | 0.01 | 494 | 0.075 | 0.436 | 97.9 | 102.6 | 102.3 | 494 | 106.6 | 13.5 |
| Lu4 | 0.02 | 494 | 0.077 | 0.427 | 86.0 | 89.7 | 89.5 | 494 | 95.8 | 14.4 |
| Lu5 | 0.04 | 493 | 0.079 | 0.421 | 83.5 | 86.9 | 86.8 | 494 | 90.3 | 14.0 |
| Lu6 | 0.08 | 494 | 0.086 | 0.440 | 96.0 | 102.1 | 102.2 | 495 | 110.2 | 12.9 |

$Ba_3N_2$, $Si_3N_4$, $SiO_2$, $Eu_2O_3$ and one selected from among the group consisting of $Yb_2O_3$, $Tm_2O_3$, $Dy_2O_3$, $Nd_2O_3$, $Gd_2O_3$, $Tb_4O_7$, $Y_2O_3$, $Sm_2O_3$, $Er_2O_3$, $CeO_3$, and $Lu_2O_3$ were used as stock materials which were processed in predetermined molar ratios to produce the oxynitride-based fluorescent material of fluorescent materials Ln1 to Ln6 in a process similar to that for fluorescent material 1. A theoretical composition of the oxynitride-based fluorescent material thus obtained is $Ba_{(0.08-y)}Eu_{0.02}Ln_ySi_2O_2N_2$.

Results of fluorescent materials Ln1 to Ln6 show that a particle size increases and luminance of light emission and peak intensity improve when a proportion of Ln increases. It can also be seen that luminance of light emission and peak intensity decrease when the proportion of Ln becomes too high.

<Method of Producing Oxynitride-Based Fluorescent Material>

(1) Method of Producing $L_XM_YO_ZN_{(2/3)X+(4/3)Y-(2/3)Z}$:R

[$SrSi_2O_2N_2$:Eu]

Figure 11:
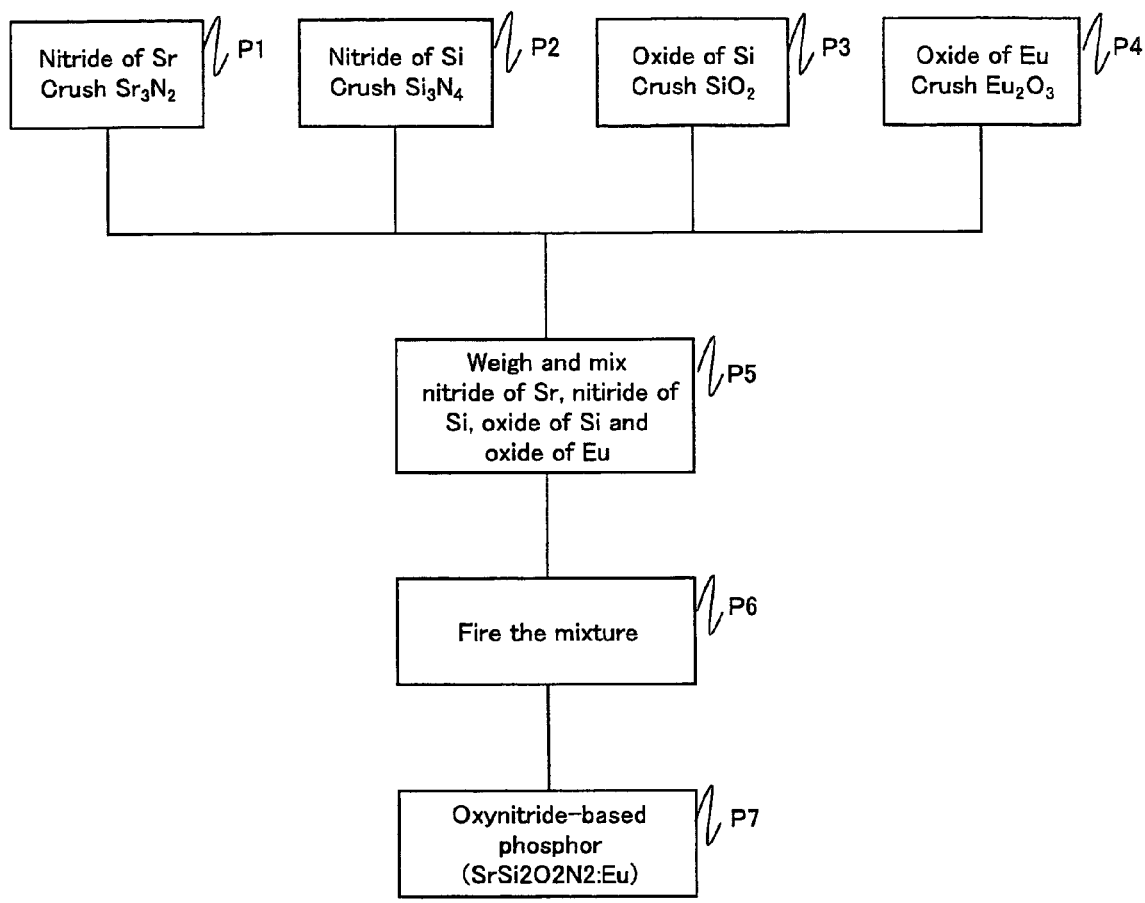
FIG. 11 is a process diagram showing a method of manufacturing oxynitride-based fluorescent material.

Now a method of producing the oxynitride-based fluorescent material will be described in detail by way of $SrSi_2O_2N_2$:Eu. It should be noted that the present invention is not limited to this method. FIG. 11 shows the method of producing the oxynitride-based fluorescent material.

Nitride of Sr, nitride of Si, oxide of Si and oxide of Eu are mixed in predetermined proportions. The nitride of Sr, nitride of Si, oxide of Si and oxide of Eu are prepared beforehand. While it is preferable to refine these materials, commercialized materials may also be used.

First, nitride of Sr is crushed (P1). As the nitride of Sr, $Sr_3N_2$ may be used. Alternatively, compounds such as an imide compound, amide compound or oxide may also be used. An Sr compound used as stock material may include B, Ga or the like.

Then nitride of Si is crushed (P2). As the nitride of Si, $Si_3N_4$ is preferably used. Alternatively, a simple substance, nitride, an imide compound or amide compound may also be used, such as $Si(NH_2)_2$, $Mg_2Si$, $Ca_2Si$ or SiC. While purity of Si in a stock material is preferably at least 3N, the stock material may include B, Ga or the like.

Then oxide of Si ($SiO_2$) is crushed (P3). As the oxide of Si, $SiO_2$ is preferably used. Commercialized material (Silicon Dioxide 99.9%, 190-09072 manufactured by Wako Pure Chemicals Industries, Ltd.) is used in this case.

Then oxide of Eu is crushed (P4). As the oxide of Eu, $Eu_2O_2$ is preferably used. Alternatively, a nitride, imide compound or amide compound may also be used. Besides europium oxide, use of europium nitride is particularly preferable, because a product contains oxygen or nitride.

The nitride of Sr ($Sr_3N_2$), nitride of Si ($Si_3N_4$), oxide of Si ($SiO_2$) and oxide of Eu ($Eu_2O_2$) are weighed for predetermined molar ratios so as to obtain predetermined mix proportions, and are mixed (P5).

A resulting mixture of nitride of Sr, nitride of Si, oxide of Si and oxide of Eu is put into a crucible and fired (P6). Firing the mixture produces an oxynitride-based fluorescent material having composition of $SrSi_2O_2N_2$:Eu (P7).

Reaction of producing the oxynitride-based fluorescent material by firing is represented by reaction scheme 1.

$$\left(\frac{1-2a}{3}\right)Sr_3N_2 + \left(\frac{2+3a}{6}\right)Si_3N_4 + \quad \text{[Chemical Formula 1]}$$

-continued
$$\left(\frac{2-3a}{2}\right)SiO_2 + aEu_2O_3 \rightarrow$$
$$Sr_{(1-2a)}Eu_{2a}Si_2O_2N_2 + \frac{a}{3}N_2$$

[$CaSi_2O_2N_2$:Eu]

$CaSi_2O_2N_2$:Eu is produced similarly as follows. Nitride of Ca, nitride of Si, oxide of Si and oxide of Eu are mixed in predetermined proportions. The nitride of Ca, nitride of Si, oxide of Si and oxide of Eu are prepared beforehand. While it is preferable to refine these materials, commercialized materials may be used. Description herein begins with a process of producing nitrides of Ca and Si.

First, stock material Ca is crushed. While Ca is preferably supplied in a form of a simple substance, compounds such as an imide compound, amide compound or CaO may also be used. The stock material Ca may include B, Ga or the like. The stock material Ca is crushed in a glove box in an argon atmosphere. A mean particle size of crushed Ca is preferably in a range from about 0.1 μm to 15 μm, but is not limited to this range. Purity of Ca is preferably at least 2N, but is not limited to this level.

The stock material Ca is nitrided in a nitrogen atmosphere. This reaction is represented by reaction scheme 2.

$$3Ca + N_2 \rightarrow Ca_3N_2 \quad \text{[Chemical Formula 2]}$$

Nitride of Ca can be made by nitriding Ca in a nitrogen atmosphere at a temperature from 600 to 900° C. for 5 hours. Nitride of Ca is preferably of high purity, but commercialized material may also be used.

Nitride of Ca is crushed in a glove box in an argon atmosphere or a nitrogen atmosphere.

Stock material Si is crushed. While Si is preferably supplied in a form of a simple substance, compounds such as a nitride, imide compound, amide compound or the like may also be used, such as $Si_3N_4$, $Si(NH_2)_2$, $Mg_2Si$, $Ca_2Si$ or SiC. While purity of stock material Si is preferably at least 3N, the stock material may include B, Ga or the like. Si is also crushed in a glove box in an argon atmosphere or a nitrogen atmosphere, similarly to the stock material Ca. A mean particle size of the Si compound is preferably in a range from about 0.1 μm to 15 μm.

The stock material Si is nitrided in a nitrogen atmosphere. This reaction is represented by reaction scheme 3.

$$3Si + 2N_2 \rightarrow Si_3N_4 \quad \text{[Chemical Formula 3]}$$

Silicon Si is also nitrided in a nitrogen atmosphere at a temperature from 800 to 1200° C. for 5 hours to thereby obtain silicon nitride. Silicon nitride used in the present invention is preferably of high purity, but commercialized material may also be used.

Nitride of Si is crushed similarly.

For the oxide of Si ($SiO_2$), commercialized material (Silicon Dioxide 99.9%, 190-09072 manufactured by Wako Pure Chemicals Industries, Ltd.) is used.

The stock materials refined or produced as described above are weighed to predetermined molar ratios and mixed.

A resulting mixture of nitride of Ca, nitride of Si, oxide of Si and oxide of Eu is put into a crucible and fired at about 1500° C. in an ammonia atmosphere, thereby producing an oxynitride-based fluorescent material having a composition of $CaSi_2O_2N_2$:Eu.

Reaction of producing the oxynitride-based fluorescent material by firing is represented by reaction scheme 4.

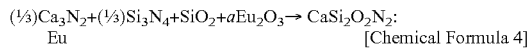
[Chemical Formula 4]

The composition described above is a typical composition presumed from proportions of mixing the materials, and a fluorescent material of a composition slightly different from the above composition has satisfactory properties for practical use. A composition of the fluorescent material obtained can be changed by changing proportions of mixing the stock materials.

Firing can be performed in a tubular furnace, compact furnace, induction furnace or metal furnace. While there is no limitation to a firing temperature, it is preferable to fire in a temperature range from 1200 to 1700° C., and more preferably from 1400 to 1700° C. Material to make the fluorescent material 11 is preferably fired in a crucible or boat made of boron nitride (BN). Besides a crucible made of boron nitride, a crucible made of alumina ($Al_2O_3$) may also be used. A reducing atmosphere is a nitrogen atmosphere, nitrogen-hydrogen atmosphere, ammonia atmosphere, inert gas atmosphere such as argon or the like.

(2) Method of Producing $L_XM_YQ_TO_ZN_{(2/3)X+(4/3)Y+T-(2/3)Z}$:R

Now a method of producing the oxynitride-based fluorescent material represented by $L_XM_YQ_TO_ZN_{(2/3)X+(4/3)Y+T-(2/3)Z}$:R will be described by way of $Sr_X-Si_YB_TO_ZN_{(2/3)X+(4/3)Y+T-(2/3)Z-\alpha}$:Eu as an example.

The method of producing $Sr_XSi_YB_TO_ZN_{(2/3)X+(4/3)Y-(2/3)Z-\alpha}$:Eu is similar to that for $SrSi_2O_2N_2$:Eu, but is different in that a compound of B, $H_3BO_3$, is mixed with oxide of Eu in a dry process beforehand.

First, a mixture of Eu and B is crushed. A mean particle size of this crushed mixture of Eu and B is preferably in a range from about 0.1 to 15 μm. Then, similarly to the process of producing $SrSi_2O_2N_2$:Eu, nitride of Sr, nitride of Si, oxide of Si and oxide of Eu containing B are mixed and fired, thereby making a desired oxynitride-based fluorescent material.

Besides europium oxide, metal europium or europium nitride may also be used as a compound of Eu which is mixed with the compound of B. An imide compound or amide compound of Eu may also be used. While europium oxide is preferably of high purity, commercialized material may also be used. The compound of B is mixed in a dry process, but a wet process may also be employed. Since the mixture may be easily oxidized in some cases, it is preferable to mix the materials in an Ar atmosphere, a nitrogen atmosphere or in a glove box.

Q in $L_XM_YQ_TO_ZN_{(2/3)X+(4/3)Y+T-(2/3)Z}$:R may be Li, Na, K or the like instead of B, in which case a compound of such an element may be mixed with the compound of Eu instead of the compound of B. For example, such compounds may be used as $LiOH.H_2O$, $Na_2CO_3$, $K_2CO_3$, RbCl, $Mg(NO_3)_2$, $CaCl_2.6H_2O$, $SrCl_2.6H_2O$, $BaCl_2.2H_2O$, $TiOSO_4.H_2O$, $ZrO(NO_3)_2$, $HfCl_4$, $MnO_2$, $ReCl_5$, $Cu(CH_3COO)_2H_2O$, $AgNO_3$, $HAuCl_4.4H_2O$, $Zn(NO_3)_2.6H_2O$, $GeO_5$, $Sn(CH_3COO)_2$.

<Nitride-Based Fluorescent Material>

Nitride-based fluorescent material is preferably alkaline earth silicate fluorescent material, and more preferably alkaline earth metal silicon oxynitride fluorescent material. For an alkaline earth metal silicon oxynitride fluorescent material, $M_2Si_5N_8$:Eu, $MSi_7N_{10}$:Eu, $M_{1.8}Si_5O_{0.2}N_8$:Eu, $M_{0.9}Si_7O_{0.1}N_{10}$:Eu (M is at least one element selected from Sr, Ca, Ba, Mg and Zn) may be used. The nitride-based fluorescent material preferably contains B in order to improve luminance of light emission. Concentration of B (boron) is preferably in a range from 1 to 10000 ppm. Luminance of light emission can be improved more effectively by containing boron with a concentration in this range.

The nitride-based fluorescent material is represented by a general formula $L_XM_YN_{(2/3)X+(4/3)Y}$:R or $L_XM_YO_ZN_{(2/3)X+(4/3)Y-(2/3)Z}$:R. L in this formula is at least one Group II element selected from among the group consisting of Be, Mg, Ca, Sr, Ba and Zn. M is at least one Group IV element selected from among the group consisting of C, Si, Ge, Sn, Ti, Zr and Hf. R is at least one rare earth element selected from among the group consisting of Sc, Y, La, Ce, Pr, Nd, Sm, Eu, Gd, Tb, Dy, Ho, Er and Lu. X, Y and Z satisfy the relations $0.5 \leq X \leq 3$, $1.5 \leq Y \leq 8$ and $0 < Z \leq 3$. The nitride-based fluorescent material preferably contains B with a concentration preferably in a range from 1 to 10000 ppm.

The nitride-based fluorescent material has a composition represented by a general formula $L_XM_YN_{(2/3)X+(4/3)Y}$:R or $L_XM_YO_ZN_{(2/3)X+(4/3)Y-(2/3)Z}$:R wherein Mn or B is included with a concentration from 1 to 10000 ppm. Boron may be added in a form of simple substance, boride, boron nitride, boron oxide, borate or the like.

L is at least one Group II element selected from among the group consisting of Be, Mg, Ca, Sr, Ba and Zn. While Ca or Sr may be used individually, the elements may be used in combinations such as Ca and Sr, Ca and Mg, Ca and Ba or Ca, Sr and Ba. Such a composition may also be employed that contains either Ca or Sr and part of Ca or Sr is substituted by Be, Mg, Ba or Zn. When two or more elements are mixed, proportions may be varied as required. A peak emission wavelength shifts to a longer side when Sr and Ca are mixed, compared to a case where either Sr or Ca is used. The peak emission wavelength shifts to the longer side when Sr and Ca are mixed with a molar ratio of 7:3 or 3:7, compared to a case where only Sr or Ca is used. The peak emission wavelength shows a maximum shift to the longer side when Sr and Ca are mixed with a molar ratio of about 5:5.

M is at least one Group IV element selected from among the group consisting of C, Si, Ge, Sn, Ti, Zr and Hf. While Si may be used individually, combinations such as C and Si, Ge and Si, Zn and Si, Ge and Ti and Si may also be used. A part of Si may be substituted by C, Ge, Sn, Ti, Zr or Hf. When a mixture that contains Si as an indispensable element is used, mix proportions may be varied as required. For example, 95% by weight of Si and 5% by weight of Ge may be mixed.

R is at least one kind of rare earth element selected from among the group consisting of Sc, Y, La, Ce, Pr, Nd, Sm, Eu, Gd, Tb, Dy, Ho, Er, Yb and Lu. While Eu may be used individually, combinations such as Ce and Eu, Pr and Eu, or La and Eu may also be used. Use of Eu as an activator, in particular, enables it to provide nitride-based fluorescent material that has a peak emission wavelength in the yellow to red region and excellent emission characteristics. Part of Eu may be substituted by another element for co-activation, so as to control a color tone and emission characteristics. When a mixture that contains Eu as an indispensable element is used, mix proportions may be varied as required. In the examples described below, europium Eu, a rare earth element, is manly used for a luminescence center. Europium has main energy levels, divalent and trivalent. $Eu^{2+}$ is used as an activator for a fluorescent material based on alkaline earth metal silicon nitrate. $Eu^{2+}$ is easily oxidized and is commercialized in the trivalent form of $Eu_2O_3$. However, it is difficult to obtain a satisfactory fluorescent material with the commercialized form of $Eu_2O_3$ because of excessive contribution of O. Therefore, it is preferable to remove O from $Eu_2O_3$. For example, europium as a simple substance or europium nitride is preferably used.

By adding boron, such effects can be achieved as acceleration of diffusion of $Eu^{2+}$ and improvements in luminance of light emission, energy efficiency and quantum efficiency. It is also made possible to increase particle sizes and improve emission characteristics. Similar effects can be achieved also by adding manganese. Composition of the nitride-based fluorescent material contains oxygen.

Figure 12:
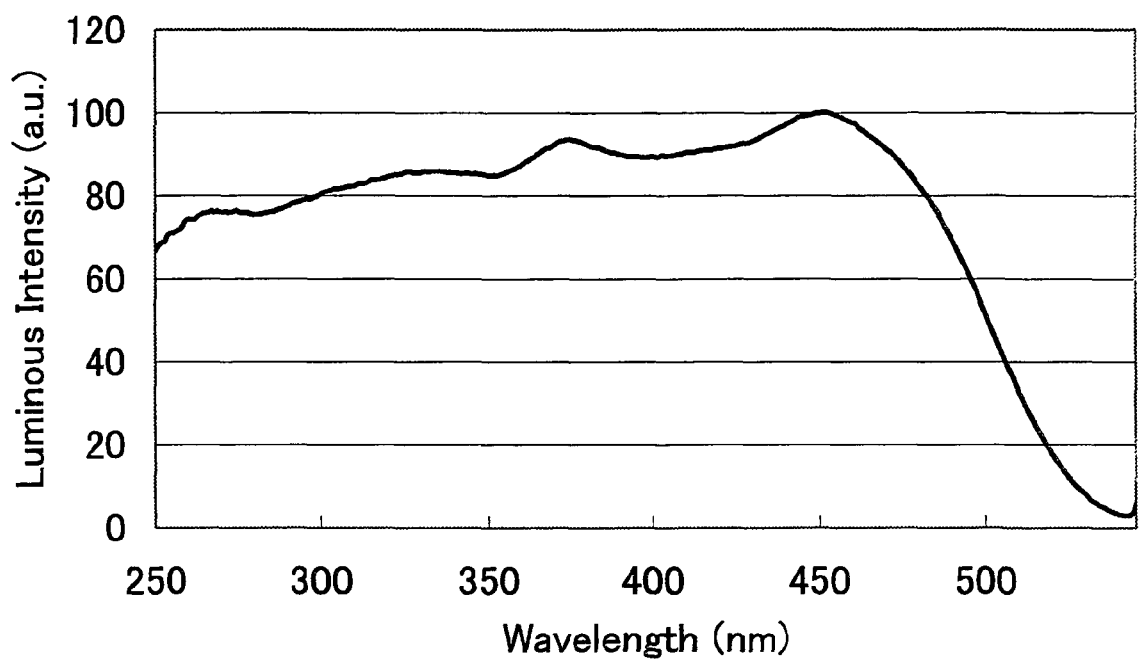
FIG. 12 shows a normalized excitation spectrum of nitride-based fluorescent material ($Sr_2Si_5N_8$:Eu).
Figure 13:
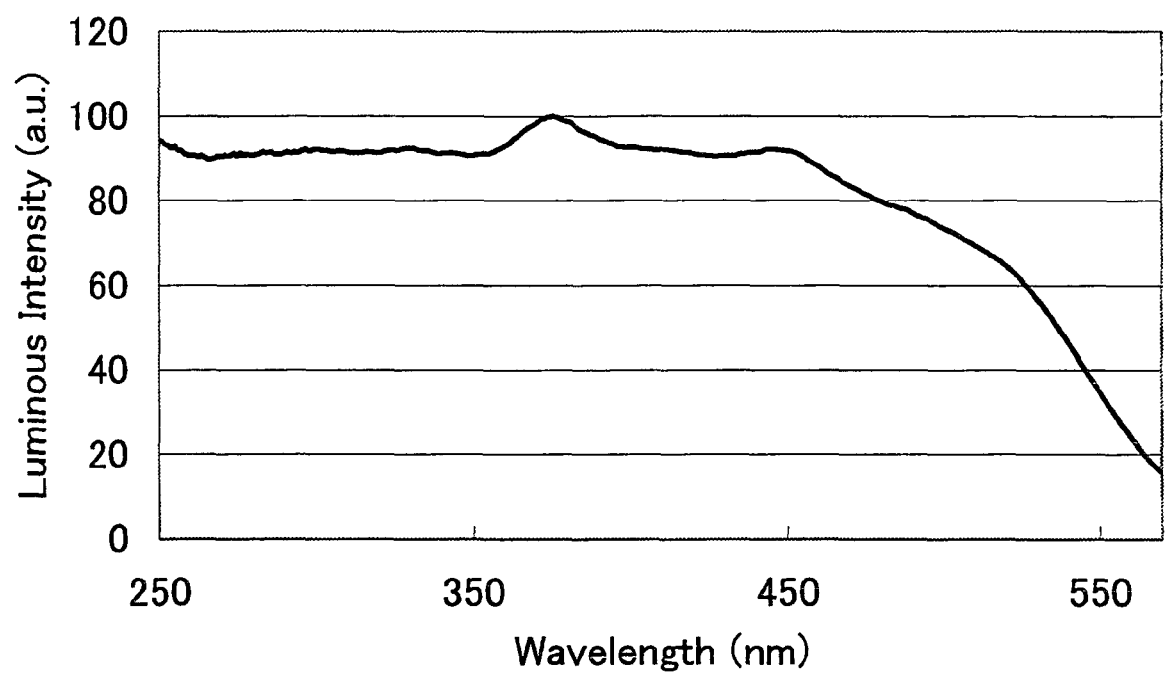
FIG. 13 shows a normalized excitation spectrum of nitride-based fluorescent material ($Ca_2Si_5N_8$:Eu).
Figure 14:
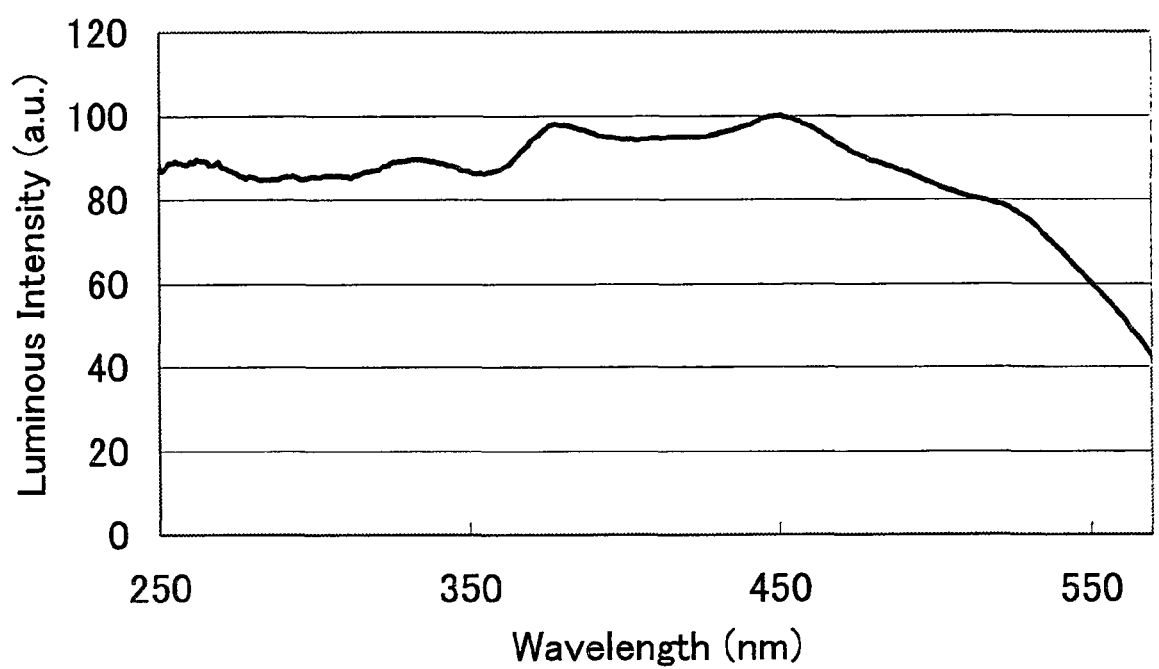
FIG. 14 shows a normalized excitation spectrum of nitride-based fluorescent material (($Ca, Sr)_2Si_5N_8$:Eu).

Specific examples of the nitride-based fluorescent material will now be described below. Excitation spectra of these nitride-based fluorescent materials will be described with reference to the drawings. FIG. 12 shows normalized excitation spectrum of nitride-based fluorescent material $(Sr_2Si_5N_8:Eu)$. FIG. 13 shows a normalized excitation spectrum of nitride-based fluorescent material $(Ca_2Si_5N_8:Eu)$. FIG. 14 shows a normalized excitation spectrum of nitride-based fluorescent material $((Ca, Sr)_2Si_5N_8:Eu)$.

$[(Ca_{0.97}Eu_{0.03})_2Si_5N_8]$

As an example of a nitride-based fluorescent material, $(Ca_{0.97}Eu_{0.03})_2Si_5N_8$ will be described below. Table 21 shows emission characteristics of $(Ca_{0.97}Eu_{0.03})_2Si_5N_8$ containing B with different concentrations. In Table 21, luminance of light emission and quantum efficiency are shown in relative values to a nitride-based fluorescent material of fluorescent material 49. Fluorescent materials 49 to 52 include Eu with a concentration 0.03 times a molar concentration of Ca.

TABLE 21

| Example | Concentration of B (ppm) | Color tone x | Color tone y | Emission luminance (%) | Quantum efficiency (%) |
|---|---|---|---|---|---|
| 49 | 10 | 0.596 | 0.398 | 100 | 100 |
| 50 | 200 | 0.598 | 0.397 | 107 | 108 |
| 51 | 500 | 0.598 | 0.396 | 112 | 113 |
| 52 | 1000 | 0.598 | 0.396 | 110 | 112 |

$(Ca_{0.97}Eu_{0.03})_2Si_5N_8$ was made as follows.

First, stock material Ca was crushed to particle sizes from 1 μm to 15 μm, and was nitrided in a nitrogen atmosphere. Then a nitride of Ca was crushed to particle sizes from 0.1 μm to 10 μm. 20 g of stock material Ca was weighed and was nitrided.

Similarly, stock material Si was crushed to particle sizes from 1 μm to 15 μm, and was nitrided in nitrogen atmosphere. Then a nitride of Si was crushed to particle sizes from 0.1 μm to 10 μm. 20 g of stock material Si was weighed and was nitrided.

Then $Eu_2O_3$ and $H_3BO_3$ were mixed in a wet process. 20 g of $Eu_2O_3$ and a predetermined quantity of $H_3BO_3$ were weighed. After solving $H_3BO_3$, a solution was mixed with $Eu_2O_3$, and this mixture was dried. After drying, the mixture was fired in an oxidation atmosphere at a temperature from 700 to 800° C. for 5 hours, thereby producing europium oxide with B added. A mixture of Eu and B was crushed to particle sizes from 0.1 μm to 10 μm.

Nitride of Ca, nitride of Si and the mixture of Eu and B were mixed in a nitrogen atmosphere. Fluorescent materials 49 to 52 were prepared by adjusting proportions of calcium nitride $Ca_3N_2$, silicon nitride $Si_3N_4$, and europium oxide $Eu_2O_3$ so that a molar ratio of the elements becomes Ca:Si:Eu=1.94:5:0.06. $Ca_3N_2$ (molecular weight 148.26) and $Si_3N_4$ (molecular weight 140.31) were weighed and mixed with the mixture of Eu and B in the proportions described above. B was added in concentrations of 10 ppm, 200 ppm, 500 ppm and 1000 ppm.

This mixture was fired in a crucible in an ammonia atmosphere by gradually raising a temperature from room temperature and maintaining the temperature at 1600° C. for about 5 hours, and then gradually lowering the temperature to room temperature. Element B that has been added generally remains in this fired material, but part of B may scatter during firing so that B is included with a lower concentration in a final composition.

Luminance of light emission and quantum efficiency of the nitride-based fluorescent material of fluorescent materials 49 to 52 are shown in relative values to those of fluorescent material 49 in percentage. As can be seen from Table 21, both luminance of light emission and quantum efficiency showed high values when at most 10000 ppm B, especially 1 to 1000 ppm of B, was included.

Mean particle sizes of fluorescent materials 49 to 52 were in a range from 6.3 to 7.8 μm. Fluorescent materials 49 to 52 included 0.5 to 1.2% by weight of oxygen. The nitride-based fluorescent materials of fluorescent materials 49 to 52 were fired in a crucible made of boron nitride in an ammonia atmosphere. The nitride-based fluorescent materials of fluorescent materials 49 to 52 showed very good temperature characteristics. The nitride-based fluorescent material of fluorescent material 51 showed a temperature characteristic of 97% at 100° C. and 70% at 200° C. The nitride-based fluorescent materials of fluorescent materials 49 to 52 have peak emission wavelengths at around 609 nm when excited by an excitation light source that emits light at 460 nm.

$[(Sr_{0.97}Eu_{0.03})_2Si_5N_8]$

As an example of a nitride-based fluorescent material, $(Sr_{0.97}Eu_{0.03})_2Si_5N_8$ will be described below. Table 22 shows emission characteristics of $(Sr_{0.97}Eu_{0.03})_2Si_5N_8$ containing B with different concentrations. In Table 22, luminance of light emission and quantum efficiency are shown in relative values to a nitride-based fluorescent material of fluorescent material 53. Fluorescent materials 53 to 58 include Eu with a concentration 0.03 times a molar concentration of Sr.

TABLE 22

| Example | Concentration of B (ppm) | Color tone x | Color tone y | Emission luminance (%) | Quantum efficiency (%) |
|---|---|---|---|---|---|
| 53 | 10 | 0.618 | 0.375 | 100 | 100 |
| 54 | 100 | 0.619 | 0.374 | 104 | 107 |
| 55 | 200 | 0.620 | 0.373 | 105 | 109 |
| 56 | 500 | 0.618 | 0.376 | 106 | 105 |
| 57 | 1000 | 0.620 | 0.373 | 97 | 102 |
| 58 | 5000 | 0.625 | 0.368 | 95 | 110 |

Fluorescent materials 53 to 58 were made in substantially the same process as that for fluorescent materials 49 to 52, except for using Sr instead of Ca used in fluorescent materials 49 to 52, and firing at about 1350° C. unlike fluorescent materials 49 to 52 that were fired at about 1600° C.

As can be seen from Table 22, both luminance of light emission and quantum efficiency showed high values when at most 10000 ppm B was included, particularly when B concentration was from 10 ppm to 5000 ppm. Mean particle sizes of fluorescent materials 53 to 58 were in a range from 2.1 to 4.7 μm. Oxygen concentration was from 0.3 to 1.1% by weight.

Now examples with different firing temperatures will be described below.

Table 23 shows emission characteristics of $(Sr_{0.97}Eu_{0.03})_2Si_5N_8$ fired at a firing temperature different from that of fluorescent materials 52 to 58. While fluorescent materials 52 to 58 were fired at 1350° C., fluorescent materials 59 to 63 were fired at about 1600° C. In Table 23, luminance of light emission and quantum efficiency are shown in relative values to a nitride-based fluorescent material of fluorescent material 59. Fluorescent materials 59 to 63 include Eu with concentration 0.03 times a molar concentration of Sr.

TABLE 23

| Example | Concentration of B (ppm) | Color tone x | Color tone y | Emission luminance (%) | Quantum efficiency (%) |
|---|---|---|---|---|---|
| 59 | 10 | 0.629 | 0.364 | 100 | 100 |
| 60 | 100 | 0.628 | 0.365 | 101 | 101 |
| 61 | 500 | 0.629 | 0.364 | 102 | 103 |
| 62 | 1000 | 0.628 | 0.365 | 98 | 98 |
| 63 | 5000 | 0.629 | 0.364 | 92 | 97 |

As can be seen from Table 23, both luminance of light emission and quantum efficiency showed high values when at most 1000 ppm B was included, particularly when B concentration was from 10 ppm to 500 ppm. Mean particle sizes of nitride-based fluorescent material of fluorescent materials 59 to 63 were in a range from 3.2 to 3.9 µm.

<Method of Producing Nitride-Based Fluorescent Material>

Now a method of producing nitride-based fluorescent material $Ca_2Si_5N_8$:Eu that contains B will be described below, but the present invention is not limited to this method.

First, stock material Ca is crushed (P11). The stock material Ca may be in a form of a simple substance or compounds such as an imide compound and amide compound.

The stock material Ca is nitrided in a nitrogen atmosphere (P12). This reaction is represented by reaction scheme 5.

$$3Ca+N_2 \rightarrow Ca_3N_2 \quad \text{[Chemical Formula 5]}$$

Ca is nitrided in a nitrogen atmosphere at a temperature from 600 to 900° C. for 5 hours, so as to obtain nitride of Ca. The nitride of Ca is then crushed (P13).

Meanwhile stock material Si is crushed (P14). The stock material Si may be supplied in a form of a simple substance, nitride compound, imide compound or amide compound, such as $Si_3N_4$, $Si(NH_2)_2$ or $Mg_2Si$.

The stock material Si is nitrided in a nitrogen atmosphere (P15). This reaction is represented by reaction scheme 6.

$$3Si+2N_2 \rightarrow Si_3N_4 \quad \text{[Chemical Formula 6]}$$

Si is also nitrided in a nitrogen atmosphere at a temperature from 800 to 1200° C. for 5 hours, so as to obtain silicon nitride. The silicon nitride is then crushed (P16).

Then $Eu_2O_3$ and $H_3BO_3$ are mixed (P17). While europium oxide is used as a compound of Eu, metal europium or europium nitride may also be used. An imide compound or amide compound may also be used to supply Eu. A mixture of $Eu_2O_3$ and $H_3BO_3$ is fired in an oxidizing atmosphere (P18). A mixture of Eu and B is crushed (P19). After crushing, nitride of Ca, nitride of Si and the mixture of Eu and B are mixed (P20). Processes P17 to P19 may be omitted so as to mix nitride of Ca, nitride of Si, $Eu_2O_3$ and $H_3BO_3$ in process P20.

Nitride of Ca, nitride of Si and the mixture of Eu and B are fired in an ammonia atmosphere (P21), so as to make fluorescent material represented by $Ca_2Si_5N_8$:Eu containing B added thereto (P22). Reaction of forming this nitride-based fluorescent material by firing is represented by reaction scheme 7.

$$\frac{1.985}{3}Ca_3N_2 + \frac{5}{3}Si_3N_4 + \frac{0.015}{2}Eu_2O_3 \rightarrow \quad \text{[Chemical Formula 7]}$$
$$Ca_{1.985}Eu_{0.015}Si_5N_{7.990}O_{0.0225}$$

A composition of this resultant fluorescent material can be changed by changing mix proportions of the stock materials.

While firing can be performed at temperatures from 1200 to 2000° C., a firing temperature is preferably in a range from 1400 to 1800° C., in a reducing atmosphere that contains at least one selected from nitrogen, hydrogen, argon, carbon dioxide, carbon monoxide and ammonia. Firing may also be performed in a reducing atmosphere other than the above.

A desired nitride-based fluorescent material can be obtained in the process described above.

<Other Fluorescent Material>

Fluorescent material 11 may also be made by combining an oxynitride-based fluorescent material and a nitride-based fluorescent material in such forms as alkaline earth metal halogen apatite fluorescent material, alkaline earth metal boric acid halide salt fluorescent material, alkaline earth metal aluminate fluorescent material, silicate of alkali earth element, rare earth oxysulfide, sulfide of alkaline earth element, alkaline earth thiogallate, alkaline earth silicon nitride or germanate that is activated mainly by a lanthanoid element such as Eu or transition metal such as Mn, or rare earth aluminate or rare earth silicate activated mainly by a lanthanoid element such as Ce, or at least one kind selected from organic material and an organic complex activated mainly by a lanthanoid element such as Eu. For example, the following fluorescent materials may be used, but the present invention is not limited to these examples.

Alkaline earth halogen apatite fluorescent materials activated mainly by a lanthanoid element such as Eu or transition metal element such as Mn include $M_5(PO_4)_3X$:R (M is at least one selected from among Sr, Ca, Ba, Mg and Zn; X is at least one selected from among F, Cl, Br and I; and R is at least one selected from among Eu, Mn and a combination of Eu and Mn).

Alkaline earth halogen apatite fluorescent materials activated mainly by a lanthanoid element such as Eu or a transition metal element such as Mn include $M_{10}(PO_4)_6X_2$:R(M is at least one selected from among Sr, Ca, Ba, Mg and Zn; X is at least one selected from among F, Cl, Br and I; and R is a rare earth element containing Eu as indispensable element).

Alkaline earth metal boric acid halide salt fluorescent materials include $M_2B_5O_9X$:R (M is at least one kind selected from among Sr, Ca, Ba, Mg and Zn; X is at least one selected from among F, Cl, Br and I; and R is at least one selected from among Eu, Mn and combination of Eu and Mn).

Alkaline earth metal aluminate fluorescent materials include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R (R is at least one selected from among Eu, Mn and a combination of Eu and Mn).

Rare earth oxysulfide fluorescent materials include $La_2O_2S$:Eu, $Y_2O_2S$:Eu and $Gd_2O_2S$:Eu.

Rare earth aluminate fluorescent materials activated mainly by a lanthanoid element such as Ce include YAG fluorescent materials having a garnet structure represented by formulae $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y,Gd)_3(Al,Ga)_5O_{12}$:Ce, $Tb_3Al_5O_{12}$:Ce, $Y_3Al_5O_{12}$:Ce, Pr.

Other fluorescent materials include ZnS:Ag, ZnS:Cu, ZnS: Mn, $Zn_2GeO_4$:Mn, $MGa_2S_4$:Eu (M is at least one selected from among Sr, Ca, Ba, Mg and Zn; X is at least one selected from among F, Cl, Br and I). $MSi_7N_{10}$:Eu, $M_{1.8}Si_5O_{0.2}N_8$:Eu and $M_{0.9}Si_7O_{0.1}N_{10}$:Eu (M is at least one selected from among Sr, Ca, Ba, Mg and Zn) may also be used.

The fluorescent materials described above may include, instead of, or in addition to Eu, at least one selected from among Tb, Cu, Ag, Au, Cr, Nd, Dy, Co, Ni, Ti. Other than those described above, fluorescent materials having similar properties and effects may also be used.

For these fluorescent materials 10, such fluorescent materials that have emission spectra in yellow, red, green and blue regions, and fluorescent materials that have emission spectra in intermediate colors of yellow, blue-green and orange regions may also be used. Light emitting devices that emit light of various colors can be made by combining such fluorescent materials as described above and oxynitride-based fluorescent material or nitride-based fluorescent material.

Fourth Embodiment

In this embodiment, a light emitting device uses at least two kinds of direct-excitation fluorescent material (first fluorescent material) that are substantially directly excited by light emitted from an excitation source having a principal emission peak in a range from 250 nm to 420 nm, and indirect-excitation fluorescent material (a second fluorescent material) that is excited by a part of light emitted by the at least two kinds of the direct-excitation fluorescent material. The at least two kinds of the direct-excitaion fluorescent material include at least one kind of oxynitride-based fluorescent material or nitride-based fluorescent material having crystallinity. The indirect-excitation fluorescent material is preferably a YAG-based phosphor. Other points are similar as the Third Embodiment.

Specifically, as direct-excitation fluorescent material, (a) oxynitride-based fluorescent material or nitride-based fluorescent material, and (b) at least one phosphor selected from the group consisting of $(M1_{1-a}Eu_a)_{10}(PO_4)_6Q_2$ (M1 represents at least one element selected from among Mg, Ca, Ba, Sr and Zn, Q represents at least one element selected from among F, Cl, Br and I, and a is a number satisfying $0.0001 \leq a \leq 0.5$), $(M1_{1-a}Eu_a)_2B_5O_9Q$ (M1 represents at least one element selected from among Mg, Ca, Ba, Sr and Zn, Q represents at least one element selected from among F, Cl, Br and I, and a is a number satisfying $0.0001 \leq a \leq 0.5$), $M3_{1-1}Eu_aMgAl_{10}O_{17}$ (M3 represents at least one element selected from among the group consisting of Ca, Ba, Sr and Zn, and a is a number satisfying $0.0001 \leq a \leq 0.5$), $(M1_{1-a}Eu_a)_4Al_{14}O_{25}$ (M1 represents at least one element selected from among Mg, Ca, Ba, Sr and Zn, and a is a number satisfying $0.0001 \leq a \leq 0.5$ and $0.0001 \leq b \leq 0.5$), $M3_{1-a}Eu_aMg_{1-b}Mn_bAl_{10}O_{17}$ (M3 represents at least one element selected from among the group consisting of Ca, Ba, Sr and Zn, and a is a number satisfying $0.0001 \leq a \leq 0.5$) and $M1_{1-a}Eu_aAl_2O_4$ (M1 represents at least one element selected from among Mg, Ca, Ba, Sr and Zn, and a is a number satisfying $0.0001 \leq a \leq 0.5$) are used.

On the other hand, as the indirect-excitation fluorescent material, (c) $(Re_{1-x}Sm_x)_3(Al_{1-y}Ga_y)_5O_{12}$:Ce (Re represents at least one element selected from among Y, Gd and La, x is a number satisfying $0 \leq x < 1$ and y is a number satisfying $0 \leq y \leq 1$) is used.

This combination of fluorescent materials, combined with a light emitting element having a main emission peak in 250 to 420 nm, provides a white light emitting device with high luminous intensity and high color rendering.

Fifth Embodiment

In the light emitting device of the first and second embodiments, according to detail so far, a variation in color of emitted light (color deviation) due to a variation in a drive current of a light emitting element, and variation in the color of emitted light due to a difference in a drive mode (particularly a difference between DC drive and pulse drive), can be suppressed to extremely low levels, by using a plurality of fluorescent materials of the direct transition type.

Now more preferable embodiments will be described below that take into consideration variation in color of emitted light due to causes other than a variation in the drive current and difference in the drive mode.

In the light emitting device of the first to fourth embodiments, compositions of a plurality of fluorescent materials are preferably determined by taking into consideration dependency of excitation efficiency on an excitation wavelength, so as to prevent color deviation due to variation in the wavelength.

In case the light emitting device, as in the first to fourth embodiments, is constituted from a plurality of fluorescent materials, if two fluorescent materials have different degrees of dependency of excitation efficiency on the excitation wavelength, a blending ratio of light varies resulting in a variation of light color when an emission wavelength of the light emitting element varies.

However, color deviation due to variation in emission wavelength of the light emitting element can be prevented by setting a composition such that a blending ratio of light is maintained always constant within a variable range of emission wavelengths of the light emitting element, so that excitation efficiencies of the plurality of fluorescent materials vary in the same way.

A mechanism of preventing color deviation will now be described below by taking an example of a specific composition of fluorescent material.

Figure 15:
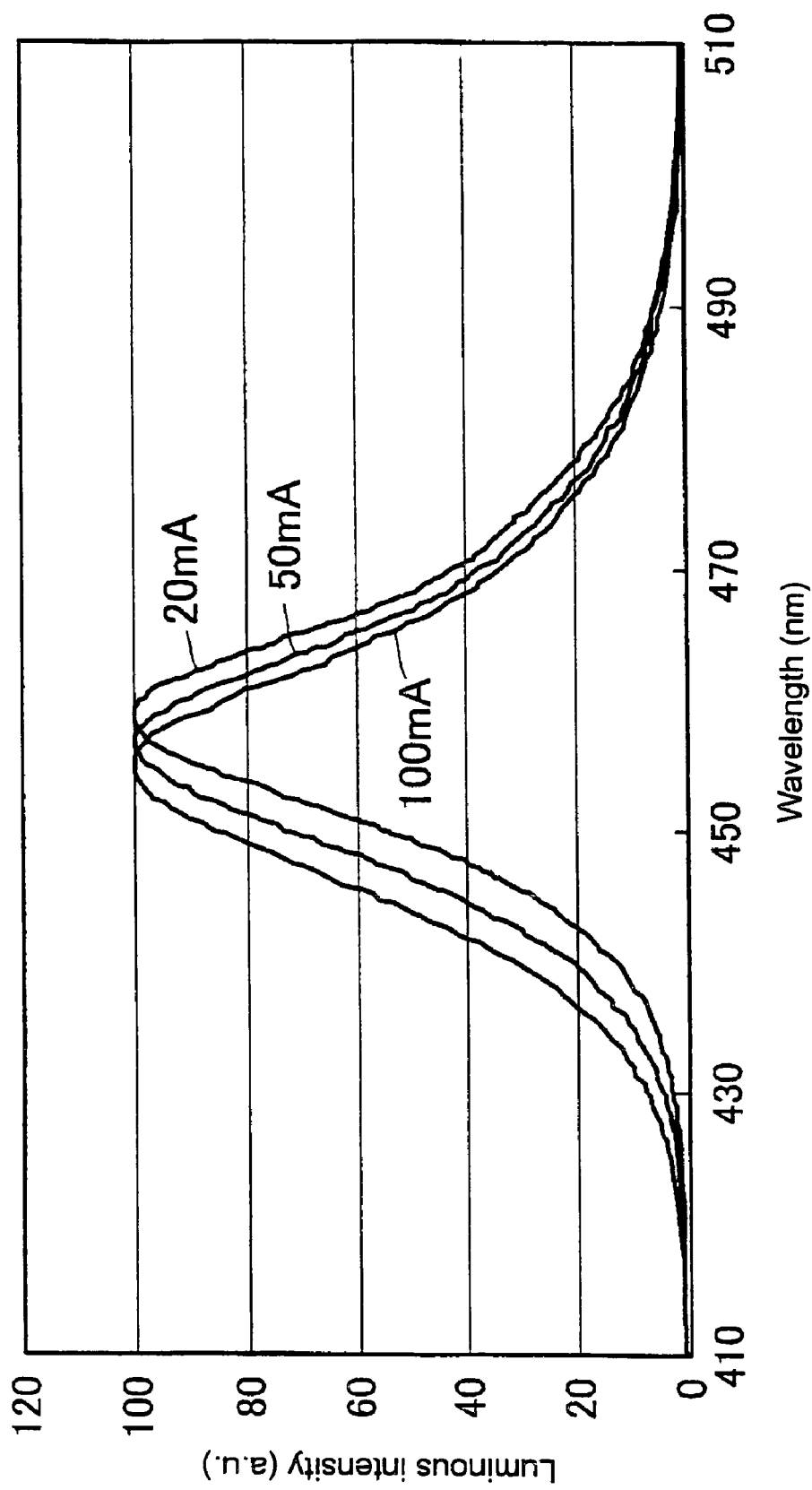
FIG. 15 shows a variation of emission spectrum when current supplied to a semiconductor light emitting element is changed.

Peak emission wavelength of a semiconductor light emitting element shifts toward shorter wavelengths when a current supplied thereto increases as shown in FIG. 15. This is because increasing current supply increases a current density and accordingly a band gap. A difference between a peak wavelength of an emission spectrum when the current density in the light emitting element is low and the peak wavelength of the emission spectrum when the current supply is increased is about 10 nm, for example, when the current is increased from 20 mA to 100 mA (FIG. 15).

Figure 16:
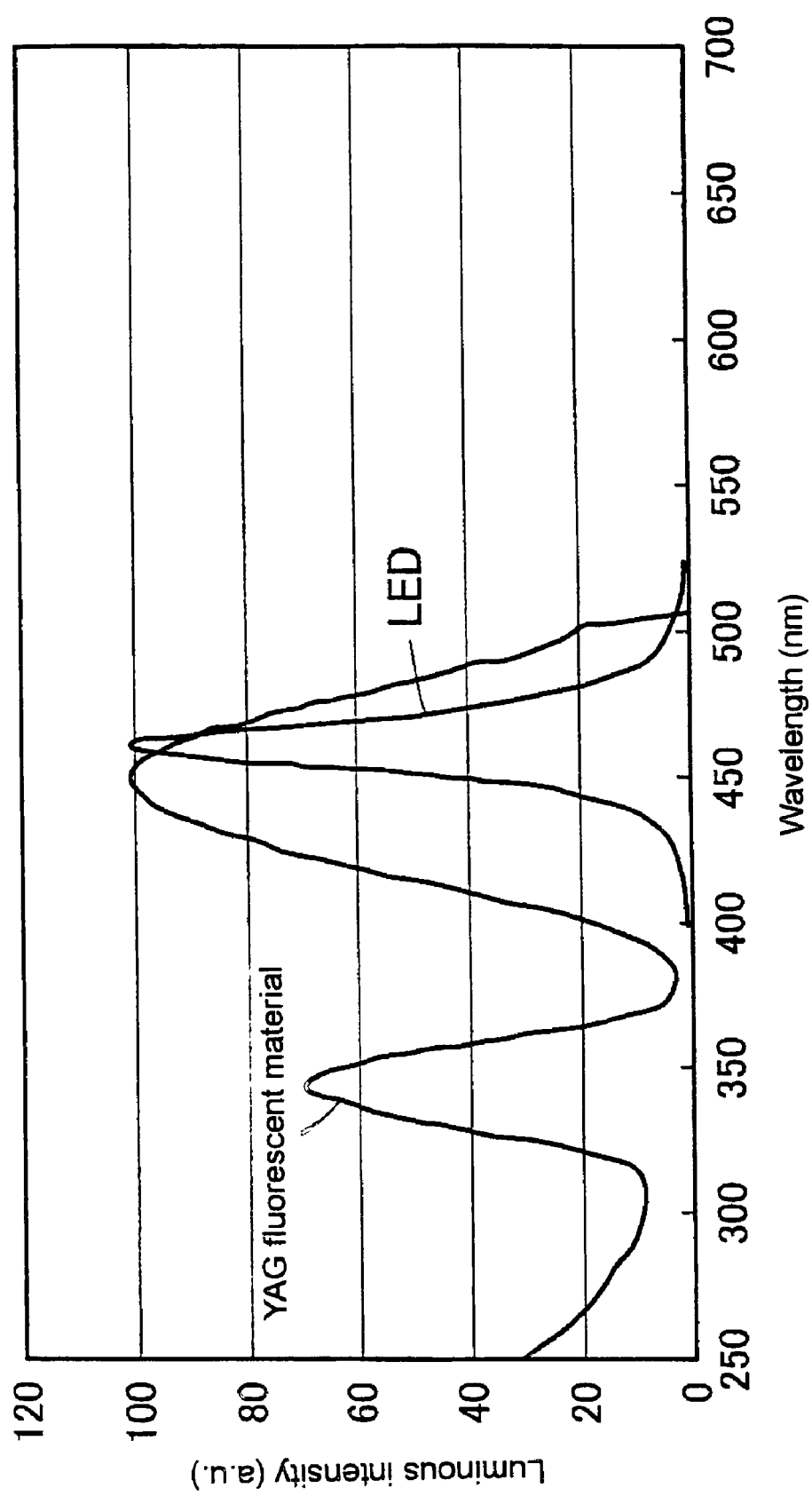
FIG. 16 shows an excitation spectrum of YAG fluorescent material.

On the other hand, while a peak wavelength of an emission spectrum of YAG fluorescent material having a composition of $Y_3(Al_{0.8}Ga_{0.2})_5O_{12}$:Ce (FIG. 16) is about 448 nm, emission intensity upon excitation with light of wavelength 460 nm is 95% of emission intensity upon excitation with light of wavelength 448 nm. Emission intensity of the YAG fluorescent material changes substantially linearly in a wavelength range from 448 nm to 460 nm.

Figure 17:
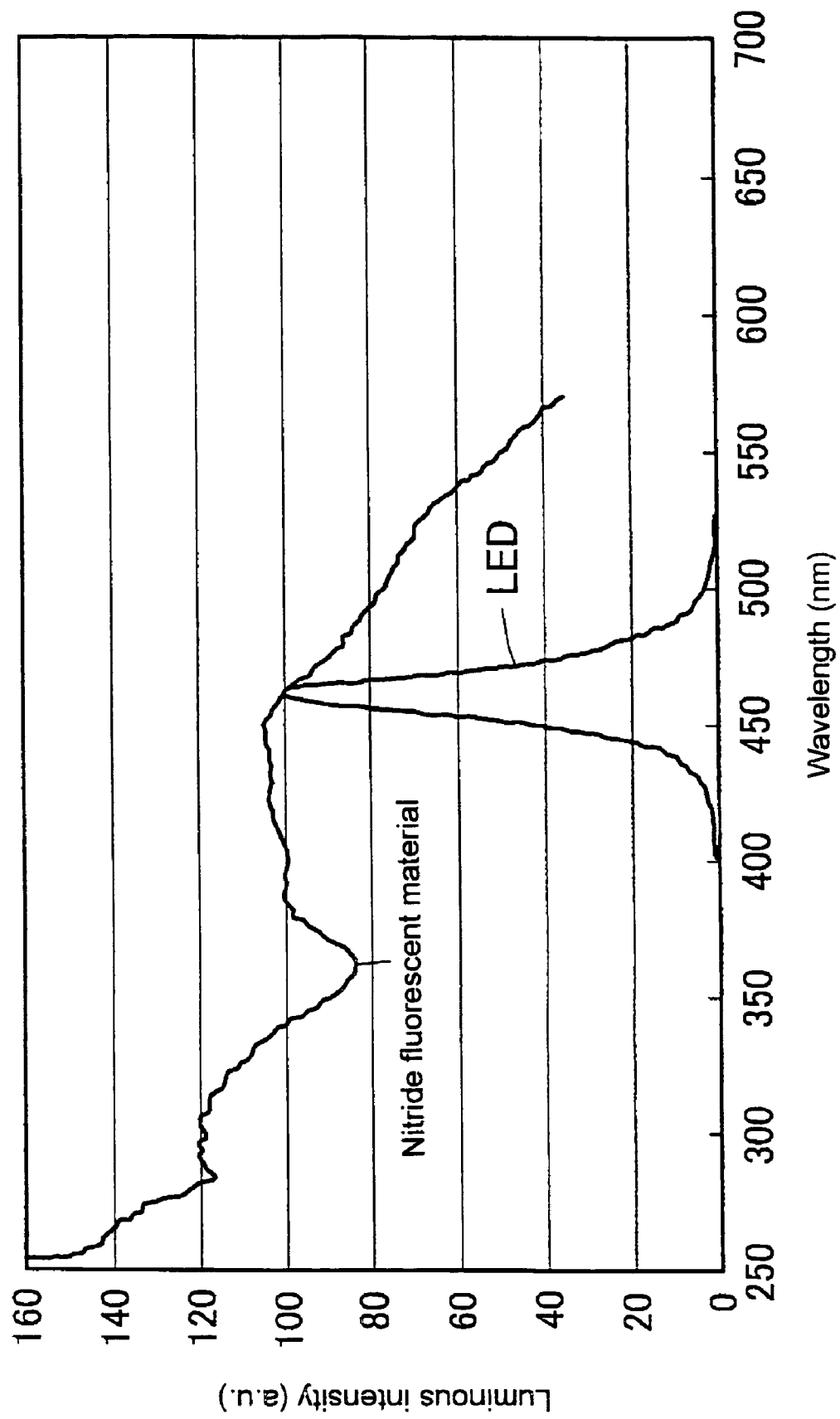
FIG. 17 shows an excitation spectrum of nitride fluorescent material.

On the other hand, while a peak wavelength of an emission spectrum of a nitride fluorescent material having composition of $(Sr_{0.579}Ca_{0.291}Eu_{0.03})_2Si_5N_8$ is about 450 nm, emission intensity upon excitation with light of wavelength 460 nm is 95% of the emission intensity upon excitation with light of wavelength 450 nm (FIG. 17). Emission intensity of this nitride fluorescent material also changes substantially linearly in a wavelength range from 448 nm to 460 nm.

In case a light emitting element that emits light with a peak emission of 460 nm immediately after current has been supplied (for example, with a small current of around 20 mA), is selected, a peak emission wavelength when current supplied thereto is increased to 100 mA becomes about 450 nm. However, there is no difference in a proportion of excitation efficiency of the nitride fluorescent material and the YAG fluorescent material between a case of exciting with light of wavelength 460 nm and a case of exciting with light of wavelength 450 nm.

As a result, an amount of change in the emission intensity becomes the same between the YAG fluorescent material and the nitride fluorescent material for a change in the emission wavelength of the light emitting element when the current supplied to the light emitting element is increased from 20 mA to 100 mA.

Therefore, even when the peak emission wavelength changes due to a change in the current supplied to the light emitting element, a proportion of the emission intensity of the YAG fluorescent material and the emission intensity of the nitride fluorescent material can be maintained constant, thus preventing color deviation from occurring.

When current supplied to the light emitting element is increased from 20 mA to 100 mA, for example, emission intensity of the light emitting element increases and the emission intensity of the YAG fluorescent material and the emission intensity of the nitride fluorescent material both increase, although a proportion of the emission intensity between the YAG fluorescent material and the nitride fluorescent material is maintained constant. As a result, although emission intensity of the light emitting device as a whole increases, color deviation does not occur.

For example, Examples 15 and 16 to be described later are light emitting devices that are constituted by selecting fluorescent materials having a luminescence center of the direct transition type taking into consideration dependency of excitation efficiency on an excitation wavelength. Examples 15 and 16 provide a better light source with less color deviation and less variation in color rendering property for a change in a current density, compared to the light emitting device of Comparative Example 5 wherein the dependency of excitation efficiency on the excitation wavelength is not taken into consideration.

The above discussion on the cases of using two fluorescent materials holds true also for a case of using three or more fluorescent materials.

The light emitting device constituted as described above can provide illumination free of color deviation even when used as an adjustable illumination light source, with smaller difference in color of emitted light between pulse drive and continuous emission.

Sixth Embodiment

In the first to fifth embodiments, color deviation due to temperature change can be prevented by determining a composition while taking a temperature dependency of emission intensities of the fluorescent materials into consideration. In this embodiment, compositions of fluorescent materials are determined so that changes in emission intensity due to a change in an ambient temperature are substantially the same between the fluorescent materials, in order to prevent color deviation from occurring when temperature changes due to a change in the ambient temperature and heat generated by the light emitting element. This is because, if the temperature dependency varies among the fluorescent materials, proportions of emission intensities between the fluorescent materials change with temperature, thus resulting in color deviation.

When temperature rises, excitation efficiency of a fluorescent material generally decreases and optical output power from the fluorescent material also decreases, of which decreasing rate is preferably smaller, as a matter of course.

In the first embodiment, a rate of relative light emission output power decreasing when an ambient temperature changes by 1° C. is defined as an emission output power decreasing rate. Compositions of the fluorescent materials are determined so that the emission output power decreasing rates of at least two fluorescent materials are all at most $4.0 \times 10^{-3}$ [a.u./° C.], preferably at most $3.0 \times 10^{-3}$ [a.u./° C.], and more preferably at most $2.0 \times 10^{-3}$ [a.u./° C.]. In terms of percentage, compositions of the fluorescent materials are determined so that emission output power decreasing rates of at least two fluorescent materials are all at most 0.4 [%/° C.], preferably at most 0.3 [%/° C.], and more preferably at most 0.2 [%/° C.]. This makes it possible to further suppress a decrease of luminous flux [1 m] of the light emitting device in its entirety due to heat generation, in contrast to the prior art. Therefore, this embodiment has such a constitution as the emission output power decreasing rate is controlled within the range described above, and the emission output power decreasing rates of at least two fluorescent materials have substantially the same values. With this constitution, the fluorescent materials have substantially the same temperature characteristics of decreasing excitation efficiency with heating, so that the light emitting device can suppress color deviation from occurring when the ambient temperature changes.

Comparison will be made between a device that employs excitation light near the ultraviolet to visible region of short wavelength, for example, Example 1 to be described later and Comparative Example 6.

In Example 1, fluorescent materials are employed that undergo relatively less decrease in luminance when a temperature rises, such as $La_3Al_5O_{12}$:Ce and $Ca_2Si_5N_8$:Eu. Comparative Example 6 is a fluorescent material having a luminescence center of the direct transition type, $SrGa_2S_4$:Eu or CaS:Eu having relatively less decrease in luminance when temperature rises are used. Due to this difference, the light emitting device of Example 1 provides a better light source with less color deviation and less variation in a color rendering property, compared to the light emitting device of Comparative Example 6.

Seventh Embodiment

Figure 18A:
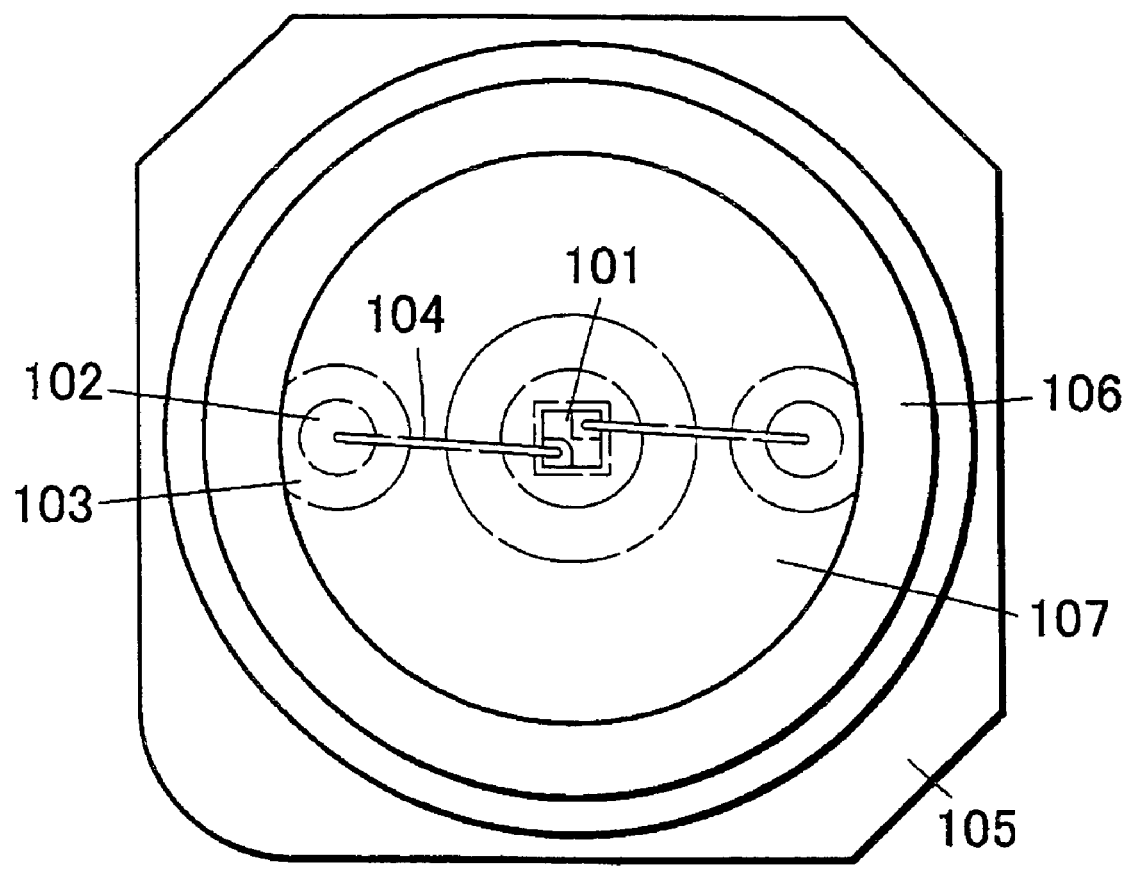
FIG. 18A is a plan view of a light emitting device of a seventh embodiment.
Figure 18B:
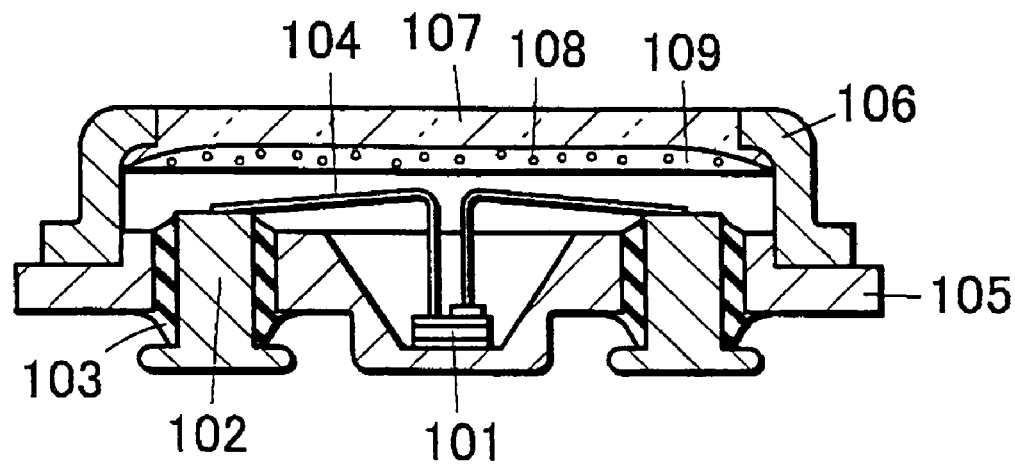
FIG. 18B is a sectional view of the light emitting device of the seventh embodiment.

A light emitting device of the seventh embodiment is of a surface mount type, of which components are similar to those of the first embodiment (FIGS. 18A and 18B). A light emitting element 101 may be constituted from a nitride semiconductor light emitting element that emits an ultraviolet ray. The light emitting element 101 may also be constituted from a nitride semiconductor light emitting element that emits blue light. The following description will take the light emitting element 101 as one that emits an ultraviolet ray as an example. The light emitting element 101 is a nitride semiconductor light emitting element that has a light emitting layer made of an InGaN semiconductor having a peak emission wavelength of about 370 nm. More specifically, this LED has such a constitution of a single quantum well structure as an n-type GaN layer made of an undoped nitride semiconductor, a GaN layer that makes an n-type contact layer having an Si-doped n-type electrode, an n-type GaN layer made of an undoped nitride semiconductor, an n-type AlGaN layer made of a nitride semiconductor and an InGaN layer that makes a light emitting layer are formed on a sapphire substrate. Formed on the light emitting layer are a p-type cladding layer made of Mg-doped AlGaN and a p-type contact layer made of Mg-doped GaN. A buffer layer is formed on the sapphire substrate by growing GaN at a low temperature. The p-type semiconductor is annealed at a temperature of at least 400° C. after forming the layer. The p-type and n-type contact layers are exposed by etching the nitride semiconductor on the same side of the sapphire substrate. A strip of an n electrode is formed on the n-type contact layer that has been exposed, a light transmitting p electrode is formed from a thin metal film over substantially an entire surface of the p-type contact layer that remains without being cut off, and a pedestal electrode is formed parallel to the n electrode on the light transmitting p electrode by sputtering.

A package 105 of the light emitting device of the seventh embodiment is made of Kovar, and comprises a middle portion where a recess is formed and a flange-like base portion disposed around the middle portion. The base portion has lead electrodes 102 made of Kovar inserted therein while being insulated from surroundings and hermetically sealed on both sides of the recess. The package 105 and the lead electrodes 102 are coated with an Ni/Ag layer on a surface thereof.

LED chip 101 is die-bonded by use of an Ag—Sn alloy in the recess of the package 105. With this constitution, all components of the light emitting device can be made of inorganic materials, so that the light emitting device shows remarkably high reliability even when the LED chip 101 emits an ultraviolet ray or short-wavelength light.

Electrodes of the LED chip 101 that has been die-bonded, and the lead electrodes 102, are electrically connected by Ag wires 104. After thoroughly removing moisture from the recess of the package, a lid 106 made of Kovar having a glass window 107 is placed at a center of the package and sealed by seam-welding.

Formed on the glass window 107 is a color conversion layer 109 that contains nitride-based fluorescent material such as $Ca_2Si_5N_8$:Eu or $(Y_{0.8}Gd_{0.2})_3Al_5O_{12}$:Ce and YAG fluorescent material. The color conversion layer 109 is formed by preparing a slurry comprising 90% by weight of nitrocellulose and 10% by weight of γ-alumina to which fluorescent material 108 made of nitride fluorescent material is mixed, applying the slurry to a back surface (a surface that oppose the recess) of the light transmitting window 107, and heating the slurry at 220° C. for 30 minutes to harden the slurry.

In the surface mount type light emitting device of the seventh embodiment constituted as described above, the light emitting element and the fluorescent materials can be combined similarly to the case of the first embodiment, resulting in similar effects as those of the first embodiment.

In the light emitting device of the seventh embodiment, the fluorescent material 108 may be disposed at various positions relative to the light emitting element 101. For example, the fluorescent material 108 may be included in molding material that covers the light emitting element 101. Alternatively, the light emitting element 101 and the fluorescent material 108 may be disposed at positions spaced from each other, or the fluorescent material 108 may also be placed directly on the light emitting element 101.

In the seventh embodiment, the fluorescent material 108 may be affixed by using various coating members (binder) such as organic resin or inorganic material such as glass. A coating member to be described in this embodiment may be applied to the first embodiment. Coating member 109 may serve as a binder that fastens the fluorescent material 108 onto the light emitting element 101 or the window 107. In case the coating member (binder) is to be made of an organic material, a specific material is preferably a transparent resin that has high weatherability such as epoxy resin, acrylic resin and silicone. Silicone is particularly preferable because of high reliability and a capability to improve diffusion of the fluorescent material 108.

When an inorganic material having a thermal expansion coefficient similar to that of the window 107 is used for the coating member (binder) 109, realized is a favorable effect of satisfactorily bonding the fluorescent material 108 to the window 107. Specifically, a sedimentation process, sol-gel method, spraying or the like may be employed. For example, a slurry made by mixing the fluorescent material 108, Silanol $(Si(Oet)_3OH)$ and ethanol may be used in such a way as the slurry is discharged from a nozzle and heated at 300° C. for 3 hours so as to turn Silanol into $SiO_2$ and cause the fluorescent material to adhere onto a desired position.

An inorganic binder may also be used as the coating member (binder) 109. The binder is a so-called low-melting point glass, which preferably consists of very small particles, does not substantially absorb light in the ultraviolet to visible region and is very stable in the coating member (binder) 109.

In case a fluorescent material of large particles is affixed to the coating member (binder) 109, it is preferable to use a binder consisting of ultra-fine powder, even if the powder has a high melting point, such as silica, alumina, pyrophosphate of alkaline earth metal of small particle size obtained by a sedimentation process, or orthophosphate. These binders may be used individually or in mixture with each other.

A method of applying the binder will now be described. In order to achieve a sufficient binding effect, the binder is preferably crushed in a vehicle during a wet process and used in the form of slurry. The vehicle refers to a high-viscosity liquid prepared by dissolving a small amount of caking additive in an organic solvent or deionized water. An inorganic vehicle can be obtained, for example, by dissolving 1 wt % of nitrocellulose as the caking additive in butyl acetate used as the organic solvent. The fluorescent material 11, 108 are added to binder slurry prepared as described above, so as to make a coating liquid. A slurry content in the coating liquid may be determined so that a proportion of the caking additive included in the slurry to a content of fluorescent material in the coating liquid is in a range from about 1 to 3 wt %. In order to prevent significant decrease in luminous flux, a content of the binder is preferably smaller. The coating liquid is applied to the back surface of the window 107, and is dried by exposing it to warm or hot air. Lastly, this coat is baked at a temperature from 400 to 700° C. so as to evaporate the vehicle. Thus, the fluorescent material layer is affixed by the binder at a desired place.

Eighth Embodiment

Figure 19:
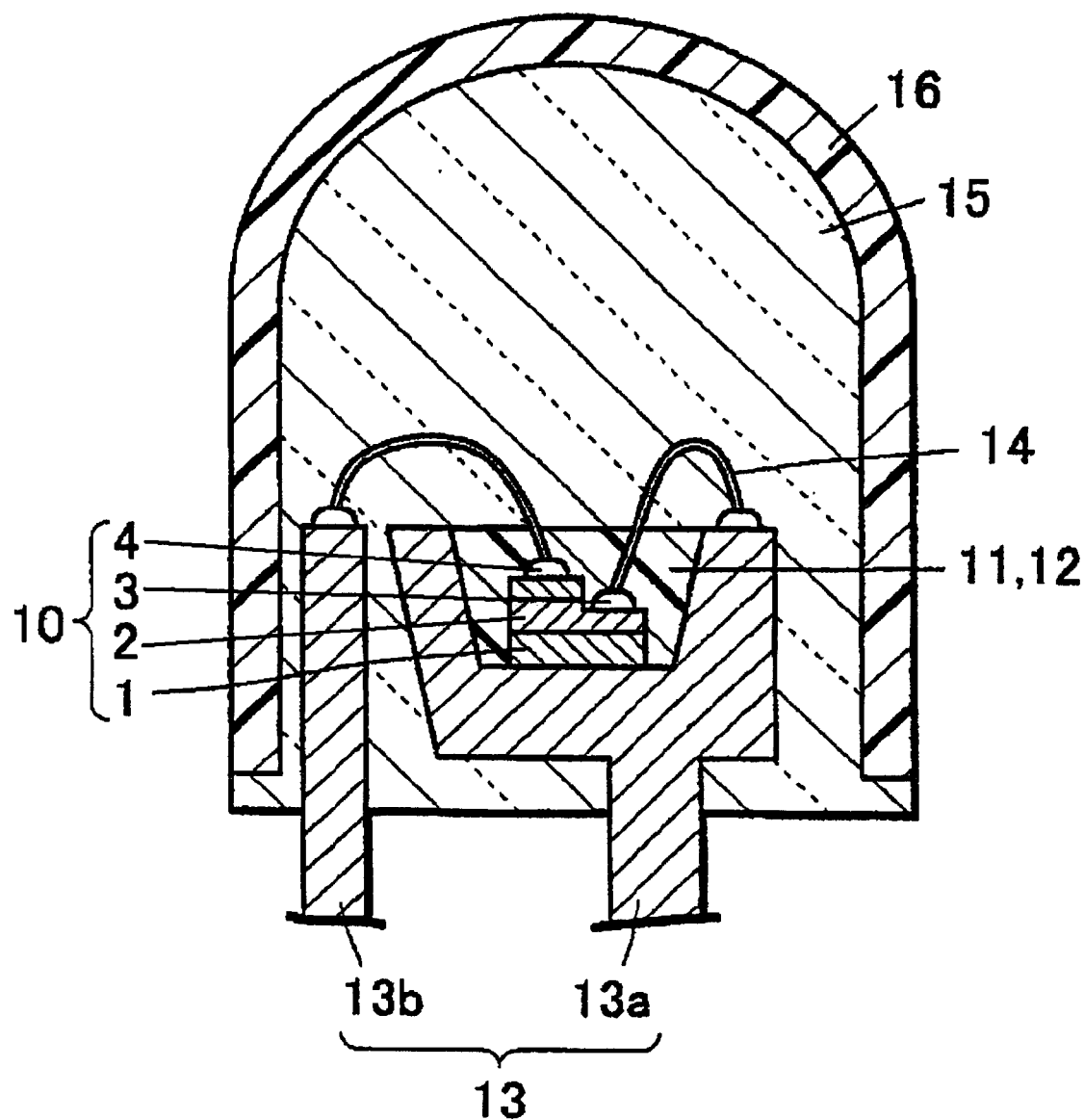
FIG. 19 shows a light emitting device of an eighth embodiment.

An eighth embodiment is a cap-type light emitting device constituted from components similar to those of the first embodiment (FIG. 19). For light emitting element 10, for example, a light emitting element that has a principal emission peak wavelength at 365 nm in the ultraviolet region is used. The light emitting device is made by covering a surface of molding member 15 with cap 16 made of light transmitting resin, wherein fluorescent material (not shown) is dispersed.

A cup for mounting the light emitting element 10 therein is provided on mount lead 13a, and the light emitting element 10 is die-bonded at substantially a center on a bottom of the cup. While fluorescent material 11 is provided on top of the cup so as to cover the light emitting element 10, this may be omitted since direct influence of heat generated by the light emitting element 10 is not expected when the fluorescent material 11 is not provided on top of the cup.

The cap 16 distributes the fluorescent material uniformly in the light transmitting resin. The light transmitting resin that contains the fluorescent material is formed in such a shape that fits the shape of the molding member 15 of the light emitting device 1. Alternatively, the light transmitting resin that contains the fluorescent material may be put into a mold, and then the light emitting device 1 may be squeezed into the mold. Material used to make the light transmitting resin of the cap 16 may be a transparent resin that has good temperature characteristics and high weatherability such as epoxy resin, urea resin and silicone resin, silica sol, glass or inorganic binder. Besides the materials described above, a thermosetting resin such as melanin resin or phenol resin may also be used. Thermoplastic resins such as polyethylene, polypropylene, polyvinyl chloride and polystyrene and thermoplastic rubbers such as styrene-butadiene copolymer and segmented polyurethane may also be used. Along with the fluorescent material 11, a diffusing agent, barium titanate, titanium oxide, aluminum oxide or the like may be included. A photostabilizer and/or colorant may also be included. For the fluorescent material used in the cap 16, $Ca_{10}(PO_4)_6Cl_2$:Eu, $BaSi_2O_2N_2$:Eu, $(Y_{0.8}Gd_{0.2})_3Al_5O_{12}$:Ce or $(Sr,Ca)_2Si_5N_8$:Eu may be used. For the fluorescent material 11 used in the cup of the mount lead 13a, $Ca_{10}(PO_4)_6Cl_2$:Eu may be used. However, since fluorescent material is used in the cap 16, such a constitution may also be employed as $Ca_{10}(PO_4)_6Cl_2$:Eu or the like is included in the cap 16, and the cup of the mount lead 13a contains only the coating member 12.

In the light emitting device constituted as described above, light emitted by the light emitting element 10 excites $Ca_{10}(PO_4)_6Cl_2$:Eu, $BaSi_2O_2N_2$:Eu, $(Y_{0.8}Gd_{0.2})_3Al_5O_{12}$:Ce, $(Sr,Ca)_2Si_5N_8$:Eu or the like of the fluorescent material 11. $(Y_{0.8}Gd_{0.2})_3Al_5O_{12}$:Ce is excited by blue light emitted by $Ca_{10}(PO_4)_6Cl_2$:Eu. Thus, white light is emitted through a surface of cap 16 to outside as a result of blending of light emitted by the fluorescent material 11.

EXAMPLES

Now examples of the fluorescent materials and the light emitting device according to the present invention will be described by way of examples, but the present invention is not limited by these examples.

A temperature characteristic is as relative luminance in percentage of luminance of light emission at 25° C. Particle size is a value measured by an air permeation method called F.S.S.S.No. (Fischer Sub Sieve Sizer's No.).

In the examples described below, pulse drive was performed by supplying power in pulses of frequency 200 Hz, pulse width of 50 μsec and duty ratio of 1%. Both pulse drive and DC drive were performed at an ambient temperature of 25° C.

Response characteristics of the fluorescent materials used in the Examples and Comparative Examples are shown in Table 24.

TABLE 24

| Fluorescent material | Light emitting element nm | Drive current density A/cm$^2$ | Response time |
|---|---|---|---|
| $Ca_{10}(PO_4)_6Cl_2$:Eu | 400 | DC drive 50.0 | about 50 μsec or shorter |

TABLE 24-continued

| Fluorescent material | Light emitting element nm | Drive current density A/cm$^2$ | Response time |
|---|---|---|---|
| $Ca_2B_5O_9Cl$:Eu | 400 | DC drive 50.0 | about 50 μsec or shorter |
| $BaMgAl_{10}O_{17}$:Eu | 400 | DC drive 50.0 | about 50 μsec or shorter |
| $SrAl_2O_4$:Eu | 400 | DC drive 50.0 | about 50 μsec or shorter |
| $Lu_3Al_5O_{12}$:Ce | 400 | DC drive 50.0 | about 50 μsec or shorter |
| $(Y, Gd)_3Al_5O_{12}$:Ce | 400 | DC drive 50.0 | about 50 μsec or shorter |
| $Ca_2Si_5N_8$:Eu | 400 | DC drive 50.0 | about 50 μsec or shorter |
| $Sr_2Si_5N_8$:Eu | 400 | DC drive 50.0 | about 50 μsec or shorter |
| $(Sr, Ca)_2Si_5N_8$:Eu | 400 | DC drive 50.0 | about 50 μsec or shorter |
| $LiEuW_2O_8$ | 400 | DC drive 50.0 | about 50 μsec or shorter |
| $BaSi_2O_2N_2$:Eu | 400 | DC drive 50.0 | about 50 μsec or shorter |
| $(Sr, Ca)Si_2O_2N_2$:Eu | 400 | DC drive 50.0 | about 50 μsec or shorter |
| $SrGa_2S_4$:Eu | 400 | DC drive 50.0 | about 50 μsec or shorter |
| CaS:Eu | 400 | DC drive 50.0 | about 50 μsec or shorter |
| $BaMg_2Al_{16}O_{27}$:Eu, Mn | 400 | DC drive 50.0 | 3 msec or higher |
| $Gd_2O_2S$:Eu | 400 | DC drive 50.0 | about 2 msec |
| $La_2O_2S$:Eu | 400 | DC drive 50.0 | about 1 msec |
| ZnS:Ag | 365 | DC drive 50.0 | 0.3 msec or higher |
| ZnS:Cu | 365 | DC drive 50.0 | 0.5 msec or higher |
| ZnS:Mn | 365 | DC drive 50.0 | 0.5 msec or higher |

The fluorescent materials were evaluated by measuring a response time from a time when supply of drive current is started to a time when emission of light from the fluorescent material has stabilized, using a light emitting element having principal emission wavelength of 400 nm or 365 nm. Drive current density was 50 A/cm$^2$. Among the fluorescent materials shown in Table 24, those having a response time of at least 1 msec show color deviation when the drive current is changed and are unable to provide a light emitting device that emits light stably as will be shown in conjunction with the Comparative Examples.

Examples 1 to 16, Comparative Examples 1 to 6

As examples 1 to 16, light emitting devices were made by using the fluorescent materials and the light emitting elements shown in Tables 25 to 27.

TABLE 25

|  | First fluorescent material | Second fluorescent material | Third fluorescent material | Light emitting element nm |
|---|---|---|---|---|
| Example 1 | $Ca_{10}(PO_4)_6Cl_2$:Eu | $Lu_3Al_5O_{12}$:Ce | $Ca_2Si_5N_8$:Eu | 365 |
| Example 2 | $Ca_{10}(PO_4)_6Cl_2$:Eu | $Lu_3Al_5$ | $Sr_2Si_5$ | 365 |
| Example 3 | $Ca_{10}(PO_4)_6Cl_2$:Eu | $Lu_3Al_5$ | $(Sr, Ca)_2Si_5$ | 365 |
| Example 4 | $Ca_{10}(PO_4)_6Cl_2$:Eu | $Lu_3Al_5$ | $Ca_2Si_5$ | 400 |
| Example 5 | $Ca_{10}(PO_4)_6Cl_2$:Eu | $Lu_3Al_5$ | $Sr_2Si_5$ | 400 |
| Example 6 | $Ca_{10}(PO_4)_6Cl_2$:Eu | $Lu_3Al_5$ | $(Sr, Ca)_2Si_5$ |  |
| Example 7 | $Ca_{10}(PO_4)_6Cl_2$:Eu | $SrAl_2O_4$:Eu | $Ca_2Si_5N_8$:Eu | 365 |
| Example 8 | $Ca_2B_5O_9Cl$:Eu | $Y_3(Al, Ga)_5O_{12}$:Ce | $(Sr, Ca)_2Si_5N_8$:Eu | 365 |
| Example 9 | $Ca_2B_5O_9Cl$:Eu | $Lu_3Al_5O_{12}$:Ce | $Ca_2Si_5N_8$:Eu | 365 |
| Example 10 | $BaMgAl_{10}O_{17}$:Eu | $(Sr, Ca)Si_2O_2N_2$:Eu | $Sr_2Si_5N_8$:Eu | 365 |

TABLE 26

|  | First fluorescent material | Second fluorescent material (1) | Second fluorescent material (2) | Third fluorescent material | Light emitting element nm |
|---|---|---|---|---|---|
| Example 11 | $Ca_{10}(PO_4)_6Cl_2$:Eu | $BaSi_2O_2N_2$:Eu | $(Y,Gd)_3Al_5O_{12}$:Ce | $(Sr,Ca)_2Si_5N_8$:Eu | 365 nm |
| Example 12 | $Ca_{10}(PO_4)_6Cl_2$:Eu | $Sr_4Al_{14}O_{25}$:Eu | $Lu_3Al_5O_{12}$:Ce | $(Sr,Ca)_2Si_5N_8$:Eu | 400 nm |
| Example 13 | $Ca_{10}(PO_4)_6Cl_2$:Eu | $BaSi_2O_2N_2$:Eu | $(Sr,Ca)Si_2O_2N_2$:Eu | $(Sr,Ca)_2Si_5N_8$:Eu | 365 nm |
| Example 14 | $Ca_{10}(PO_4)_6Cl_2$:Eu | $BaSi_2O_2N_2$:Eu | $(Sr,Ca)Si_2O_2N_2$:Eu | $(Sr,Ca)_2Si_5N_8$:Eu | 400 nm |

The light emitting devices of Examples 11 to 14 were made by using two kinds of fluorescent materials (denoted as the second fluorescent material (1) and (2) in Table 3) for the second fluorescent material.

TABLE 27

|  | First fluorescent material | Second fluorescent material | Third fluorescent material | Light emitting element |
|---|---|---|---|---|
| Example 15 | — | $Y_3(Al, Ga)_5O_{12}$:Ce | $Ca_2Si_5N_8$:Eu | 460 nm |
| Example 16 | $BaSi_2O_2N_2$:Eu | $Y_3(Al, Ga)_5O_{12}$:Ce | $(Sr, Ca)_2Si_5N_8$:Eu | 460 nm |

The light emitting devices shown in Table 28 were made as the Comparative Examples.

TABLE 28

|  | First fluorescent material | Second fluorescent material | Third fluorescent material | Light emitting element |
|---|---|---|---|---|
| Comparative Example 1 | $Ca_{10}(PO_4)_6Cl_2$:Eu | $BaMg_2Al_{16}O_{27}$:Eu, Mn | $Ca_2Si_5N_8$:Eu | 365 nm |
| Comparative Example 2 | $Ca_{10}(PO_4)_6Cl_2$:Eu | $BaMg_2Al_{16}O_{27}$:Eu, Mn | $Gd_2O_2S$:Eu | 365 nm |
| Comparative Example 3 | $Ca_{10}(PO_4)_6Cl_2$:Eu | $SrAl_2O_4$:Eu | $Gd_2O_2S$:Eu | 365 nm |
| Comparative Example 4 | $(Sr, Ca, Ba)_5(PO_4)_3Cl$:Eu | $BaMg_2Al_{16}O_{27}$:Eu, Mn | $La_2O_2S$:Eu | 400 nm |
| Comparative Example 5 | — | $(Y, Gd)_3Al_5O_{12}$:Ce | — | 460 nm |
| Comparative Example 6 | $Ca(PO_4)_6Cl_2$:Eu | $SrGa_2S_4$:Eu | CaS:Eu | 400 nm |

Results of evaluating Examples 1 to 16 and Comparative Examples 1 to 6 for drive current density, chromaticity coordinate values and a color rendering property are shown in Tables 29 and 30.

TABLE 29

|  | Drive current density A/cm² | Chromaticity coordinate values x/y | Color rendering property Ra |
|---|---|---|---|
| Example 1 | DC drive 2.0 | 0.348/0.349 | 84.2 |
|  | DC drive 50.0 | 0.348/0.349 | 84.3 |
| Example 2 | DC drive 2.0 | 0.33/0.331 | 85.9 |
|  | DC drive 50.0 | 0.33/0.33 | 86.1 |
| Example 3 | DC drive 2.0 | 0.329/0.34 | 87.1 |
|  | DC drive 50.0 | 0.329/0.34 | 87.2 |
| Example 4 | DC drive 2.0 | 0.334/0.325 | 84.8 |
|  | DC drive 50.0 | 0.334/0.324 | 84.9 |

TABLE 29-continued

|  | Drive current density A/cm² | Chromaticity coordinate values x/y | Color rendering property Ra |
|---|---|---|---|
|  | Pulse drive 2.0 | 0.333/0.325 | 85.1 |
|  | Pulse drive 50.0 | 0.336/0.327 | 84.6 |
| Example 5 | DC drive 2.0 | 0.337/0.321 | 85.6 |
|  | DC drive 50.0 | 0.337/0.32 | 85.5 |
|  | Pulse drive 2.0 | 0.337/0.321 | 85.9 |
|  | Pulse drive 50.0 | 0.339/0.322 | 85.1 |
| Example 6 | DC drive 2.0 | 0.338/0.336 | 88.1 |
|  | DC drive 50.0 | 0.338/0.336 | 88 |
|  | Pulse drive 2.0 | 0.338/0.337 | 88.5 |
|  | Pulse drive 50.0 | 0.34/0.338 | 87.6 |
| Example 7 | DC drive 2.0 | 0.333/0.323 | 86.5 |
|  | DC drive 50.0 | 0.328/0.315 | 85.1 |
| Example 8 | DC drive 2.0 | 0.348/0.337 | 90.1 |
|  | DC drive 50.0 | 0.349/0.337 | 90.1 |
| Example 9 | DC drive 2.0 | 0.346/0.358 | 84.5 |
|  | DC drive 50.0 | 0.345/0.357 | 84.8 |
| Example 10 | DC drive 2.0 | 0.305/0.318 | 88.1 |
|  | DC drive 50.0 | 0.306/0.316 | 87.1 |
| Example 11 | DC drive 2.0 | 0.324/0.358 | 85.2 |
|  | DC drive 50.0 | 0.323/0.356 | 85.4 |
| Example 12 | DC drive 2.0 | 0.349/0.359 | 94.4 |
|  | DC drive 50.0 | 0.349/0.356 | 94 |
| Example 13 | DC drive 2.0 | 0.348/0.364 | 85.3 |
|  | DC drive 50.0 | 0.349/0.363 | 85.2 |
| Example 14 | DC drive 2.0 | 0.330/0.358 | 82 |
|  | DC drive 50.0 | 0.333/0.358 | 83.6 |
| Example 15 | DC drive 2.0 | 0.335/0.345 | 87.3 |
|  | DC drive 50.0 | 0.333/0.343 | 89 |
| Example 16 | DC drive 2.0 | 0.334/0.340 | 92.7 |
|  | DC drive 50.0 | 0.331/0.337 | 93.2 |

TABLE 30

|  | Drive current density A/cm2 | Chromaticity coordinate values x/y | Color rendering property Ra |
|---|---|---|---|
| Comparative Example 1 | DC drive 2.0 | 0.326/0.326 | 82.1 |
|  | DC drive 50.0 | 0.326/0.25 | 57.1 |
|  | Pulse drive 2.0 | 0.319/0.356 | 88.6 |
|  | Pulse drive 50.0 | 0.316/0.335 | 85 |
| Comparative Example 2 | DC drive 2.0 | 0.343/0.333 | 40.5 |
|  | DC drive 50.0 | 0.226/0.227 | u.a. |
|  | Pulse drive 2.0 | 0.402/0.349 | 35.3 |
|  | Pulse drive 50.0 | 0.349/0.341 | 42.5 |
| Comparative Example 3 | DC drive 2.0 | 0.333/0.339 | 77.4 |
|  | DC drive 50.0 | 0.245/0.303 | u.a. |

TABLE 30-continued

|  | Drive current density A/cm2 | Chromaticity coordinate values x/y | Color rendering property Ra |
|---|---|---|---|
|  | Pulse drive 2.0 | 0.378/0.339 | 61.2 |
|  | Pulse drive 50.0 | 0.321/0.321 | 71.7 |
| Comparative Example 4 | DC drive 2.0 | 0.285/0.285 | 43.1 |
|  | DC drive 50.0 | 0.262/0.198 | 28.1 |
| Comparative Example 5 | DC drive 2.0 | 0.320/0.330 | 78.2 |
|  | DC drive 50.0 | 0.311/0.311 | 81.1 |
| Comparative Example 6 | DC drive 2.0 | 0.306/0.333 | 78.5 |
|  | DC drive 50.0 | 0.296/0.333 | 88.5 |

Comparison of Examples 1 to 16 and the Comparative Examples show that, in the light emitting devices of Examples 11 to 16 wherein only fluorescent material of the direct transition types was used, difference between DC drive and pulse drive produced extremely small changes in color tone and the color rendering property and extremely small changes in the color tone and color rendering property due to a change in the drive current density, while light emitting devices of the Comparative Examples that contains fluorescent material of the indirect transition type showed significant changes in color tone and the color rendering property.

Figure 20:
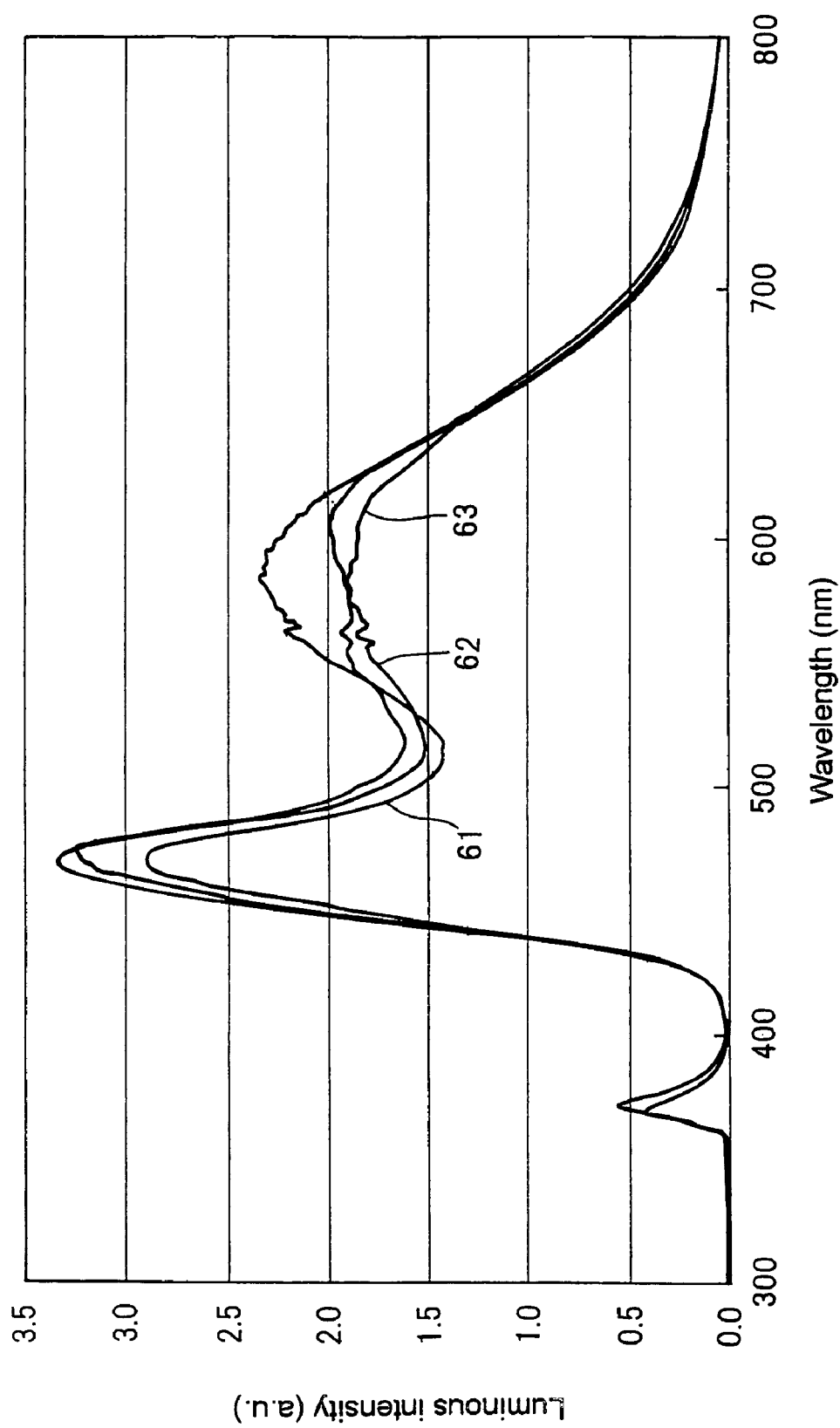
FIG. 20 shows emission spectra of light emitting devices of Examples 1 to 3.
Figure 21:
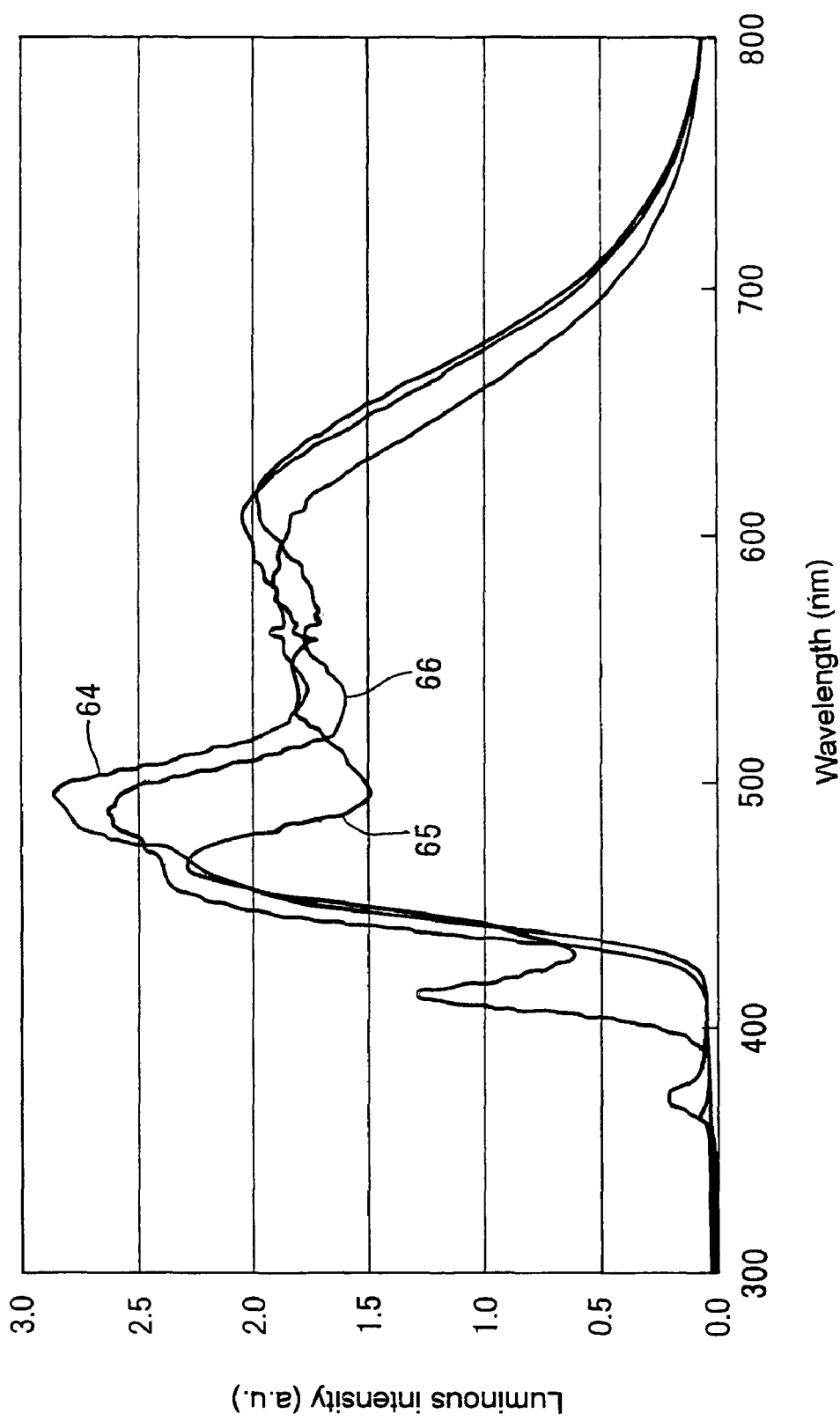
FIG. 21 shows emission spectra of light emitting devices of Examples 11 to 13.

FIG. 20 shows emission spectra of the light emitting devices of Examples 1 to 3, and FIG. 21 shows emission spectra of the light emitting devices of Examples 11 to 13. In FIG. 20, Examples 1 to 3 are denoted with reference numerals 61 to 63, respectively. In FIG. 21, Examples 11 to 13 are denoted with reference numerals 64 to 66, respectively.

Examples 17 to 28, Comparative Examples 7 to 11

As Examples 17 to 28, light emitting devices were made by using fluorescent materials and light emitting elements shown in Table 32. These light emitting devices were evaluated for emission color characteristics when operated under driving conditions and drive current densities shown Table 32.

Results are shown in Table 32.

For comparison with Examples 17 to 28, light emitting devices of Comparative Examples 7 to 11 were made (with fluorescent materials and light emitting elements shown in Table 31), and evaluated. Results of evaluation are shown in Table 32 along with results of these examples.

TABLE 31

|  | First fluorescent material | Second fluorescent material (1) | Second fluorescent material (2) | Third fluorescent material (1) | Third fluorescent material (2) | Light emitting element (nm) |
|---|---|---|---|---|---|---|
| Example 17 | $Ca_{10}(PO_4)_6Cl_2$:Eu | $Lu_3Al_5O_{12}$:Ce | $(Sr,Ca)_2Si_5N_8$:Eu | — | — | 365 |
| Example 18 | $Ca_{10}(PO_4)_6Cl_2$:Eu | $Sr_4Al_{14}O_{25}$:Eu | $Lu_3Al_5O_{12}$:Ce | $(Sr.Ca)_2Si_5N_8$:Eu | — | 400 |
| Example 19 | $Ca_{10}(PO_4)_6Cl_2$:Eu | $BaSi_2O_2N_2$:Eu | $(Y,Gd)_3Al_5O_{12}$:Ce | $(Sr.Ca)_2Si_5N_8$:Eu | — | 460 |
| Example 20 | $Ca_{10}(PO_4)_6Cl_2$:Eu | $Lu_3Al_5O_{12}$:Ce | $(Sr.Ca)_2Si_5N_8$:Eu | — | — | 400 |
| Example 21 | $Ga_2B_5O_9Cl$:Eu | $Y_3(Al,Ga)_5O_{12}$:Ce | $(Sr.Ca)_2Si_5N_8$:Eu | — | — | 365 |
| Example 22 | $Ca_{10}(PO_4)_6Cl_2$:Eu | $Y_3(Al,Ga)_5O_{12}$:Ce | $(Sr.Ca)_2Si_5N_8$:Eu | — | — | 400 |
| Example 23 | $Ga_2B_5O_9Cl$:Eu | $Lu_3Al_5O_{12}$:Ce | $(Sr.Ca)_2Si_5N_8$:Eu | — | — | 400 |
| Comparative Example 7 | — | $(Y,Gd)_3Al_5O_{12}$:Ce | — | — | — | 460 |
| Comparative Example 8 | $(Sr,Ca,Ba)_5(PO_4)_3Cl$:Eu | $BaMg_2Al_{16}O_{27}$:Eu,Mn | $La_2O_2S$:Eu | — | — | 400 |
| Example 24 | $BaSi_2O_2N_2$:Eu | $Y_3(Al,Ga)_5O_{12}$:Ce | — | $(Sr.Ca)_2Si_5N_8$:Eu | — | 450 |
| Example 25 | $(Sr,Ca,Ba)_2SiO_4$:Eu | $Lu_3Al_5O_{12}$:Ce | — | $(Sr.Ca)_2Si_5N_8$:Eu | — | 450 |
| Example 26 | $Sr_4Al_{14}O_{25}$:Eu | $Lu_3Al_5O_{12}$:Ce | — | $(Sr.Ca)_2Si_5N_8$:Eu | — | 450 |
| Example 27 | $Sr_4Al_{14}O_{25}$:Eu | $Y_3(Al,Ga)_5O_{12}$:Ce | — | $(Sr.Ca)_2Si_5N_8$:Eu | — | 450 |
| Example 28 | $Sr_4Al_{14}O_{25}$:Eu | $Y_3(Al,Ga)_5O_{12}$:Ce | — | $(Y,Gd)_3Al_5O_{12}$:Ce | $(Sr.Ca)_2Si_5N_8$:Eu | 450 |

TABLE 31-continued

|  | First fluorescent material | Second fluorescent material (1) | Second fluorescent material (2) | Third fluorescent material (1) | Third fluorescent material (2) | Light emitting element (nm) |
|---|---|---|---|---|---|---|
| Comparative Example 9 | — | $(Y,Gd)_3Al_5O_{12}$:Ce | — | — | — | 460 |
| Comparative Example 10 | $SrGa_2S_4$:Eu | — | — | CaS:Eu | — | 450 |
| Comparative Example 11 | $SrGa_2S_4$:Eu | $Sr_4Al_{14}O_{25}$:Eu | — | CaS:Eu | $Sr_2Si_5N_8$:Eu | 450 |

TABLE 32

|  | Drive current density (A/cm$^2$) | Ambient temperature 25° C. | | Ambient temperature 75° C. | | Ambient temperature 125° C. | | 25° C. → 125° C. Δx/Δy |
|---|---|---|---|---|---|---|---|---|
|  |  | Chromaticity coordinates x/y | Color rendering property Ra | Chromaticity coordinates x/y | Color rendering property Ra | Chromaticity coordinates x/y | Color rendering property Ra |  |
| Example 17 | Pulse drive 6.0 | 0.312/0.323 | 86.0 | 0.313/0.325 | 86.7 | 0.317/0.326 | 88.2 | +0.005/+0.003 |
| Example 18 | Pulse drive 6.0 | 0.298/0.313 | 95.0 | 0.295/0.310 | 94.9 | 0.298/0.277 | 88.5 | ±0.00/−0.036 |
| Example 19 | Pulse drive 6.0 | 0.331/0.356 | 81.2 | 0.328/0.341 | 80.7 | 0.333/0.350 | 80.0 | +0.002/−0.006 |
| Example 20 | Pulse drive 6.0 | 0.338/0.333 | 90.7 | 0.336/0.330 | 88.3 | 0.331/0.328 | 87.0 | −0.007/−0.005 |
| Example 21 | Pulse drive 6.0 | 0.346/0.336 | 89.5 | 0.359/0.345 | 90.0 | 0.336/0.334 | 92.7 | −0.01/−0.002 |

|  | Drive current density (A/cm$^2$) | Ambient temperature 0° C. | | Ambient temperature 70° C. | | Ambient temperature 140° C. | | 0° C. → 140° C. Δx/Δy |
|---|---|---|---|---|---|---|---|---|
|  |  | Chromaticity coordinates x/y | Color rendering property Ra | Chromaticity coordinates x/y | Color rendering property Ra | Chromaticity coordinates x/y | Color rendering property Ra |  |
| Example 22 | Pulse drive 10.0 | 0.300/0.288 | 80.0 | 0.305/0.290 | 83.1 | 0.308/0.290 | 85.6 | +0.008/−0.002 |
| Example 23 | Pulse drive 10.0 | 0.292/0.299 | 86.8 | 0.301/0.304 | 88.6 | 0.313/0.313 | 91.9 | +0.021/+0.014 |
| Comparative Example 7 | Pulse drive 10.0 | 0.280/0.295 | 77.3 | 0.275/0.288 | 80.4 | 0.286/0.293 | 68.2 | +0.006/−0.002 |
| Comparative Example 8 | Pulse drive 10.0 | 0.289/0.326 | 68.0 | 0.361/0.450 | 56.3 | 0.419/0.351 | 34.1 | +0.130/+0.025 |

|  | Drive current density (A/cm$^2$) | Chromaticity coordinates x/y | Color rendering property Ra |
|---|---|---|---|
| Example 24 | DC drive 20.0 | 0.346/0.366 | 93.8 |
| Example 25 | DC drive 20.0 | 0.340/0.330 | 95.2 |
| Example 26 | DC drive 20.0 | 0.359/0.349 | 97.0 |
| Example 27 | DC drive 20.0 | 0.346/0.363 | 90.7 |
| Example 28 | DC drive 20.0 | 0.342/0.297 | 90.5 |
| Comparative Example 9 | DC drive 20.0 | 0.346/0.354 | 78.9 |
| Comparative Example 10 | DC drive 20.0 | 0.340/0.348 | 65.8 |
| Comparative Example 11 | DC drive 20.0 | 0.330/0.330 | 78.8 |

As will be clear from Table 32, the light emitting devices of Examples 17 to 28 have a better color rendering property than the light emitting devices of Comparative Examples 7 to 11. Even when an ambient temperature rises, the light emitting devices of Examples 17 to 28 maintain high color rendering property and show less color deviation due either to temperature change or to a change in the drive current density, thus combining a high color rendering property, excellent temperature characteristic and stability against color deviation due to change in the drive current density.

Now Examples 29 to 35 of the light emitting device according to the present invention will be described in detail below.

FIG. 1 shows a bullet-shaped light emitting device of Examples 29 to 35 and Comparative Examples.

Example 29

Figure 22:
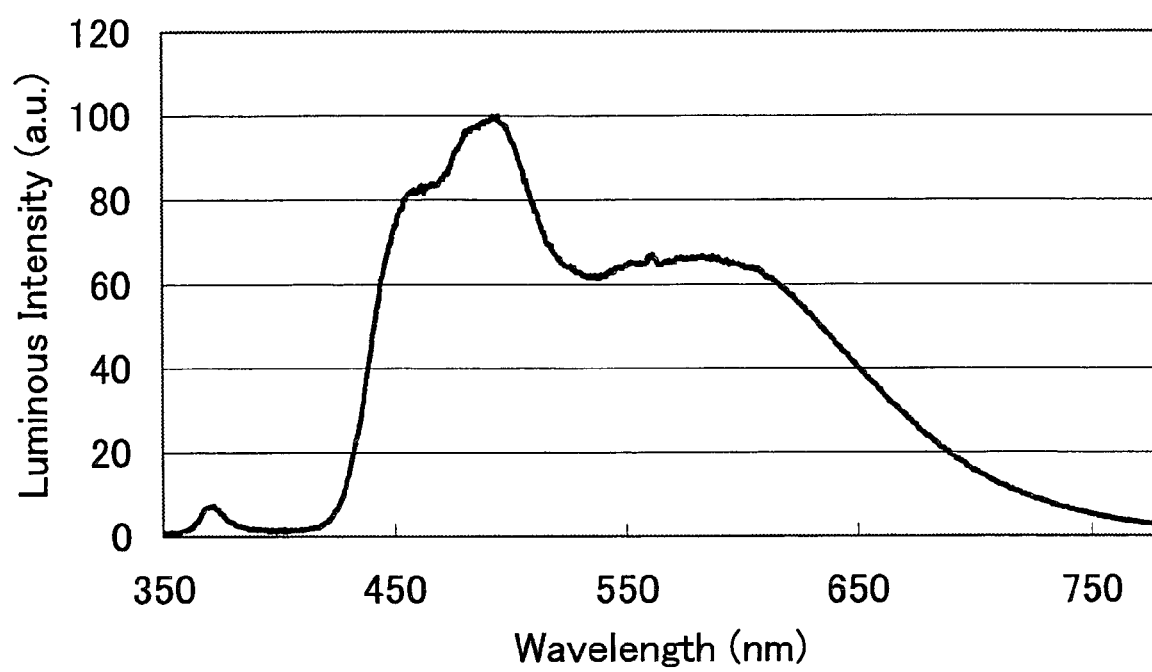
FIG. 22 shows an emission spectrum of a light emitting device of Example 29.

Example 29 is a light emitting device according to the present invention. FIG. 22 shows an emission spectrum of the light emitting device of Example 29.

The light emitting device of Example 29 uses semiconductor light emitting element 10 that emits light with a principal emission peak wavelength around 365 nm. Fluorescent material 11 uses $Ca_{10}(PO_4)_6Cl_2$:Eu, $BaSi_2O_2N_2$:Eu, $(Y_{0.8}Gd_{0.2})_3Al_5O_{12}$:Ce or $(Sr,Ca)_2Si_5N_8$:Eu. Among these, $Ca_{10}(PO_4)_6Cl_2$:Eu, $BaSi_2O_2N_2$:Eu and $(Sr,Ca)_2Si_5N_8$:Eu are directly excited by an ultraviolet ray emitted by the semiconductor light emitting element 10, except for $(Y_{0.8}Gd_{0.2})_3Al_5O_{12}$:Ce. For $(Y_{0.8}Gd_{0.2})_3Al_5O_{12}$:Ce, on the other hand, in the ultraviolet region around 365 nm, emission efficiency is as low as less than 5% that of a peak excitation wavelength, and most of an incident ultraviolet ray is reflected.

An ultraviolet ray emitted by the semiconductor light emitting element 10 enters $Ca_{10}(PO_4)_6Cl_2$:Eu, $BaSi_2O_2N_2$:Eu and $(Sr,Ca)_2Si_5N_8$:Eu of the fluorescent material 11 and excites it. $Ca_{10}(PO_4)_6Cl_2$:Eu emits blue light, $BaSi_2O_2N_2$:Eu emits green light and $(Sr,Ca)_2Si_5N_8$:Eu emits red light. Blue light emitted by $Ca_{10}(PO_4)_6Cl_2$:Eu excites $(Y_{0.8}Gd_{0.2})_3Al_5O_{12}$:Ce to emit yellow-green light. $BaSi_2O_2N_2$:Eu and $(Sr,Ca)_2Si_5N_8$:Eu are excited not only by the ultraviolet ray emitted by the semiconductor light emitting element 10 but also by part of the blue light emitted by $Ca_{10}(PO_4)_6Cl_2$:Eu. With this constitution, light emitted by four kinds of fluorescent material 11 is blended to produce white light. The ultraviolet ray emitted by the semiconductor light emitting element 10 is invisible to the eye and does not affect color of emitted light. Even when an emission wavelength of the semiconductor light emitting element 10 varies due to a change in drive current density, it is invisible to the eye and does not affect the color of emitted light. The light emitting device of Example 29 has a high color rendering property, and is therefore capable of providing a light emitting device of a particularly high special color rendering index (R9) that indicates a red component, and emitting light with a high color rendering property.

Table 33 shows light emission characteristics of the light emitting device of Example 29.

TABLE 33

| Color tone | | Color temperature | General color |
|---|---|---|---|
| x | y | Tcp (K) | rendering index Ra |
| 0.324 | 0.360 | 5850 | 85.4 |
| Color rendering property | | | | | | | |
| R1 | R2 | R3 | R4 | R5 | R6 | R7 | R8 |
| 93.6 | 92.4 | 78.5 | 79.7 | 93.1 | 90.8 | 80.4 | 74.6 |
| Color rendering property | | | | | | | |
| R9 | R10 | R11 | R12 | R13 | R14 | R15 | |
| 50.4 | 80.2 | 84.5 | 84.2 | 95.3 | 87.1 | 84.2 | |

A light emitting device that emits light of a desired color tone can be provided by changing proportions of the four kinds of fluorescent materials 11.

Example 30

Figure 23:
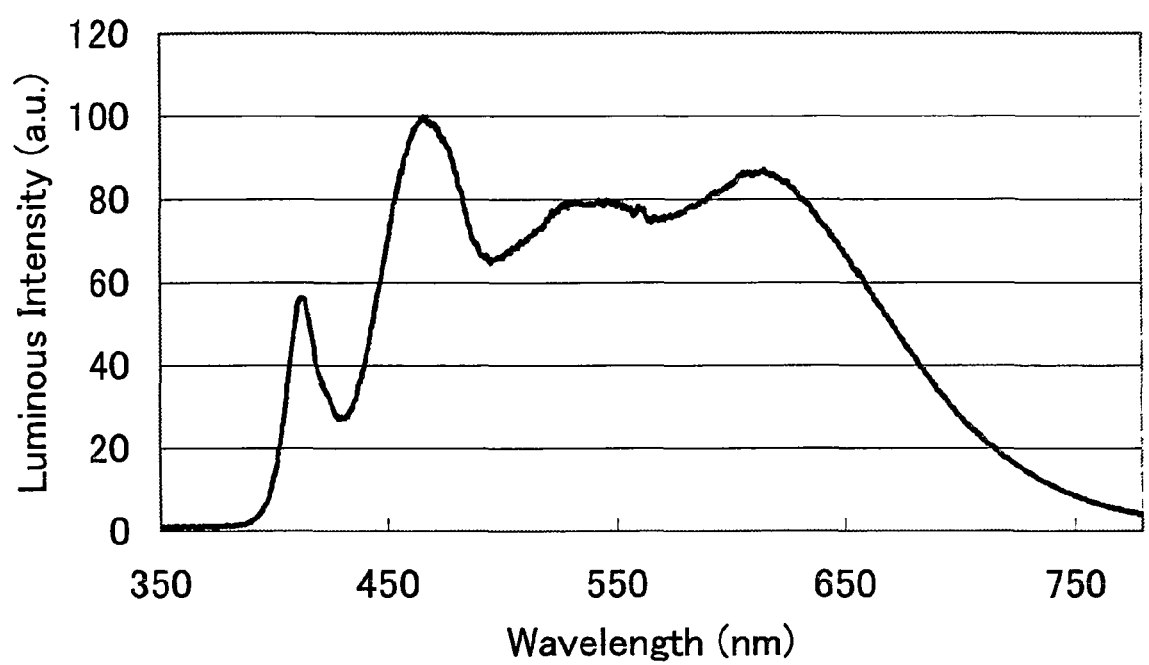
FIG. 23 shows an emission spectrum of a light emitting device of Example 30.

Example 30 is a light emitting device according to the present invention. FIG. 23 shows an emission spectrum of the light emitting device of Example 30.

The light emitting device of Example 30 uses semiconductor light emitting element 10 that emits light with a principal emission peak wavelength around 400 nm. Fluorescent material 11 uses $Ca_{10}(PO_4)_6Cl_2$:Eu, $Sr_4Al_{14}O_{25}$:Eu, $Lu_3Al_5O_{12}$:Ce and $(Sr,Ca)_2Si_5N_8$:Eu. Among these, $Ca_{10}(PO_4)_6Cl_2$:Eu, $Sr_4Al_{14}O_{25}$:Eu and $(Sr,Ca)_2Si_5N_8$:Eu are directly excited by an ultraviolet ray emitted by the semiconductor light emitting element 10, except for $Lu_3Al_5O_{12}$:Ce.

The ultraviolet ray emitted by the semiconductor light emitting element 10 enters $Ca_{10}(PO_4)_6Cl_2$:Eu, $Sr_4Al_{14}O_{25}$:Eu and $(Sr,Ca)_2Si_5N_8$:Eu of the fluorescent material 11 and excites it. $Ca_{10}(PO_4)_6Cl_2$:Eu emits blue light, $Sr_4Al_{14}O_{25}$:Eu emits blue-green light and $(Sr,Ca)_2Si_5N_8$:Eu emits red light. Blue light emitted by $Ca_{10}(PO_4)_6Cl_2$:Eu excites $Lu_3Al_5O_{12}$:Ce to emit yellow-green light. $(Sr,Ca)_2Si_5N_8$:Eu is excited not only by the ultraviolet ray emitted by the semiconductor light emitting element 10 but also by part of the blue light emitted by $Ca_{10}(PO_4)_6Cl_2$:Eu. With this constitution, light emitted by four kinds of fluorescent material 11 is blended to produce white light. The light emitting device of Example 30 has a high color rendering property, and is therefore capable of providing a light emitting device of a particularly high special color rendering index (R9) that indicates a red component, and emitting light with a high color rendering property.

Table 34 shows light emission characteristics of the light emitting device of Example 30.

TABLE 34

| Color tone | | Color temperature | General color |
|---|---|---|---|
| x | y | Tcp (K) | rendering index Ra |
| 0.351 | 0.357 | 4785 | 94.0 |
| Color rendering property | | | | | | | |
| R1 | R2 | R3 | R4 | R5 | R6 | R7 | R8 |
| 98.7 | 96.0 | 94.2 | 91.8 | 96.3 | 94.6 | 90.7 | 89.9 |
| Color rendering property | | | | | | | |
| R9 | R10 | R11 | R12 | R13 | R14 | R15 | |
| 84.1 | 93.1 | 94.0 | 85.2 | 97.4 | 97.5 | 95.6 | |

A light emitting device that emits light of a desired color tone can be provided by changing proportions of the four kinds of fluorescent materials 11.

Example 31

Figure 24:
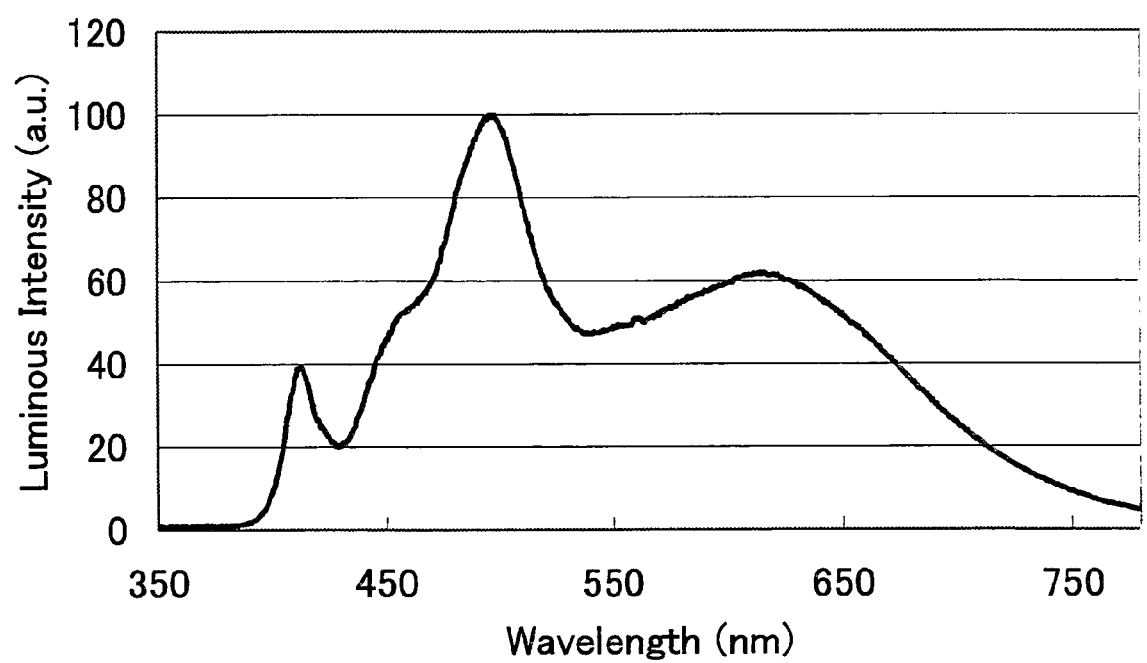
FIG. 24 shows an emission spectrum of a light emitting device of Example 31.

Example 31 is a light emitting device according to the present invention. FIG. 24 shows an emission spectrum of the light emitting device of Example 31.

The light emitting device of Example 31 uses semiconductor light emitting element 10 that emits light with a principal emission peak wavelength around 400 nm. Fluorescent material 11 uses $Ca_{10}(PO_4)_6Cl_2$:Eu, $BaSi_2O_2N_2$:Eu, $(Y_{0.8}Gd_{0.2})_3$ $Al_5O_{12}$:Ce and $(Sr,Ca)_2Si_5N_8$:Eu. Among these fluorescent materials, $Ca_{10}(PO_4)_6Cl_2$:Eu, $BaSi_2O_2N_2$:Eu and $(Sr,Ca)_2Si_5N_8$:Eu are directly excited by light from an ultraviolet to visible region of short wavelengths emitted by the semiconductor light emitting element 10, except for $(Y_{0.8}Gd_{0.2})_3Al_5O_{12}$:Ce. $(Y_{0.8}Gd_{0.2})_3Al_5O_{12}$:Ce, in contrast, hardly emits light near 400 nm and reflects most of incident light.

The light from the ultraviolet to visible region of short wavelengths emitted by the semiconductor light emitting element 10 enters $Ca_{10}(PO_4)_6Cl_2$:Eu, $BaSi_2O_2N_2$:Eu and $(Sr,Ca)_2Si_5N_8$:Eu of the fluorescent material 11 which are then excited. $Ca_{10}(PO_4)_6Cl_2$:Eu emits blue light, $BaSi_2O_2N_2$:Eu emits green light and $(Sr,Ca)_2Si_5N_8$:Eu emits red light. Blue light emitted by $Ca_{10}(PO_4)_6Cl_2$:Eu excites $(Y_{0.8}Gd_{0.2})_3Al_5O_{12}$:Ce so as to emit yellow-green light. $BaSi_2O_2N_2$:Eu and $(Sr,Ca)_2Si_5N_8$:Eu are excited not only by the light in the ultraviolet to visible region of short wavelengths emitted by the semiconductor light emitting element 10 but also by part of the blue light emitted by $Ca_{10}(PO_4)_6Cl_2$:Eu. With this constitution, light emitted by four kinds of fluorescent material 11 is blended to produce white light. The light in the ultraviolet to visible region of short wavelengths emitted by the semiconductor light emitting element 10 is difficult to visually recognize and therefore does not affect color of light emitted by the light emitting device. Even when a color tone of excitation light emitted by the semiconductor light emitting element 10 varies due to a change in drive current density, it is difficult to visually recognize and therefore does not affect color of emitted light. The light emitting device of Example 31 has high color rendering property, and is therefore capable of providing a light emitting device of a particularly high special color rendering index (R9) that indicates a red component, and emitting light with a high color rendering property.

Table 35 shows light emission characteristics of the light emitting device of Example 31.

TABLE 35

| Color tone | | Color temperature | General color rendering index Ra |
|---|---|---|---|
| x | y | Tcp (K) | |
| 0.342 | 0.365 | 5172 | 84.0 |

| Color rendering property | | | | | | | |
|---|---|---|---|---|---|---|---|
| R1 | R2 | R3 | R4 | R5 | R6 | R7 | R8 |
| 90.2 | 84.3 | 74.3 | 86.3 | 87.9 | 76.3 | 83.9 | 89.0 |

| Color rendering property | | | | | | |
|---|---|---|---|---|---|---|
| R9 | R10 | R11 | R12 | R13 | R14 | R15 |
| 92.1 | 57.4 | 85.0 | 65.4 | 87.0 | 84.7 | 93.7 |

A light emitting device that emits light of a desired color tone can be provided by changing proportions of the four kinds of fluorescent materials 11.

Example 32

Figure 25:
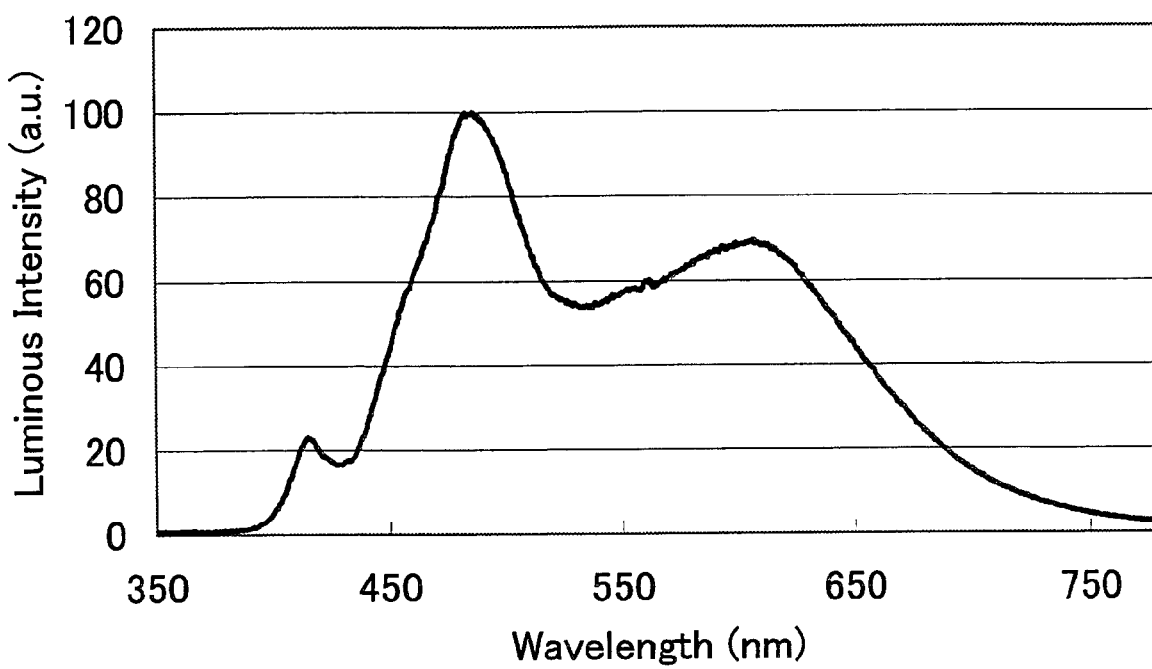
FIG. 25 shows an emission spectrum of a light emitting device of Example 32.

Example 32 is a light emitting device according to the present invention. FIG. 25 shows an emission spectrum of the light emitting device of Example 32.

The light emitting device of Example 32 uses semiconductor light emitting element 10 that emits light with a principal emission peak wavelength around 400 nm. Fluorescent material 11 uses $Ca_{10}(PO_4)_6Cl_2$:Eu, $BaSi_2O_2N_2$:Eu, $(Sr,Ca)Si_2O_2N_2$:Eu and $(Sr,Ca)_2Si_5N_8$:Eu. These fluorescent materials are all directly excited by the ultraviolet ray emitted by the semiconductor light emitting element 10.

Light in an ultraviolet to visible region of short wavelengths emitted by the semiconductor light emitting element 10 enters $Ca_{10}(PO_4)_6Cl_2$:Eu, $BaSi_2O_2N_2$:Eu, $(Sr,Ca)Si_2O_2N_2$:Eu and $(Sr,Ca)_2Si_5N_8$:Eu of the fluorescent material 11 and excites them. $Ca_{10}(PO_4)_6Cl_2$:Eu emits blue light, $BaSi_2O_2N_2$:Eu emits green light, $(Sr,Ca)_2Si_5N_8$:Eu emits yellow-red light and $(Sr,Ca)_2Si_5N_8$:Eu emits red light. $BaSi_2O_2N_2$:Eu, $Sr,Ca)Si_2O_2N_2$:Eu and $(Sr,Ca)_2Si_5N_8$:Eu are excited not only by the light in the ultraviolet to visible region of short wavelengths emitted by the semiconductor light emitting element 10 but also by part of the blue light emitted by $Ca_{10}(PO_4)_6Cl_2$:Eu. With this constitution, visible light emitted by four kinds of fluorescent material 11 is blended to produce white light. Since all the four kinds of fluorescent material 11 are excited by the light emitted by the semiconductor light emitting element 10, high emission efficiency is obtained. The light emitting device of Example 32 has a high color rendering property, and is capable of providing a light emitting device of a particularly high special color rendering index (R9) that indicates a red component, and emitting light with high color rendering property.

Table 36 shows light emission characteristics of the light emitting device of Example 32.

TABLE 36

| Color tone | | Color temperature | General color rendering index Ra |
|---|---|---|---|
| x | y | Tcp (K) | |
| 0.346 | 0.368 | 5009 | 84.3 |

| Color rendering property | | | | | | | |
|---|---|---|---|---|---|---|---|
| R1 | R2 | R3 | R4 | R5 | R6 | R7 | R8 |
| 97.9 | 87.8 | 74.8 | 81.9 | 94.1 | 82.0 | 78.7 | 77.3 |

| Color rendering property | | | | | | |
|---|---|---|---|---|---|---|
| R9 | R10 | R11 | R12 | R13 | R14 | R15 |
| 65.8 | 69.2 | 85.9 | 75.1 | 94.2 | 85.5 | 91.1 |

A light emitting device that emits light of a desired color tone can be provided by changing proportions of the four kinds of fluorescent materials 11.

Example 33

Figure 26:
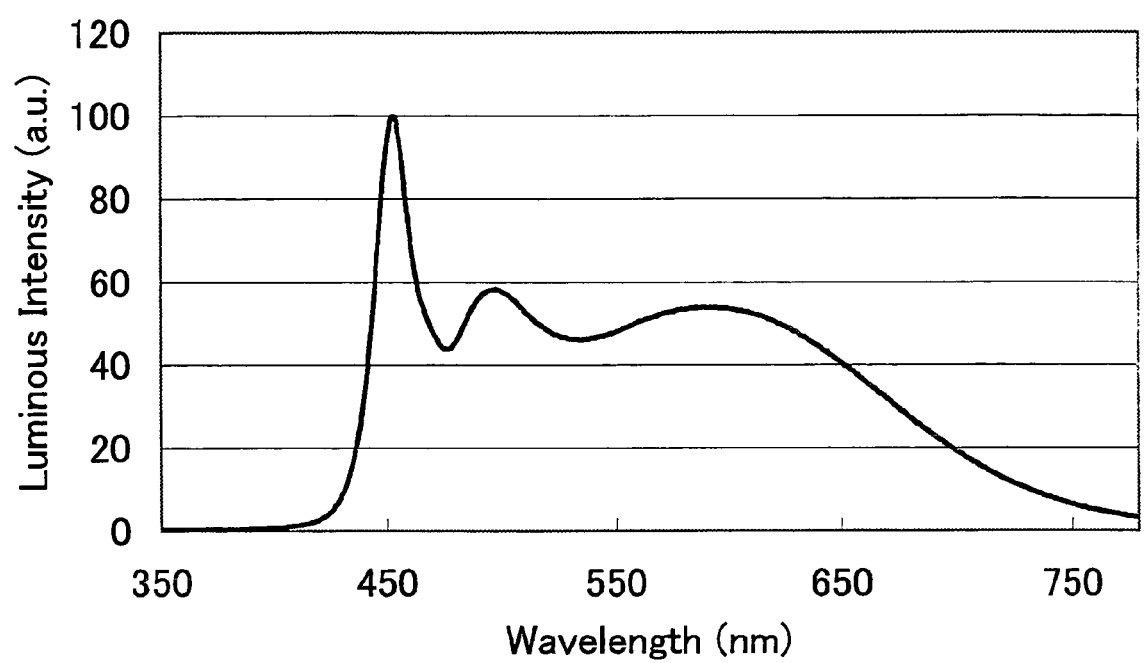
FIG. 26 shows an emission spectrum of a light emitting device of Example 33.

Example 33 is a light emitting device according to the present invention. FIG. 26 shows an emission spectrum of the light emitting device of Example 33.

The light emitting device of Example 33 uses semiconductor light emitting element 10 that emits light with a principal emission peak wavelength around 460 nm. Fluorescent material 11 uses $BaSi_2O_2N_2$:Eu, $(Y_{0.8}Gd_{0.2})_3Al_5O_{12}$:Ce and $(Sr,Ca)_2Si_5N_8$:Eu. These fluorescent materials are all directly excited by blue light emitted by the semiconductor light emitting element 10.

The blue light emitted by the semiconductor light emitting element 10 enters $BaSi_2O_2N_2$:Eu, $(Y_{0.8}Gd_{0.2})_3Al_5O_{12}$:Ce and $(Sr,Ca)_2Si_5N_8$:Eu and excites them. $BaSi_2O_2N_2$:Eu emits green light, $(Y_{0.8}Gd_{0.2})_3Al_5O_{12}$:Ce emits yellow-green light and $(Sr,Ca)_2Si_5N_8$:Eu emits red light. The light emitted by the semiconductor light emitting element 10 and light emitted by these three kinds of the fluorescent material 11 are blended to produce white light. Since all the three kinds of fluorescent materials 11 are excited by the light emitted by the semiconductor light emitting element 10, high emission efficiency is obtained. The light emitting device of Example 33 has a high color rendering property, and is capable of providing a light emitting device having a particularly high special color rendering index (R9) that indicates a red component, and emitting light with a high color rendering property.

Table 37 shows light emission characteristics of the light emitting device of Example 33.

TABLE 37

| Color tone | | Color temperature | General color |
|---|---|---|---|
| x | y | Tcp (K) | rendering index Ra |
| 0.334 | 0.340 | 5400 | 92.7 |

| Color rendering property | | | | | | | |
|---|---|---|---|---|---|---|---|
| R1 | R2 | R3 | R4 | R5 | R6 | R7 | R8 |
| 96.6 | 94.8 | 90.5 | 93.8 | 95.7 | 91.6 | 89.8 | 89.0 |

| Color rendering property | | | | | | |
|---|---|---|---|---|---|---|
| R9 | R10 | R11 | R12 | R13 | R14 | R15 |
| 83.0 | 88.7 | 96.4 | 81.0 | 96.8 | 94.4 | 93.4 |

A light emitting device that emits light of a desired color tone can be provided by changing proportions of the three kinds of fluorescent materials 11.

Example 34

Example 34 is a light emitting device according to the present invention.

The light emitting device of Example 34 uses semiconductor light emitting element 10 that emits light with a principal emission peak wavelength around 400 nm. Fluorescent material 11 uses $(Sr,Ca)Si_2O_2N_2$:Eu and $(Sr,Ca)_2Si_5N_8$:Eu. These fluorescent materials are directly excited by light in an ultraviolet to visible region of short wavelengths emitted by the semiconductor light emitting element 10.

The light in the ultraviolet to visible region of short wavelengths emitted by the semiconductor light emitting element 10 enters $(Sr,Ca)Si_2O_2N_2$:Eu and $(Sr,Ca)_2Si_5N_8$:Eu and excites them. $(Sr,Ca)Si_2O_2N_2$:Eu emits yellow light, and $(Sr,Ca)_2Si_5N_8$:Eu emits red light. Light emitted by these two kinds of fluorescent material 11 is blended to produce light of a desired color. The light in the ultraviolet to visible region of short wavelengths emitted by the semiconductor light emitting element 10 is difficult to visually recognize and therefore does not significantly affect color of light emitted by the light emitting device. Even when a color tone of excitation light emitted by the semiconductor light emitting element 10 varies due to a change in drive current density, it is difficult to visually recognize and therefore does not affect a color tone of light emitted by the light emitting device. The light emitting device of Example 34 has chromaticity values of (x, y)=(0.582, 0.426), which represent yellow light used in traffic signals. In the prior art, AlInGaP has been used for an LED that emits yellow light of a traffic signal, but the LED based on AlInGaP suffers significant color deviation depending on an ambient temperature. The light emitting device of Example 34, in contrast, is not subject to color deviation due to the ambient temperature.

Example 35

Example 35 is a light emitting device according to the present invention.

The light emitting device of Example 35 uses semiconductor light emitting element 10 that emits light with a principal emission peak wavelength around 365 nm. Fluorescent material 11 uses $BaSi_2O_2N_2$:Eu and $Ca_2Si_5N_8$:Eu. These fluorescent materials are directly excited by an ultraviolet ray emitted by the semiconductor light emitting element 10.

Light in an ultraviolet to visible region of short wavelengths emitted by the semiconductor light emitting element 10 enters $BaSi_2O_2N_2$:Eu and $Ca_2Si_5N_8$:Eu of the fluorescent material 11 and excites them. $BaSi_2O_2N_2$:Eu emits green light and $Ca_2Si_5N_8$:Eu emits yellow-red light. Light emitted by these two kinds of fluorescent material 11 is blended to produce light of a desired color. The light emitting device of Example 35 has chromaticity values of (x, y)=(0.405, 0.404). The light emitting device of Example 35 can be used for a decorative display and other applications.

Comparative Example 12

Figure 27:
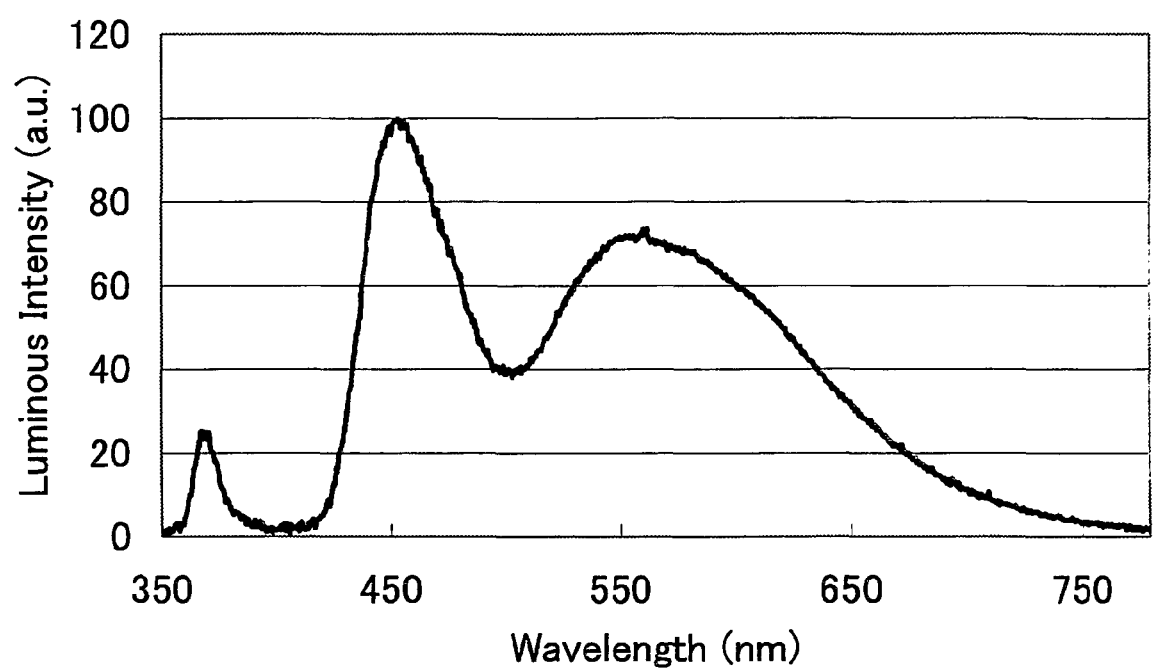
FIG. 27 shows an emission spectrum of a light emitting device of Comparative Example 12.

A light emitting device of Comparative Example 12 will be described below. FIG. 27 shows an emission spectrum of the light emitting device of Comparative Example 12.

The light emitting device of Comparative Example 12 uses semiconductor light emitting element 10 that emits light with a principal emission peak wavelength around 365 nm. Fluorescent material 11 uses $Ca_{10}(PO_4)_6Cl_2$:Eu and $(Y_{0.8}Gd_{0.2})_3Al_5O_{12}$:Ce. $Ca_{10}(PO_4)_6Cl_2$:Eu is directly excited by an ultraviolet ray emitted by the semiconductor light emitting element 10. For $(Y_{0.8}Gd_{0.2})_3Al_5O_{12}$:Ce, on the other hand, in an ultraviolet region around 365 nm, emission efficiency is as low as less than 5% that of a peak excitation wavelength, and most of an incident ultraviolet ray is reflected.

The ultraviolet ray emitted by the semiconductor light emitting element 10 enters $Ca_{10}(PO_4)_6Cl_2$:Eu of the fluorescent material 11 and excites it. $Ca_{10}(PO_4)_6Cl_2$:Eu emits blue light and $(Y_{0.8}Gd_{0.2})_3Al_5O_{12}$:Ce is excited by the blue light and emits yellow-green light. When the fluorescent material 11 is excited by the ultraviolet ray of wavelength 365 nm, $Ca_{10}(PO_4)_6Cl_2$:Eu shows chromaticity values of (x, y)=(0.138, 0.059) and $(Y_{0.8}Gd_{0.2})_3Al_5O_{12}$:Ce that is excited by the light emitted by $Ca_{10}(PO_4)_6Cl_2$:Eu shows chromaticity values of (x, y)=(0.456, 0.527). With this constitution, visible light emitted by the two kinds of fluorescent material 11 is blended to produce white light. This light emitting device can generate color tones that lie on a straight line connecting blue and yellow on a chromaticity diagram, and is unable to provide a multi-color light emitting device. The light emitting device of Comparative Example 12 has a very low special color rendering index (R9) that indicates a red component, and cannot provide a light emitting device having a high color rendering property.

Table 38 shows light emission characteristics of the light emitting device of Comparative Example 12.

TABLE 38

| Color tone | | Color temperature | General color |
|---|---|---|---|
| x | y | Tcp (K) | rendering index Ra |
| 0.352 | 0.357 | 4759 | 79.5 |

| Color rendering property | | | | | | | |
|---|---|---|---|---|---|---|---|
| R1 | R2 | R3 | R4 | R5 | R6 | R7 | R8 |
| 77.5 | 87.7 | 90.7 | 72.8 | 75.4 | 78.9 | 86.3 | 66.9 |

| Color rendering property | | | | | | |
|---|---|---|---|---|---|---|
| R9 | R10 | R11 | R12 | R13 | R14 | R15 |
| 10.6 | 64.4 | 65.6 | 48.3 | 80.4 | 94.6 | 91.1 |

The light emitting device of the present invention can be used for ordinary illumination such as for a fluorescent lamp, traffic signal, automobile lighting, backlight for liquid crystal, display, and the like, and particularly as a white and multi-color light emitting device employing semiconductor light emitting element.

What is claimed is:

1. A light emitting device comprising:
   at least two kinds of fluorescent material which are to be substantially directly excited, by light emitted from an excitation source having a principal emission peak in a wavelength region of from 250 nm to 420 nm, so as to emit light that is blended to produce light of various colors,
   wherein said at least two kinds of fluorescent material include at least one of
   (i) an oxynitride-based fluorescent material having crystallinity, and represented by a chemical formula of $LM_2O_2N_2$:R or $LM_2Q_7O_2N_{2+T}$:R ($0<T<0.5$), where L is at least one kind of Group II element selected from the group consisting of Mg, Ca, Sr, Ba and Zn; M is at least one kind of Group IV element selected from the group consisting of C and Si; Q is Boron; O is oxygen; N is nitrogen; and R is a rare earth element; and
   (ii) a nitride-based fluorescent material, and
   wherein light emitting efficiency of said at least two kinds of fluorescent material when excited by light emitted from the excitation source is at least 60% of a maximum light emission efficiency over the wavelength region of from 250 to 420 nm.

2. The light emitting device according to claim 1, wherein said at least two kinds of fluorescent material exhibit maximum light emission efficiency in a wavelength region of from 250 nm to 550 nm when excited by light.

3. The light emitting device according to claim 1, wherein said rare earth element is an activator.

4. The light emitting device according to claim 1, wherein said nitride-based fluorescent material comprises
   (i) at least one Group II element selected from the group consisting of Be, Mg, Ca, Sr, Ba and Zn,
   (ii) at least one Group IV element selected from the group consisting of C, Si, Ge, Sn, Ti, Zr and Hf, and
   (iii) a rare earth element that is an activator.

5. The light emitting device according to claim 1, wherein a light emitting element of said light emitting device is for emitting white light.

6. The light emitting device according to claim 1, wherein said light emitting device has a general color rendering index of at least 80.

7. The light emitting device according to claim 1, wherein said light emitting device has a general color rendering index of at least 80.

8. A light emitting device comprising:
   at least two kinds of a first fluorescent material which are to be substantially directly excited by light emitted from an excitation source having a principal emission peak in a wavelength region of from 250 nm to 420 nm; and
   a second fluorescent material that is to be excited by part of light emitted from said at least two kinds of the first fluorescent material,
   wherein light emitted from said at least two kinds of the first fluorescent material and light emitted from said second fluorescent material are to be blended so as to produce light of various colors, and
   wherein said at least two kinds of the first fluorescent material include at least one of
   (i) an oxynitride-based fluorescent material having crystallinity, and represented by a chemical formula of $LM_2O_2N_2$:R or $LM_2Q_7O_2N_{2+T}$:R ($0<T<0.5$), where L is at least one kind of Group II element selected from the group consisting of Mg, Ca, Sr, Ba and Zn; M is at least one kind of Group IV element selected from the group consisting of C and Si; Q is Boron; O is oxygen; N is nitrogen; and R is a rare earth element; and
   (ii) a nitride-based fluorescent material, and
   wherein light emission efficiency of said at least two kinds of the first fluorescent material when excited by light emitted from the excitation source is at least 60% of a maximum light emission efficiency over the wavelength region of from 250-420 nm.

9. The light emitting device according to claim 8, wherein said rare earth element is an activator.

10. The light emitting device according to claim 8, wherein said nitride-based fluorescent material comprises
    (i) at least one Group II element selected from the group consisting of Be, Mg, Ca, Sr, Ba and Zn,
    (ii) at least one Group IV element selected from the group consisting of C, Si, Ge, Sn, Ti, Zr and Hf, and
    (iii) a rare earth element that is an activator.

11. The light emitting device according to claim 8, wherein said second fluorescent material comprises aluminate fluorescent material including a rare earth element that is an activator.

12. The light emitting device according to claim 8, wherein a light emitting element of said light emitting device is for emitting white light.

13. The light emitting device according to claim 8, wherein said light emitting device has a general color rendering index of at least 80.

* * * * *